United States Patent
Ware et al.

(10) Patent No.: US 9,824,740 B2
(45) Date of Patent: *Nov. 21, 2017

(54) DYNAMIC MEMORY SUPPORTING SIMULTANEOUS REFRESH AND DATA-ACCESS TRANSACTIONS

(75) Inventors: Frederick A. Ware, Los Altos Hills, CA (US); Richard E. Perego, Thornton, CO (US)

(73) Assignee: Rambus Inc., Sunnyvale, CA (US)

( * ) Notice: Subject to any disclaimer, the term of this patent is extended or adjusted under 35 U.S.C. 154(b) by 532 days.

This patent is subject to a terminal disclaimer.

(21) Appl. No.: 12/482,626

(22) Filed: Jun. 11, 2009

(65) Prior Publication Data

US 2009/0248972 A1 Oct. 1, 2009

Related U.S. Application Data

(63) Continuation of application No. 11/215,339, filed on Aug. 29, 2005, now Pat. No. 7,565,480, which is a continuation of application No. 10/268,808, filed on Oct. 9, 2002, now Pat. No. 7,043,599.

(60) Provisional application No. 60/390,273, filed on Jun. 20, 2002.

(51) Int. Cl.
G06F 12/00 (2006.01)
G11C 11/406 (2006.01)
G06F 13/16 (2006.01)

(52) U.S. Cl.
CPC ............ *G11C 11/406* (2013.01); *G06F 12/00* (2013.01); *G06F 13/1605* (2013.01); *G11C 11/40603* (2013.01)

(58) Field of Classification Search
CPC ......................................................... G06F 12/00
USPC ................................................................ 711/106
See application file for complete search history.

(56) References Cited

U.S. PATENT DOCUMENTS

| 5,301,278 | A | 4/1994 | Bowater et al. | 395/275 |
|---|---|---|---|---|
| 5,511,033 | A | 4/1996 | Jung | 365/222 |
| 5,686,845 | A | 11/1997 | Erdal et al. | |
| 5,742,798 | A | 4/1998 | Goldrian | |
| 5,761,129 | A | 6/1998 | Roe | 365/189.01 |

(Continued)

FOREIGN PATENT DOCUMENTS

| EP | 1196855 B1 | 5/2010 | |
|---|---|---|---|
| FR | 2480981 | 10/1981 | G11C 7/00 |

(Continued)

OTHER PUBLICATIONS

Ware, Frederick A., Rambus Preliminary Information, Direct RDRAM 64/72-Mbit (256Kx16/18x16d), Doc. DL0035, Version 1.11. Copyright Jun. 2000, Rambus Inc. 68 pages.

(Continued)

*Primary Examiner* — Tuan Thai
*Assistant Examiner* — Gautam Sain
(74) *Attorney, Agent, or Firm* — Fenwick & West LLP

(57) ABSTRACT

Described are dynamic memory systems that perform overlapping refresh and data-access (read or write) transactions that minimize the impact of the refresh transaction on memory performance. The memory systems support independent and simultaneous activate and precharge operations directed to different banks. Two sets of address registers enable the system to simultaneously specify different banks for refresh and data-access transactions.

2 Claims, 31 Drawing Sheets

(56) References Cited

U.S. PATENT DOCUMENTS

| | | | |
|---|---|---|---|
| 5,873,114 A * | 2/1999 | Rahman et al. | 711/106 |
| 6,115,763 A | 9/2000 | Douskey | 710/72 |
| 6,128,672 A | 10/2000 | Lindsley | 710/19 |
| 6,147,921 A | 11/2000 | Novak et al. | 365/222 |
| 6,195,106 B1 * | 2/2001 | Deering et al. | 345/545 |
| 6,195,434 B1 | 2/2001 | Cashion et al. | |
| 6,233,193 B1 | 5/2001 | Holland | |
| 6,301,183 B1 * | 10/2001 | Bondurant et al. | 365/222 |
| 6,310,814 B1 | 10/2001 | Hampel | 365/222 |
| 6,449,685 B1 * | 9/2002 | Leung | 711/106 |
| 6,459,650 B1 | 10/2002 | Lin | 365/233 |
| 6,487,654 B2 | 11/2002 | Dowling | 712/244 |
| 6,496,437 B2 | 12/2002 | Leung | 365/222 |
| 6,523,135 B1 | 2/2003 | Nakamura | |
| 6,529,433 B2 | 3/2003 | Choi | 365/222 |
| 6,535,950 B1 * | 3/2003 | Funyu et al. | 711/106 |
| 6,593,929 B2 | 7/2003 | Van Hook et al. | |
| 6,631,440 B2 | 10/2003 | Jenne | 711/105 |
| 6,650,586 B1 * | 11/2003 | Fanning | 365/222 |
| 6,654,303 B2 | 11/2003 | Miyamoto | 365/222 |
| 6,671,836 B1 | 12/2003 | Lai et al. | |
| 6,759,884 B2 | 7/2004 | Tomita | |
| 6,871,261 B1 | 3/2005 | Proebsting | 711/106 |
| 7,043,599 B1 | 5/2006 | Ware | 711/106 |
| 2001/0013095 A1 | 8/2001 | Holmann | 712/234 |
| 2001/0018726 A1 * | 8/2001 | Tabo | 711/106 |
| 2001/0044885 A1 * | 11/2001 | LaBerge | 711/158 |
| 2001/0056521 A1 | 12/2001 | Fujiwara | 711/167 |
| 2002/0114209 A1 * | 8/2002 | Koyanagi et al. | 365/230.03 |
| 2002/0138678 A1 * | 9/2002 | Kim et al. | 710/240 |
| 2002/0191467 A1 * | 12/2002 | Matsumoto et al. | 365/222 |
| 2003/0080963 A1 * | 5/2003 | Van Hook et al. | 345/501 |
| 2003/0105919 A1 | 6/2003 | Olds et al. | |
| 2003/0128614 A1 * | 7/2003 | Hidaka | 365/222 |
| 2005/0259506 A1 | 11/2005 | Roohparvar | |
| 2006/0010264 A1 * | 1/2006 | Rader et al. | 710/23 |

FOREIGN PATENT DOCUMENTS

| | | | |
|---|---|---|---|
| FR | 2795836 | 1/2001 | |
| JP | 57025042 A | 2/1982 | G06F 9/22 |
| JP | 7-161184 | 6/1995 | |
| JP | 2000-35831 | 2/2000 | |
| TW | 02/056187 | 7/2002 | G06F 13/16 |
| WO | WO 00/45282 A1 | 8/2000 | |
| WO | WO 02056187 A2 | 7/2002 | G06F 13/16 |

OTHER PUBLICATIONS

Micron data sheet entitled "Synchronous DRAM, MT48LC4M32B2-1 Megx32x4 Banks." published Jun. 2002. 52 pages.

Ware, Frederick A., Preliminary datasheet entitled, "Direct RDRAM™ 256/288—Mbit (4Mx16/18x4i)," Document DL0106 Versuib 1.1. Copyright Aug. 2000. 72 pages.

Ware, Frederick A., Rambus Advance Information Direct RMC.d1 Data Sheet, Doc. DL0036, Version 1.20. Copyright Jul. 2000, Rambus Inc. 100 pages.

PCT/US03/32205 International Search Report dated Nov. 30, 2004. 2 pages.

EP Official Communication dated Mar. 29, 2010 re Summoned to Oral Proceedings re EP Application No. 03761276.9. pp. 9.

European Examination Report, European Application No. 03761276.9, 4 pages.

European Supplementary Search Report, European Application No. 03761276.9, dated Jan. 22, 2007, 5 pages.

European Supplementary Partial Search Report, European Application No. 03761276.9, dated Aug. 3, 2006, 5 pages.

European Examination Report, European Application No. 03774772.2, dated Jun. 25, 2009, 7 pages.

European Supplementary Search Report, European Application No. 03774772.2, dated Sep. 24, 2007, 3 pages.

PCT International Search Report, PCT/US03/19802, dated Sep. 29, 2003, 4 pages.

PCT International Search Report, PCT/US03/32205, dated Nov. 30, 2004, 5 pages.

Response to Official Communication dated Mar. 29, 2010, dated Aug. 18, 2010, in EP Application No. 03761276.9-2212. 1 page.

Samsung Electronics, "512Mb M-die DDR-II SDRAM Specification Version 0.11," Apr. 2002, pp. 1-66, Ref. 0.11.

Ware, F.A., "16/18MBIT (2Mx8/9) & 64/72MBIT (8Mx8/9) Concurrent RDRAM," Data Sheet, Advance Information, Jul. 1996, pp. 1-61, Rambus Inc., Mountain View, CA, USA.

EP Office Communication dated Dec. 1, 2010 re EP Application No. 03761276.9 in the Decision to Refuse an EP Application. 13 Pages.

EP Office Communication dated Sep. 21, 2011 re EP Application No. 03774772.2. 7 Pages.

EP Office Communication dated Oct. 25, 2011 re EP Application No. 11171486.1. 6 Pages.

EP Response dated Feb. 15, 2012 to the Office Action dated Oct. 24, 2011 re EP Application No. 11171622.1, includes new claims (highlighted and clear copy) and new description pages. 20 pages.

EP Response to Official Communication dated Sep. 21, 2011 re EP Application No. 03774772.2, includes new claims (highlighted and clear copy). 21 pages.

EP Response dated May 4, 2012 re EP Application No. 11171486.1, includes new claims (highlighted and clear copy) and new description page. 18 pages.

EP Office Communication dated Nov. 16, 2012 for European Patent Application No. 11171622.1, 5 Pages.

EP Examination Report dated Feb. 3, 2014 in EP Application No. 11171486.1. 5 pages.

EP Office Action dated Jan. 3, 2014 in EP Application No. 03774772.2. 6 pages.

EP Response dated Apr. 23, 2014 in EP Application No. 03774772.2, Includes New Claims 1-24 (Clear and Highlighted copies). 19 pages.

* cited by examiner

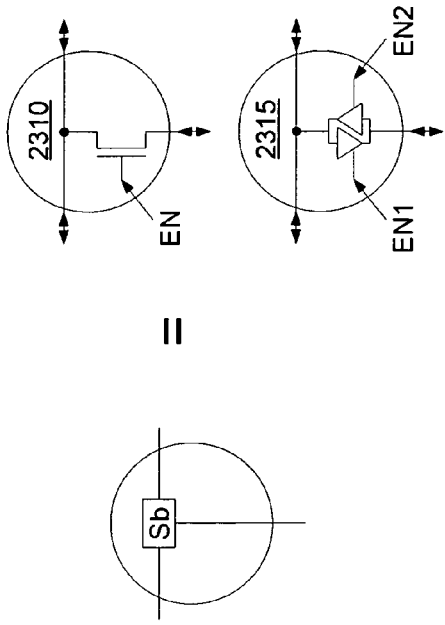
Fig. 23A (Prior Art)
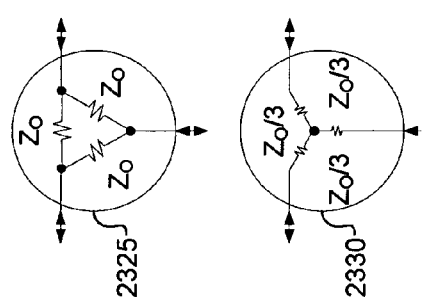
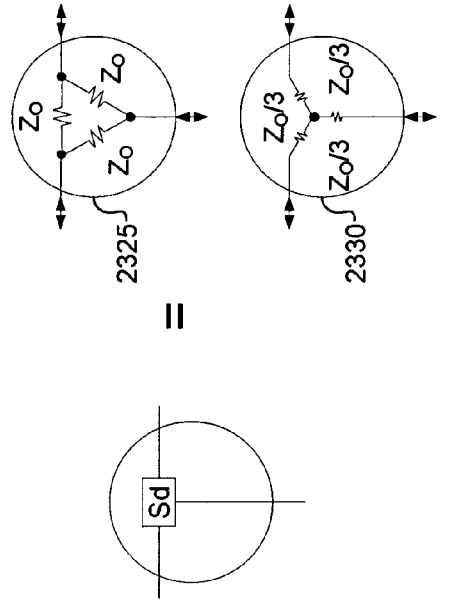
Fig. 23B (Prior Art)
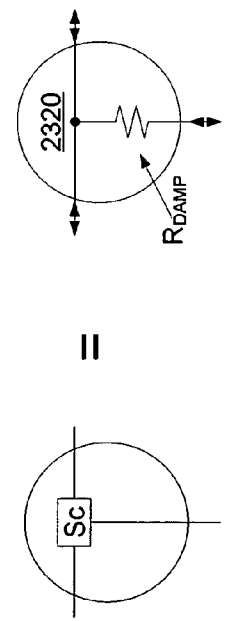
Fig. 23C (Prior Art)
Fig. 23D (Prior Art)

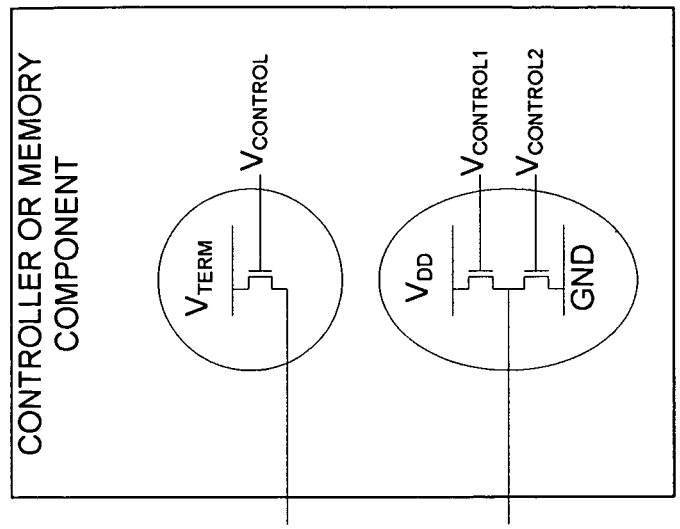
Fig. 24D (Prior Art)
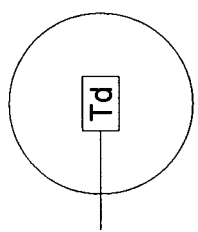
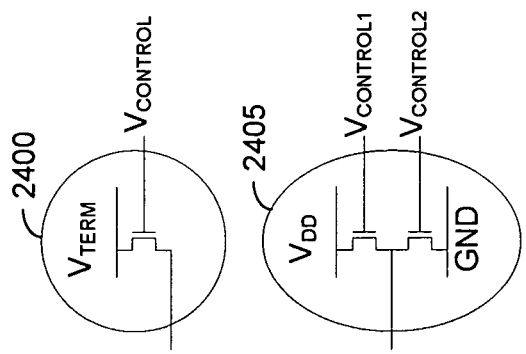
Fig. 24C (Prior Art)
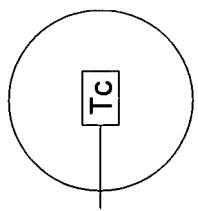

DYNAMIC MEMORY SUPPORTING SIMULTANEOUS REFRESH AND DATA-ACCESS TRANSACTIONS

This application is a continuation of pending application Ser. No. 11/215,339 filed Aug. 29, 2005, now U.S. Pat. No. 7,565,480, issued on Jul. 21, 2009; which is a continuation of application Ser. No. 10/268,808, filed on Oct. 9, 2002, now U.S. Pat. No. 7,043,599, issued May 9, 2006; which claims the benefit of provisional application Ser. No. 60/390,273, filed Jun. 20, 2002.

BACKGROUND

In a DRAM memory system it is necessary to periodically refresh the contents of the storage cells in the memory. This is because information is held in the form of charge on a capacitor. The charge leaks off over time (it is volatile), and must therefore be read and rewritten to restore the original amount of charge.

As a consequence of the refresh requirement, memory controllers in DRAM systems periodically issue refresh commands that initiate refresh operations. Unfortunately, issuance of a refresh command prevents issuance of other commands (e.g., read and write) in a given time slot; moreover, read and write operations that might otherwise occur for selected memory banks are suspended during refresh operations directed to those banks. For both these reasons, the issuance of refresh commands reduces DRAM performance. The reduction in a DRAM system's performance due to refresh requirements is the system's "refresh overhead."

One method used to reduce refresh overhead is to permit multiple banks (two or four, for example) to refresh a row simultaneously. This helps reduce the number of command slots needed to specify refresh commands, but aggravates the problem of bank contention because increasing the number of banks being refreshed increases the probability of a refresh operation conflicting with read or write operations. There is therefore a need for a way to reduce refresh overhead.

SPECIFIC EXAMPLES

FIG. 1 (prior art) shows a block diagram of a basic memory system 100. System 100 is typically built from discrete integrated components, including a controller component 105 and "$N_S$" memory components 110, where $N_S$ is an integer greater than zero. In this system, a set of request interconnects "RQ" carry request information (i.e., "requests") from controller component 105 to memory components 110. Each request includes some command information, and optionally includes control and address information, as detailed below. A set of interconnects labeled "DQ[j]" carry data information between controller component 105 and memory components 110. There are $N_S$ instantiations of these DQ[j] interconnect sets, and "j" is an integer between the values of zero and $N_S-1$, inclusive.

Each memory component 110 includes an interface 113 and a collection of $2^{Nb}$ banks 115 and corresponding sense amplifier structures SA, where Nb is an integer greater than or equal to zero. Each bank 115 is a two-dimensional array of storage cells. The storage cells (not shown) in each bank 115 are organized in "$2^{Nr}$" rows, where Nr is an integer greater than or equal to zero.

Each sense amplifier SA (also called a "sense amp" or "sense") is a one-dimensional array of cells used for temporary storage of data extracted from one row in the associated bank. When a row of data has been moved to the sense amplifier by an "activate" operation, that data is available for access by read and write operations. Each bank 115 is organized as "$2^{Nc}$" columns, where Nc is an integer greater than or equal to zero. A "column" is the quanta of data accessed in a given bank during a read or write operation.

Controller 105 accesses the storage cells in one of banks 115 by issuing an appropriate data-access request (read request or write request) to the respective interface 113. A decoder 120 decodes the request, extracting the specified bank, row, and column addresses. The bank and row addresses are stored in an address register 125, while the bank and column addresses are stored in a second address register 130.

FIG. 2 (prior art) illustrates the movement of data during three steps for accessing data in one of banks 115 first introduced in FIG. 1. Step one is an activate operation in which one row of one bank is selected and placed into the associated sense amplifier. Step two is a data-access (read or write) operation in which one column of the selected row (held in the sense amplifier) is selected and accessed. Data from the sense amplifier is transferred to the DQ interconnect (read), or data on the DQ interconnect is transferred into the sense amplifier (write). In FIG. 2, the label "c" means "column."

Step three is a precharge operation. The bank and sense amplifier are deselected and left in a state in which another activate operation can access a different row. Prior to deselection, any columns in the sense amplifier modified by a write operation are copied to the storage cells of the selected row of the selected bank. In the present disclosure, an "operation" refers to one of the above steps (activate, read, write, precharge). An operation will be caused by the receipt of one of the following commands at the RQ interface of the memory: activate (ACT), read (RD), write (WR), precharge (PRE), refresh-activate (REFA), and refresh-precharge (REFP). A "transaction" specifies a sequence of one or more operations that accesses a memory 110. In the examples that follow, a read transaction consists of an activate operation, two read operations, and a precharge operation (i.e., as specified by the command sequence ACT-RD-RD-PRE). This transaction is appropriate when the memory bank is initially in a precharged (closed) state, and is to be left in a precharged state. If a memory bank is initially in an activated (open) state, then there are several possible transaction types, such as: RD-RD (row match), RD-RD-PRE (row match with precharge), PRE-ACT-RD-RD (row mismatch), and PRE-ACT-RD-RD-PRE (row mismatch with precharge). "Match" and "mismatch" refer to whether the row address in the request matches the one that is currently in the sense amplifier. The following examples assume that transactions are directed to precharged banks and that each transaction performs a precharge operation after each read or write operation. This assumption keeps the examples simple without obscuring the performance impact of traditional refresh operations.

FIG. 3 (prior art) is a timing diagram illustrating the three operations that comprise both a read transaction and a write transaction. In each case, the transaction is directed to a precharged bank. A clock signal CLK is shown across the top of the diagram for reference. It is assumed that the memory system is a synchronous version of memory system 100 of FIG. 1, and that the rising edge of clock signal CLK arrives at controller 105 and memory component 110 simultaneously, or very nearly so. Other clocking methods are possible, but do not directly impact the details of the invention.

The "RQ" and "DQ" labels in FIG. 3 indicate the information contained at the RQ and DQ interfaces for a given one of memory components 110 of system 100: the information for the interfaces for the other memory components will be essentially identical, as memory components 110 are operated in a lockstep and synchronous fashion.

The information contained at the RQ and DQ interfaces at the controller will be time shifted from what is shown in the diagram because of the delay encountered by a signal that propagates along an interconnect. The timing of the interconnect sets at the controller are not important in this discussion; the timing at one of the memory components illustrates the problem posed by the refresh requirement and the solution offered by this invention.

The read transaction, shown at the top of FIG. 3, consists of the following events:
1. At clock edge 0, an ACT (activate) command for row R1 of bank B1 is received on the RQ interface. A time $t_{RCD}$ is needed for the activate operation, and at edge 3 a RD (read) command for column C1 of bank B1 is received. This command causes read data Q(B1/C1) to be transmitted on the DQ interface at edges 5 and 6.
2. After a time $t_{CC}$ at edge 5, a second RD (read) command for column C2 of bank B1 is received. This command causes read data Q(B1/C2) to be transmitted on the DQ interface at edges 7 and 8.
3. After a time $t_{RDP}$ at edge 10, a PRE (precharge) command for bank B1 is received. This command deselects the bank.
4. Finally, after a time $t_{RP}$ at edge 12, another ACT (activate) command for row R2 of bank B1 is received.

The time between an ACT command and a PRE command to the same bank is equal to or greater than the time $t_{RAS}$ and also the time ($t_{RCD}+t_{CC}+t_{RDP}$). The time between two ACT commands to the same bank is equal to or greater than the row cycle time $t_{RC}$. The time between a PRE command and an ACT command to the same bank is equal to or greater than the time $t_{RP}$. For typical memory components, the controller ensures the minimum values for all of these parameters are met.

The write transaction, shown at the top of FIG. 3, consists of the following events:
1. At edge 0, an ACT (activate) command for row R1 of bank B1 is received on the RQ interface.
2. A time $t_{RCD}$ is needed for the activate operation, and at edge 3 a WR (write) command for column C1 of bank B1 is received. This causes write data D(B1/C1) to be received on the DQ interface at edges 4 and 5.
3. After a time $t_{CC}$ at edge 5, a second WR (write) command for column C2 of bank B1 is received. This causes write data D(B1/C2) to be received on the DQ interface at edges 6 and 7.
4. After a time $t_{WRP}$ at edge 10, a PRE (precharge) command for bank B1 is received. This deselects the bank.
5. After a time $t_{RP}$ at edge 12, an ACT (activate) command for row R2 of bank B1 is received.

Note that the read and write transactions have very similar timing. They are similar enough, in this example, that only read transactions are used to illustrate the problems of the interaction of data-access transactions with refresh transactions. The interactions between write and refresh transactions can be analyzed in an analogous fashion, even for systems in which the write timing is not similar to the read timing.

FIG. 4 (prior art) illustrates a sequence of interleaved (pipelined) read transactions. At any point in the sequence, three read transactions will be accessing three different banks. In this example, the three banks are banks B1, B2, and B3. These banks are accessed in a round-robin fashion, with bank B1 accessed again after bank B3. Each read transaction uses an ascending row address in each of the three banks (R1, R3, R5, . . . ) so that the read transactions may be easily distinguished. Likewise, each read transaction uses an ascending pair of column addresses in each of the three banks (C1/C2, C3/C4, C5/C6, . . . ), again so that the read transactions may be easily distinguished. In a typical application, these row addresses and column addresses could have arbitrary values, and would usually not occur in an ascending sequence.

Bold borders highlight the individual operations associated with one of the read transactions. The highlighted transaction consists of the following events:
1. At clock edge 0, an ACT (activate) command for row R3 of bank B1 is received on the RQ interface.
2. At edge 3 a RD (read) command for column C3 of bank B1 is received. This causes read data Q(B1/C3) to be transmitted on the DQ interface at edges 5 and 6.
3. At edge 5 a second RD (read) command for column C4 of bank B1 is received. This causes read data Q(B1/C4) to be transmitted on the DQ interface at edges 7 and 8.
4. At edge 10, a PRE (precharge) command for bank B1 is received. This deselects the selected bank.
5. At edge 12, an ACT (activate) command for row R5 of bank B1 is received.

The above read transaction is essentially identical (except for the row and column addresses) to the read transaction of FIG. 3. The difference is that in FIG. 4 an ACT command for row R3 of bank B2 is received on the RQ interface at clock edge 4. The interval between the two successive ACT commands to different banks is $t_{RR}$. The ratio between $t_{RC}$ and $t_{RR}$ determines how many read transactions are simultaneously executing when the RQ and DQ interfaces are fully utilized. In this example, the ratio is three, so that an ACT command to banks B2 and B3 will be issued at edges 4 and 8 in between the ACT commands to bank B1 at edges 0 and 12.

The read transactions to banks B1, B2, and B3 are shown individually as waveforms (RQ-1/DQ-1, RQ-2/DQ-2, RQ-3/DQ-3) in the lower part of FIG. 4. The read transactions applied to each bank use the same series of row and column addresses, but the operations are staggered in time. For example, all operations to bank B2 occur four cycles after the corresponding operation to bank B1.

If the memory had more than three banks (typically a memory has a bank total that is a power of two, such as 4 or 8), then many other interleaving examples are possible, providing a $t_{RC}$ interval is observed between successive ACT commands to the same bank and a $t_{RR}$ interval is observed between successive ACT commands to different banks.

Single-Bank Refresh

The upper portion of FIG. 5 (prior art) shows a single refresh transaction. It consists of two operations: a refresh-activate operation in which a REFA command for row R1 of bank B1 is received on the RQ interface and a refresh-precharge command in which a REFP command for bank B1 is received on the RQ interface. In this example, the REFA and REFP commands are functionally similar to the ACT and PRE commands, respectively, which are used for data-access (read and write) transactions. The rules for intervals between the REFA and REFP commands are therefore identical to the rules already described for the intervals between ACT and PRE commands; namely, the time between an REFA command and a REFP command to the same bank is the time $t_{RAS}$, the time between two REFA commands to the same bank is the row cycle time $t_{RC}$, and the time between a REFP command and a REFA command to the same bank is the time $t_{RP}$. The intervals between any combination of ACT or REFA, and PRE or REFP are similar.

In some systems, the row address, bank address, or both may not be supplied in the REFA command, but may instead come from one or more internal registers of the memory. Other commands may be used to load these registers to initial address values, and to increment or decrement the address values stored therein. Registers can be manipulated by commands dedicated to this purpose, or can be manipulated by commands that both control internal registers and perform refresh-activate or refresh-precharge operations. The following example continues to assume that the bank and row addresses are supplied with the REFA command, but with the understanding that this information could be supplied by alternative means, such as internal registers. The consequences of using internal registers to supply this information are discussed in a later section.

Multi-Bank Refresh

The waveform toward the bottom of FIG. 5 shows a multi-bank refresh transaction. The timing is identical to the single bank refresh transaction shown at the top of FIG. 5, except that a number of banks are refreshed simultaneously. In this case, row R1 of banks B0, B1, B2, and B3 are refreshed simultaneously. Typically, the addresses of the multiple banks are aligned on power-of-two boundaries, for example bank addresses {0, 1, 2, 3}. This address alignment reduces the amount of bank-address information so that it is approximately the same as in the single bank case. Moreover, the same row of the multiple banks will be chosen for refresh to reduce the amount of row-address information.

Although the timing of the multi-bank refresh transaction is identical to the single bank refresh transaction, four banks are busy instead of just one. This difference affects the way that multi-bank refresh transactions interact with data-access transactions, as will be shown shortly.

FIG. 6 (prior art) illustrates a sequence of interleaved (pipelined) single-bank refresh transactions. At any point in the sequence, three refresh transactions are accessing three different banks. In this example, the three banks B1, B2, and B3 are accessed in a round-robin fashion, with B1 accessed again after B3. Each refresh transaction uses an ascending row address in each of the three banks ( . . . R2, R3, R4, . . . ) so the refresh transactions may be easily distinguished.

The operations associated with one of the refresh transactions are outlined in bold for emphasis. The emphasized refresh transaction includes the following events:
1. At edge 0, an REFA (Refresh-Activate) command for row R3 of bank B1 is received on the RQ interface.
2. At edge 10, a REFP (Refresh-Precharge) command for bank B1 is received on the RQ interface.
3. At edge 12, an REFA (Refresh-Activate) command for row R4 of bank B1 is received.

The emphasized refresh transaction is essentially identical (except for the row addresses) to the refresh transaction at the top of FIG. 5. The interval between the two successive REFA commands to different banks is $t_{RR}$. The ratio between $t_{RC}$ and $t_{RR}$ determines how many refresh transactions are simultaneously executing to fully utilize the RQ interface. In this example, the ratio is three, so that an REFA command to banks B2 and B3 is issued at edges 4 and 8 in between the REFA commands to bank B1 at edges 0 and 12.

The refresh transactions to the three banks are shown individually as waveforms RQ-1, RQ-2, and RQ-3 in the lower part of FIG. 6. The refresh transactions applied to each bank use the same series of row addresses, but the operations are staggered in time. For example, all operations to bank B2 occur four cycles after the corresponding operation to bank B1.

FIG. 7 (prior art) shows the interleaved read transaction example from FIG. 4 with one single-bank refresh transaction interspersed. A REFA command to row RR of bank B1 takes the place of the ACT command to row R3 of bank B1. Since the REFA and ACT commands use the same bank, they may be interleaved with the same constraints. However, the refresh transaction will not perform a data transfer on the DQ interface, and a four-cycle bubble (equal to a length $t_{RR}$) appears in the cycles at clock edges 5, 6, 7, and 8. The four-cycle bubble, which occurs because the refresh transaction transfers no data, represents an overhead factor when calculating performance levels.

In some applications, the access pattern applied to a given memory may ensure that every row of every bank is accessed by a read or write transaction at least once in every $t_{REF}$ interval (the refresh requirement). However, most applications are unable to guarantee this, and instead the controller issues refresh transactions at a rate that insures every row of every bank is refreshed at least once per $t_{REF}$ interval. As can be seen in FIG. 7, this comes at the cost of a somewhat lower rate of read and write transactions. Typically, the performance cost is on the order of a few percent; that is, a few percent of the read and write transaction slots are replaced by refresh transactions. While this cost may appear small, even a few percentage points are significant in an industry in which performance is paramount.

One traditional method of limiting the performance cost of refresh is to increase the number of addressable columns in a row, reduce the number of rows in a bank, and leave the number of banks unchanged. If the total size of the memory (number of banks times number of rows times number of columns times the column size) is fixed, the number of refresh transactions in every $t_{REF}$ interval is reduced, reducing the refresh overhead.

As a consequence of the increased number of addressable columns in a row, a larger number of storage cells in a bank are simultaneously accessed and placed into sense amplifiers. Increasing the number of storage cells accessed at a given instant increases the pulse of current that must flow through internal power wires of the memory during an activate operation. The increased current requires larger power wires, and can adversely affect the ability of the memory to change the small signal in a storage cell to a large signal in the sense amplifier.

When this method (a smaller number of rows in a bank) is used, the size of the row that is accessed by the ACT command can be kept at the normal size while the REFA command accesses a row that is bigger. This alternative does not avoid the problem of the current pulse during the refresh-activate operation, but can avoid consuming unnecessary power during a read or write transaction by only accessing a row that is as big as required. This method is also called "multi-row" refresh.

A second traditional method, so-called "multi-bank refresh," limits the performance cost of refresh transactions by refreshing a number of banks at the same time. FIG. 8 (Prior Art) illustrates the interleaved read transaction sequence of FIG. 4, but with a single burst refresh transaction inserted at edge 12. In this example, it is assumed that the memory has a total of four banks. In this case, no new read transactions may be started after the ACT command to row R3 of bank B1 has been received at edge 0. This is because the multi-bank refresh transaction (in this example) cannot start until all four banks are idle. This occurs at edge 12.

In the same way, the next read transaction does not start until the multi-bank refresh transaction has finished; in this example, this occurs at cycle 24. After the ACT command to row R3 of bank B2 has been received at edge 24 and the ACT command to row R3 of bank B3 has been received at edge 28, the memory has returned to the point of steady state operation that was interrupted by the multi-bank refresh transaction.

In this example, a total of 20 bubble cycles (equal to a length $2t_{RC}-t_{RR}$) are created by the multi-bank refresh. This is because a time $(t_{RC}-t_{RR})$ is needed to drain the memory pipeline of read transactions, a time $(t_{RR})$ is needed to specify the multi-bank refresh transaction, and a time $(t_{RC}-t_{RR})$ is needed to refill the memory pipeline with read transactions.

It is unlikely that a multi-bank refresh would be implemented in this manner in an actual memory because this option offers no performance advantage over single-bank refresh. A more likely implementation is one in which the multi-bank refresh transaction would only simultaneously refresh some fraction of the total number of banks (½, for example).

FIG. 9 (prior art) illustrates a more realistic example of multi-bank refresh. In this case, it is assumed that there are a total of eight banks, and that a multi-bank refresh transaction affects four banks at once. A REFA command to row RR of banks B4, B5, B6, and B7 takes the place of the REFA command to row RR of bank B1 in FIG. 7. As before, the refresh transaction will not perform a data transfer on the DQ interface, and a four-cycle bubble (equal to a length $t_{RR}$) appears in the cycles at edges 5, 6, 7, and 8. The bubbles occur because the refresh transaction does no data transfer, and represents an overhead factor when performance levels are calculated.

The performance cost of the single bank refresh transaction and the multi-bank refresh transaction are identical when the multi-bank refresh operates on half of the total banks or less. During a $t_{REF}$ interval only one-fourth as many multi-bank refresh transactions would be required, which could result in a performance improvement relative to the single bank case.

The example of FIG. 9 assumes that during the time the multi-bank refresh transaction takes place, no read or write transaction attempts to use the four banks. This is hard to assure, since it means that the two read or write transactions just before and the two transactions just after the multi-bank refresh transaction must utilize a pool of just four banks. If the bank addresses are randomly distributed, this will not occur often (about 2.5% of the time in this example). The rest of the time, there will be interference with the four banks being refreshed, and in the worst case the situation will degenerate to something like that shown in FIG. 8 with worse performance than single-bank refresh. A particular application will see a performance degradation that depends upon the distribution of bank addresses in the request stream.

Multi-bank refresh can be improved by increasing the number of banks. However, each additional bank of storage cells has a certain amount of support circuitry that represents a fixed overhead, so increasing the number of banks and decreasing the number of storage cells per bank increases the relative area of the support circuitry and consequently the cost of the memory. For example, increasing the number of banks to 16 and assuming a random distribution of bank addresses (and assuming four bank refresh) would mean that a multi-bank refresh transaction would look like FIG. 9 about 25% of the time. This is an improvement compared to 2.5% of the time for eight banks, but there will still be a significant amount of performance lost due to bank interference because 75% of the time there will be more bubble cycles than in FIG. 9.

Multi-bank refresh has other costs, too. As with the previous solution of multi-row refresh, multi-bank refresh increases the number of storage cells that are simultaneously refreshed. As noted above, increasing the number of storage cells simultaneously refreshed increases the pulse of current that must flow through the internal power wires of the memory during the refresh-activate operation. A larger supply current pulse requires larger power wires and can adversely affect the ability of the memory to change the small signal in a storage cell to a large, stable signal in the sense amplifier.

Due to the above-described problems associated with conventional dynamic memory systems, there is a need for methods and circuits for reducing the impact of memory refresh transactions on memory performance.

BRIEF DESCRIPTION OF THE FIGURES

FIGS. 23A, 23B, 23C, and 23D show some conventional variations of splitting-elements for memory systems adapted in accordance with embodiments of the invention.

FIGS. 24A-D show some of the possible termination element variations for use in memory systems.

DETAILED DESCRIPTION

Figure 10A:
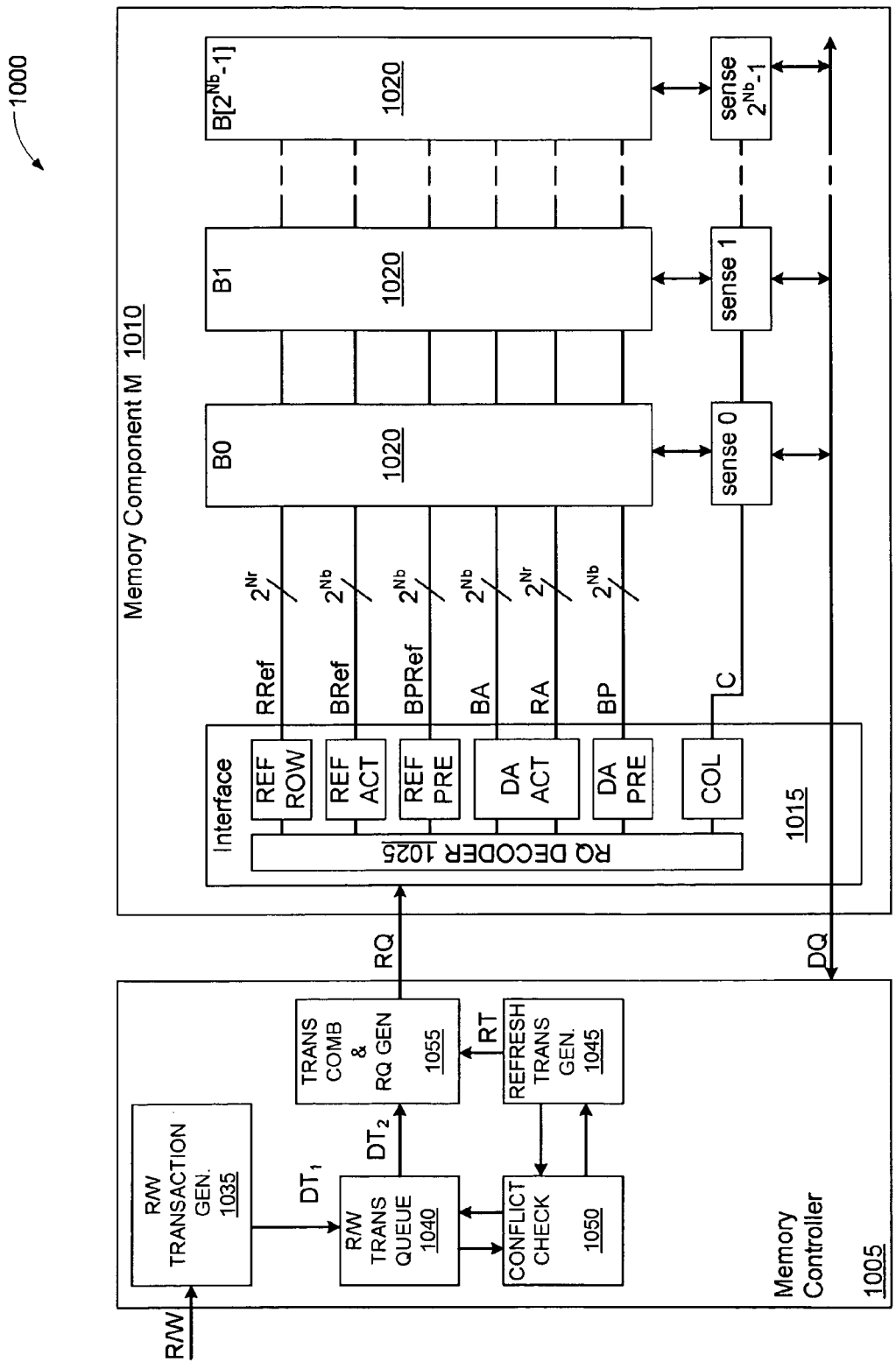
FIG. 10A depicts memory system adapted to minimize the impact of refresh transaction on memory performance.

FIG. 10A is a block diagram of a memory system 1000 adapted in accordance with one embodiment of the invention to minimize the impact of refresh transactions on memory performance. System 1000 permits refresh transactions to be scheduled with virtually no performance loss (unlike the performance losses of a few percent or more of previous solutions) and is less expensive to implement than previous solutions. To achieve these benefits, system 1000 supports independent and simultaneous activate operations directed to different banks and independent and simultaneous precharge operations directed to different banks. System 1000 supports two sets of bank and row address signals to simultaneously specify an activate operation for a data-access (read or write) transaction and an activate operation for a refresh transaction.

System 1000 includes a memory controller 1005 and a memory component 1010, both of which are modified to support independent and simultaneous activate and precharge operations directed to different banks. Only one memory component is shown, but others can be included. A request interconnect RQ carries memory requests from controller 1005 to memory component 1010, and a data interconnect DQ caries data information between controller 1005 and memory component 1010.

Memory component 1010 includes a memory interface 1015 and a collection of $2^{Nb}$ memory banks 1020 (B0 to B[$2^{Nb}$−1]) and associated sense amplifiers. The storage cells (not shown) in each bank are organized in $2^{Nr}$ rows and $2^{Nc}$ columns. The values of Nb, Nr, and Nc are integers greater than or equal to zero. Memory interface 1015 receives and interprets data-access and refresh requests from controller 1005.

Although the disclosed embodiments have numbers of banks, rows, columns, etc., that are expressed in powers of two, it should be understood that the number or banks, rows and columns may be any integer having a value greater than zero. The number of banks, rows and columns in the disclosed embodiments are expressed in powers of 2 because such numbers are convenient in systems that express addresses using binary numbers. In other embodiments, for example, where addresses are specified using multi-level logic, it may be convenient to use numbers other than powers of two.

Memory interface 1015 decodes data-access and refresh requests into specific control signals, including any required addresses (e.g., device, bank, row, and column) to select the set of memory cells affected by each command. To accomplish this, interface 1015 includes a request decoder 1025 and the following request registers:

1. A "refresh row" register REF-ROW stores an address identifying a target row for a refresh-activate command (REFA) and presents the address on a row-refresh interface RRef to each memory bank.
2. A "refresh activate" register REF-ACT stores an address identifying a target bank for a refresh-activate command (REFA) and selects the addressed bank via a bank-refresh interface BRef to each memory bank.
3. A "refresh precharge" register REF-PRE stores an address identifying a target bank for a refresh-precharge command (REFP) and selects the addressed bank via a bank-precharge-refresh interface BPRef to each memory bank.
4. A "data-access activate" register DA-ACT stores respective bank and row addresses identifying a target bank and a target row for data-access commands (read RD or write WR) and selects the addressed bank and row via respective bank and row interfaces BA and RA to each memory bank.
5. A "data-access precharge" register DA-PRE stores an address identifying a target bank for a data-access precharge command (REF) and selects the addressed bank via a bank-precharge interface BP to each memory bank.
6. A column-address register COL stores an address identifying a target bank and column for data-access commands to each sense amplifier.

As detailed below, registers REF-ACT and DA-ACT can simultaneously activate one (or more) of banks 1020 for a data-access while simultaneously activating one (or more) others of banks 1020 for a refresh transaction. Memory controller 1005 organizes the requests presented to component 1010 to prevent conflicting data-access and refresh requests to the same bank.

Memory controller 1005 includes a transaction generator 1035 that receives read/write instructions from an external source (not shown). Generator 1035 turns these instructions into data-access transactions (DTs) formatted to interact with memory component 1010. Controller 1005 transfers these data-access transactions, in the order received, via a first transaction bus $DT_1$ to a read/write transaction queue 1040. In one embodiment, queue 1040 is a FIFO register that stores a sequence of transactions.

Controller 1005 also includes a refresh-transaction generator 1045, a conflict-check circuit 1050, and a transaction-combiner and request generator circuit 1055. Controller 1005 issues simultaneous refresh and data-access requests, but not to the same banks within memory component 1010. To this end, conflict-check circuit 1050 monitors the contents of queue 1040 and ensures refresh-transaction generator 1045 does not issue refresh transactions that conflict with incoming data-access transactions. Conflict check circuit 1050 can avoid a conflict by stalling or reordering refresh transactions issued by refresh-transactions generator 1045, or by reordering data-access transactions within queue 1040.

Transaction-combiner and request generator circuit 1055 separates data-access and refresh transactions into their constituent requests. Circuit 1055 then combines some data-access requests with refresh requests to formulate combined requests. The combined requests facilitate simultaneous refresh and data-access operations.

Figure 10B:
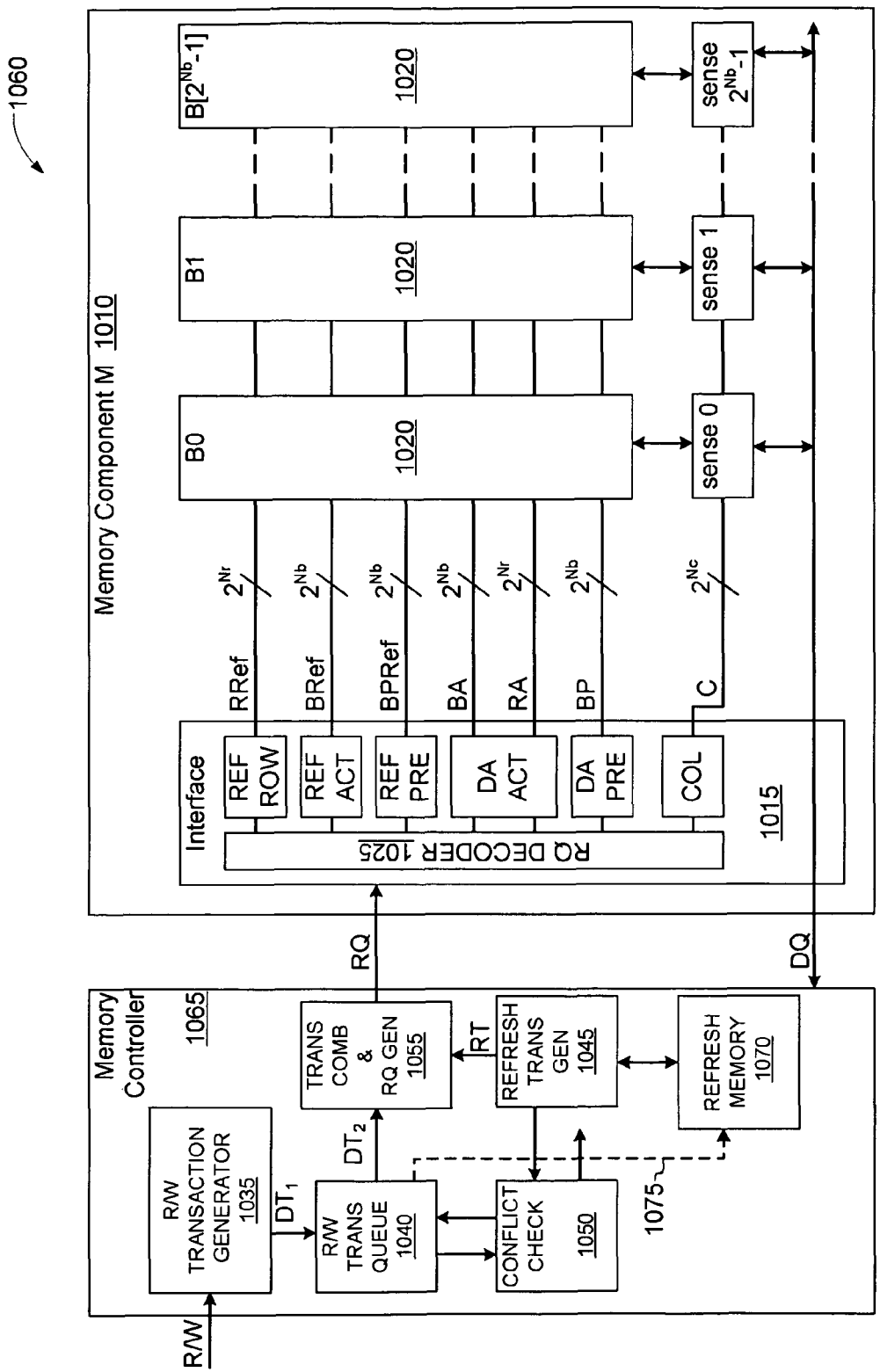
FIG. 10B depicts a memory system 1060 in accordance with other embodiments of the invention.

FIG. 10B depicts a memory system 1060 in accordance with other embodiments of the invention. System 1060 is similar to system 1000 of FIG. 10A, like-labeled elements being the same or similar. System 1060 differs from memory system 1000, however, in that controller 1065 of system 1060 includes a refresh memory 1070 that keeps track of which rows of which banks have been refreshed. For a typical modern memory, refresh memory 1070 might have about 32,000 bits of storage, one for each row of each bank. More storage would be required for larger memory components.

The bits within refresh memory 1070 are cleared at the beginning of each $t_{REF}$ interval. Then, as each row of each bank is refreshed during a $t_{REF}$ interval, controller 1065 sets a bit in refresh memory 1070 associated with the specific row/bank combination. Keeping track of which rows have been refreshed during a $t_{REF}$ interval allows controller 1065 to perform refresh transactions on the unused banks regardless of the memory accessing pattern of the application employing memory system 1060. If, at the end of the $t_{REF}$ interval, there are rows of banks that have not been refreshed because the banks had been too heavily utilized by data-access transactions, then controller 1065 can hold off subsequent data-access transactions until all rows and banks had been refreshed.

In one embodiment, conflict-check circuitry 1050 monitors queue 1040 for bank and row usage of data-access transactions and sets a storage bit in refresh memory 1070 for each ACT command, as each data access refreshes the contents of the accessed memory cells. In this embodiment, refresh memory 1070 receives bank and row addresses via an interconnect 1075 from transaction queue 1040.

Yet another embodiment reduces the storage requirements for controller 1060 by keeping track of a subset of rows for all the banks. In one embodiment, refresh memory 1070 includes storage for four rows for each of eight banks, requiring 32 bits. Controller 1065 first refreshes rows 0 through 3 of banks 0 through 7, in any order. Controller 1065 then refreshes rows 4 through 7 of banks 0 through 7, again in any order. This process continues until the last set of rows is refreshed. The time $t_{REFROWSET}$ allocated for refreshing each set of rows is approximately the $t_{REF}$ interval divided by the number of row sets. If, at the end of each $t_{REFROWSET}$, there are rows of banks that had not been refreshed because the banks had been too heavily utilized by read and write transactions, then controller 1065 holds off subsequent data-access transactions until those banks had been refreshed. The row set size can vary from the minimum (one row of each bank) to the maximum (all rows of each bank).

In one embodiment, controller 1065 is modified to perform "out-of-order execution" of the data-access requests, the refresh requests, or both. In other words, controller 1065 accepts a sequence of data-access requests and performs the corresponding read and write transactions out of sequence to improve performance. Altering the order of refresh requests is relatively simple because refresh transactions need not be performed in a particular order. Read and write transactions can also be reordered, which might be advantageous if, for example, there is a limited amount of storage for tracking refresh transactions across a row set.

Write transactions are generally less sensitive to the order in which they are executed than are read transactions, assuming that the memory controller can account for any change in the write sequence order. Thus, in some embodiments controller 1065 (or controller 1005 of FIG. 10A) is modified to move all read requests to the front of transaction queue 1040 to initiate a read transaction at the earliest possible time; write and read requests are shuffled to fill in all the remaining available transaction slots. This approach produces excellent memory utilization without impacting the order sensitive (i.e., latency sensitive) read transactions.

Figure 10C:
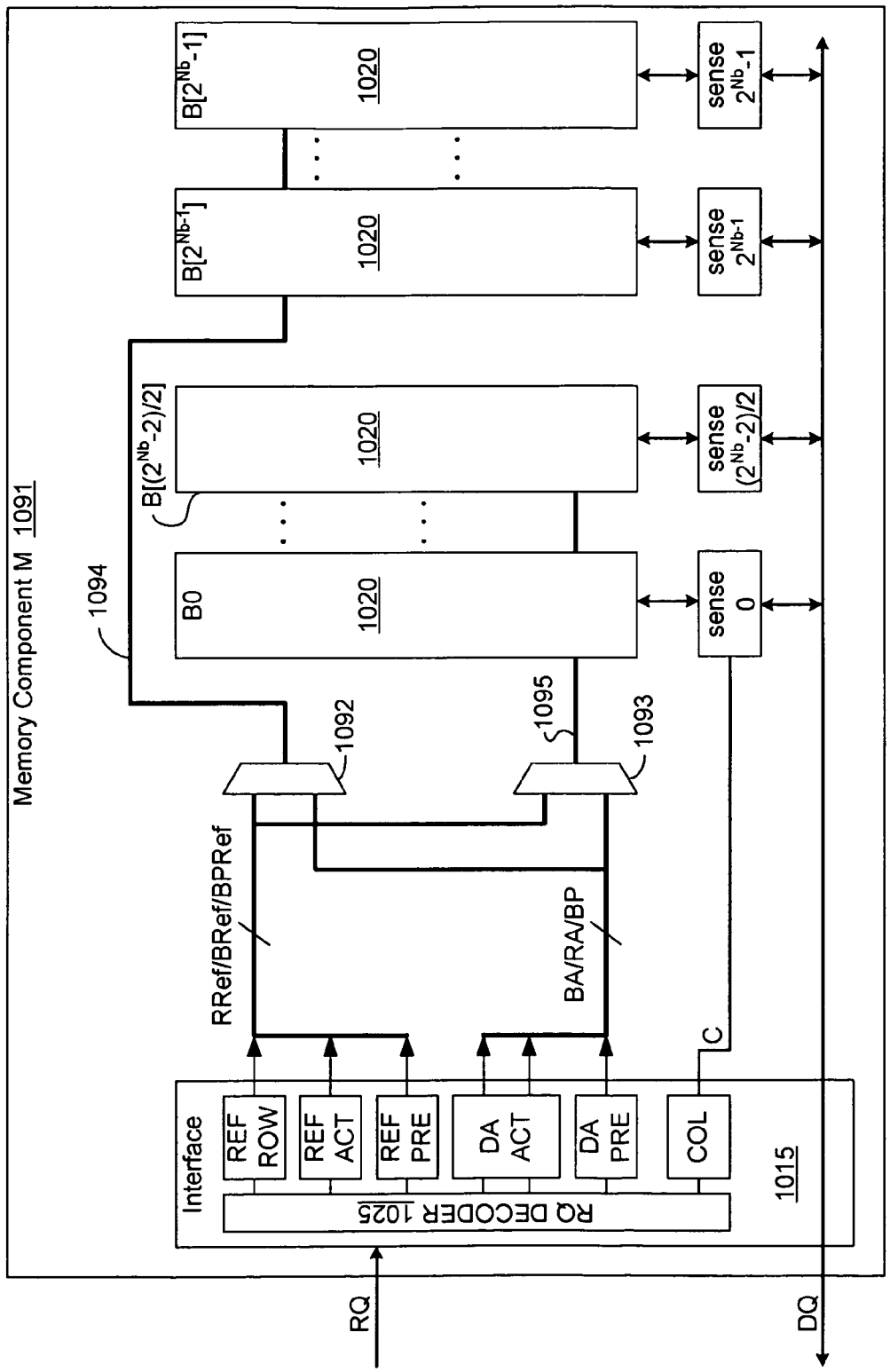
FIG. 10C depicts a memory component 1091 adapted in accordance with another embodiment of the invention.

FIG. 10C depicts a memory component 1091 adapted in accordance with another embodiment of the invention. Memory component 1091 is similar to component 1010 of FIG. 10A, like-labeled elements being the same. Interface 1015 includes the same refresh lines Rref, BRef, and BPRef, which are combined in FIG. 10C as a collective refresh bus Rref/BRef/BPRef; similarly, data-access lines BA, RA, and BP are combined as a collective data-access bus BA/RA/BP. These two busses are connected to respective collections of input terminals on a pair of multiplexers 1092 and 1093.

The memory banks of component 1091 are divided into two sets: banks B0 through $B[(2^{Nb}-2)/2]$ and banks $B[2^{Nb}-1]$ through $B[2^{Nb}-1]$. If Nb is 3, for example, the banks are divided into sets B0-B3 and B4-B7. The output of multiplexer 1092 connects to the first set via a bus 1094, and the output of multiplexer 1093 connect to the other set via a bus 1095. Multiplexers 1092 and 1093 can therefore be used to steer refresh and data-access requests between the two sets of banks, and consequently to separately access different banks for refresh and data-access operations.

Figure 10D:
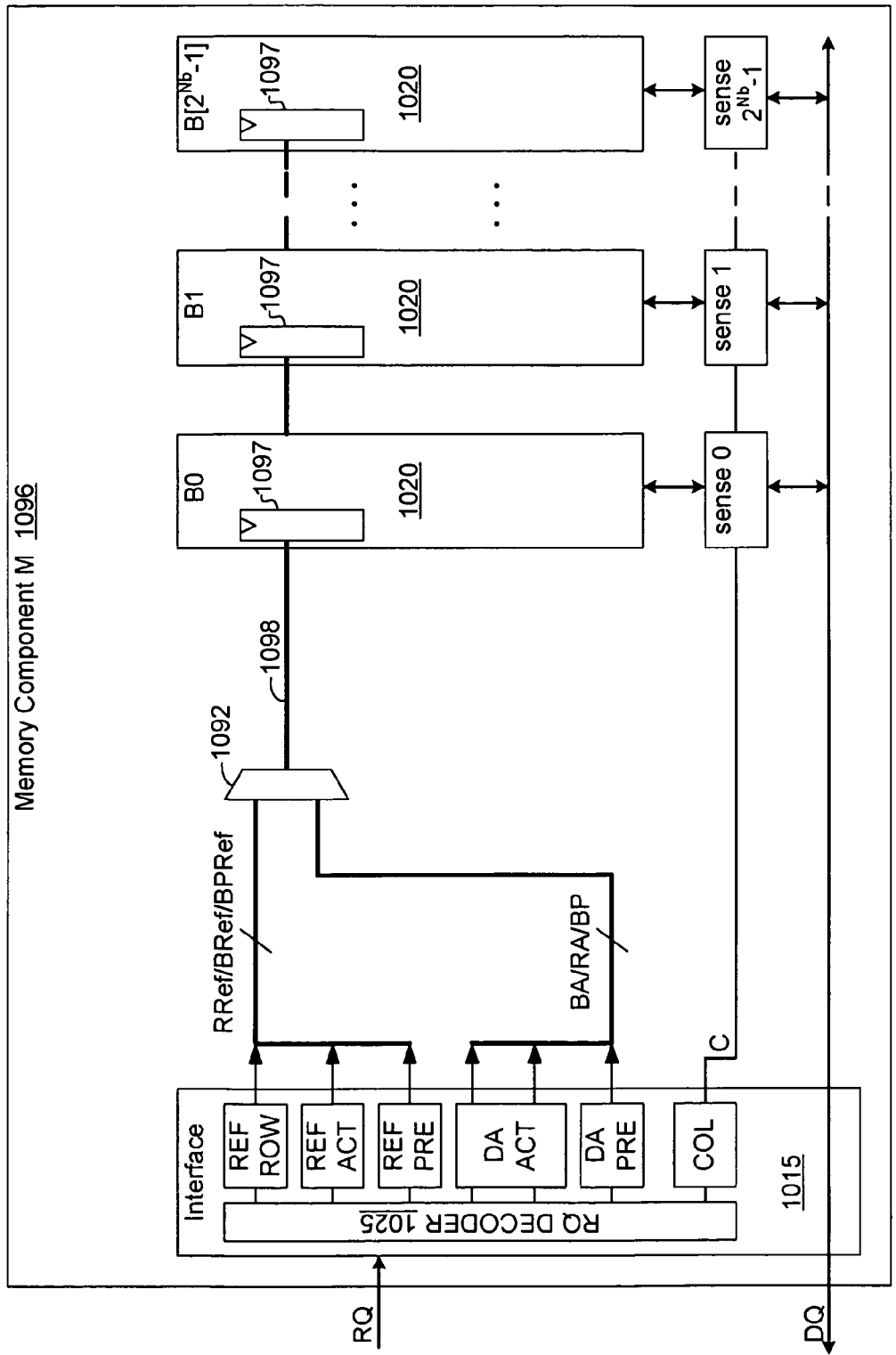
FIG. 10D depicts a memory component 1096 adapted in accordance with yet another embodiment of the invention.

FIG. 10D depicts a memory component 1096 adapted in accordance with yet another embodiment of the invention. Memory component 1096 is similar to component 1091 of FIG. 10C, like-labeled elements being the same. Instead of separating the banks into sets, however, memory component 1096 incorporates storage logic 1097 into each memory bank to facilitate time-multiplexing of the signals provided on the refresh lines (Rref, BRef, and BPRef) and the data-access lines (BA, BR, and BP). Memory component 1096 can thus provide data-access and refresh signals on a shared bus 1098 during alternate time intervals, with the selected banks latching the signals as appropriate.

The embodiments of FIGS. 10A-10C include dedicated refresh and data-access registers, such as a first register for activating one bank for refresh and a second register for concurrently activating a second bank for data-access. In the embodiment of FIG. 10D, storage logic 1097 can include registers that respond to both refresh and data-access commands. For example, during one time interval storage logic 1097 of bank B0 can be activating bank B0 for refresh while storage logic 1097 of bank B1 is activating bank B1 for data-access, and during another interval storage logic 1097 of bank B1 can be activating bank B1 for refresh while storage logic 1097 of bank B0 is activating bank B0 for data-access. In such embodiments, one storage logic 1097 functions as a refresh register activating (or precharging) a first bank while another of storage logic 1097 functions as a data-access register activating (or precharging) a second bank. Each storage logic 1097 can therefore be considered a "refresh" register or a "data-access" register at a given instant.

Figure 11A:
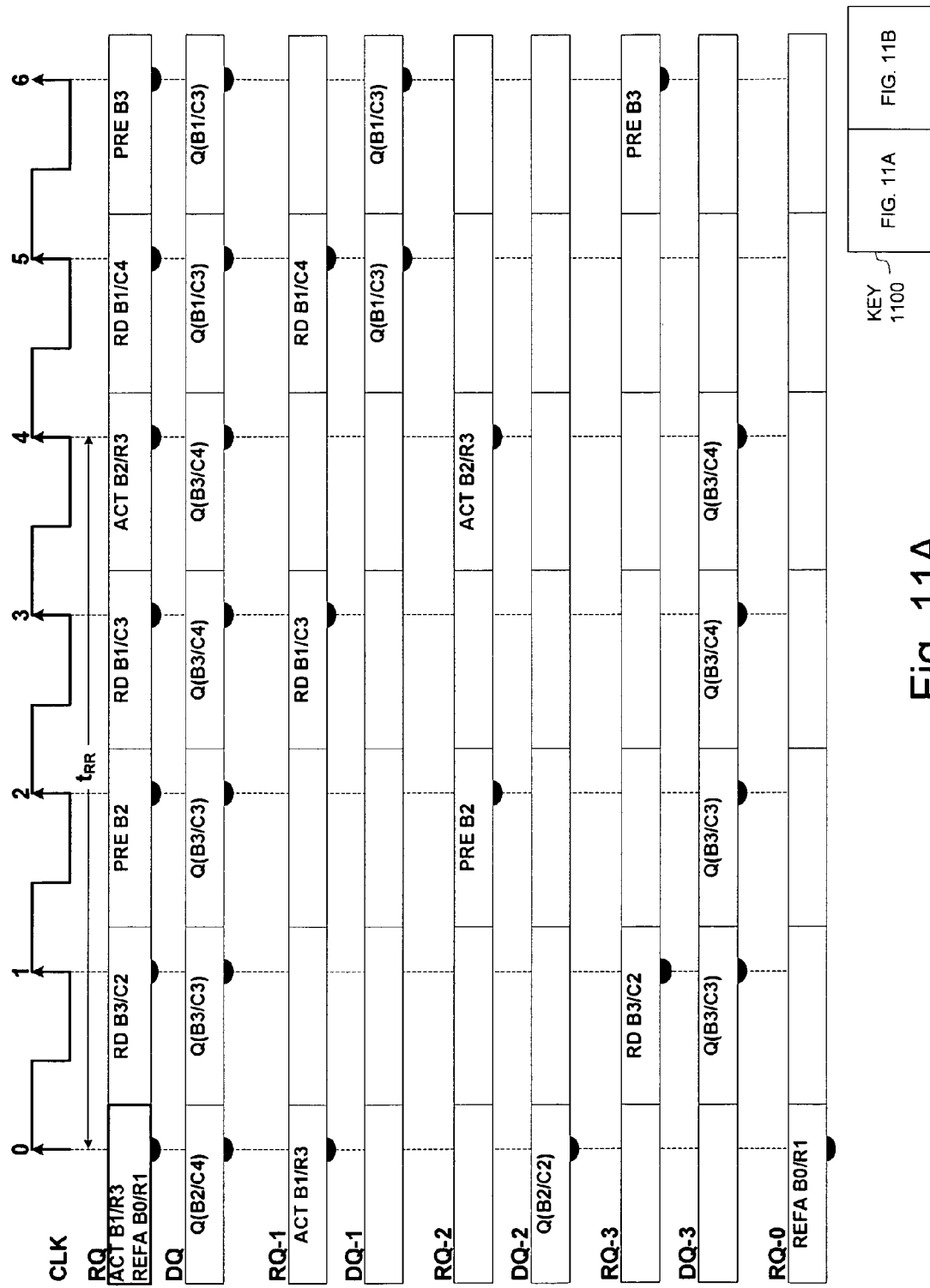
FIGS. 11A and 11B illustrate the operation of memory system 1000 of FIG. 10A.
Figure 11B:
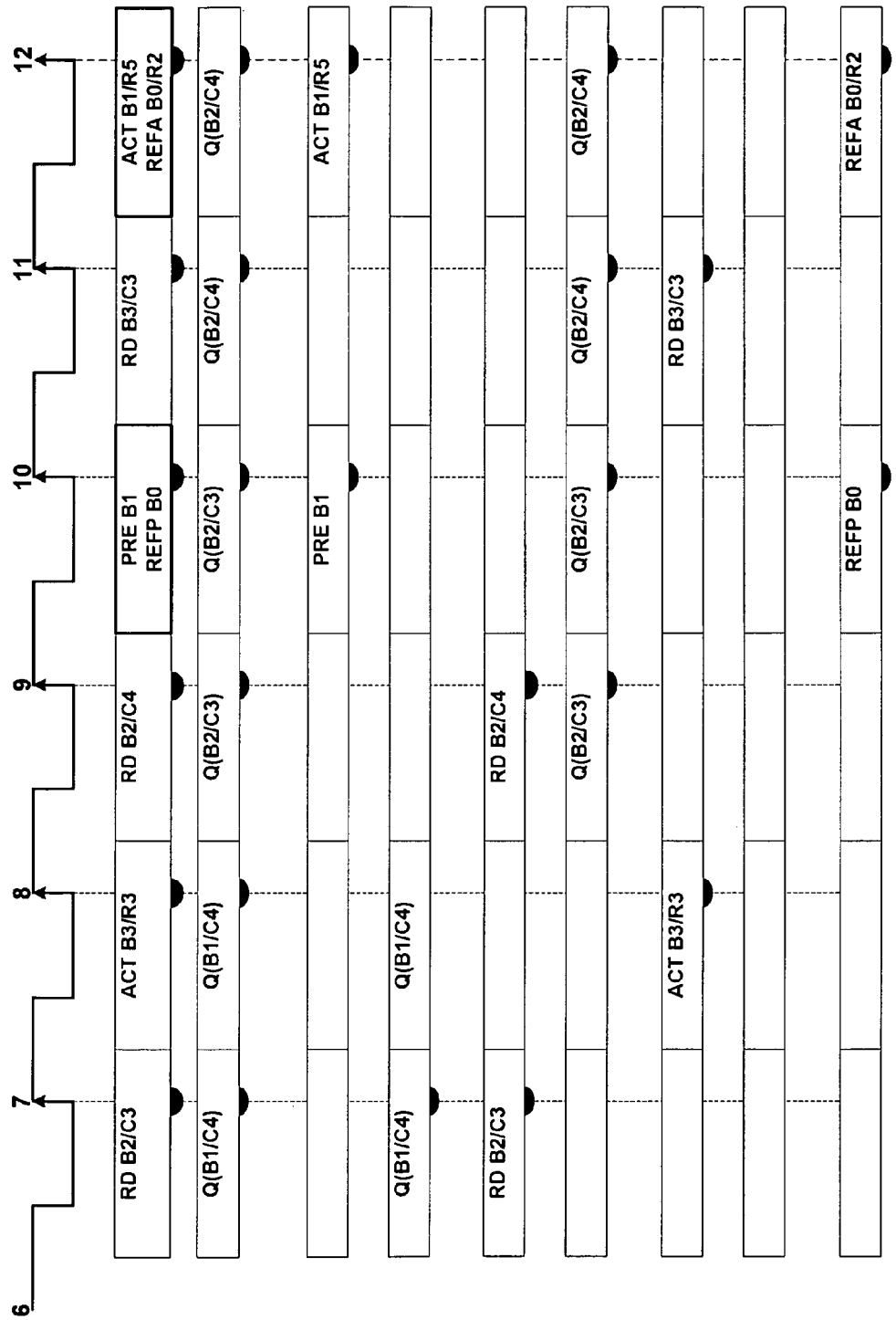

FIGS. 11A and 11B illustrate the operation of memory system 1000 of FIG. 10A, together depicting a sample timing diagram for a simultaneous refresh transaction inserted into a sequence of interleaved read transactions. A key 1100 at the bottom right of FIG. 11A shows how FIGS. 11A and 11B relate.

Interface 1015 activates a first bank B1 at a first instant (clock edge zero) and waits a minimum time period $T_{RR}$ before activating a second bank B2 at a second instant (edge four). At a third instant, which happens to be simultaneous with the first instant in this example, interface 1015 activates a third bank B0 to begin a refresh transaction. (This example assumes a row-address value R1, for "row one," is stored in register REF-ROW from a previous refresh command.)

Figure 1:
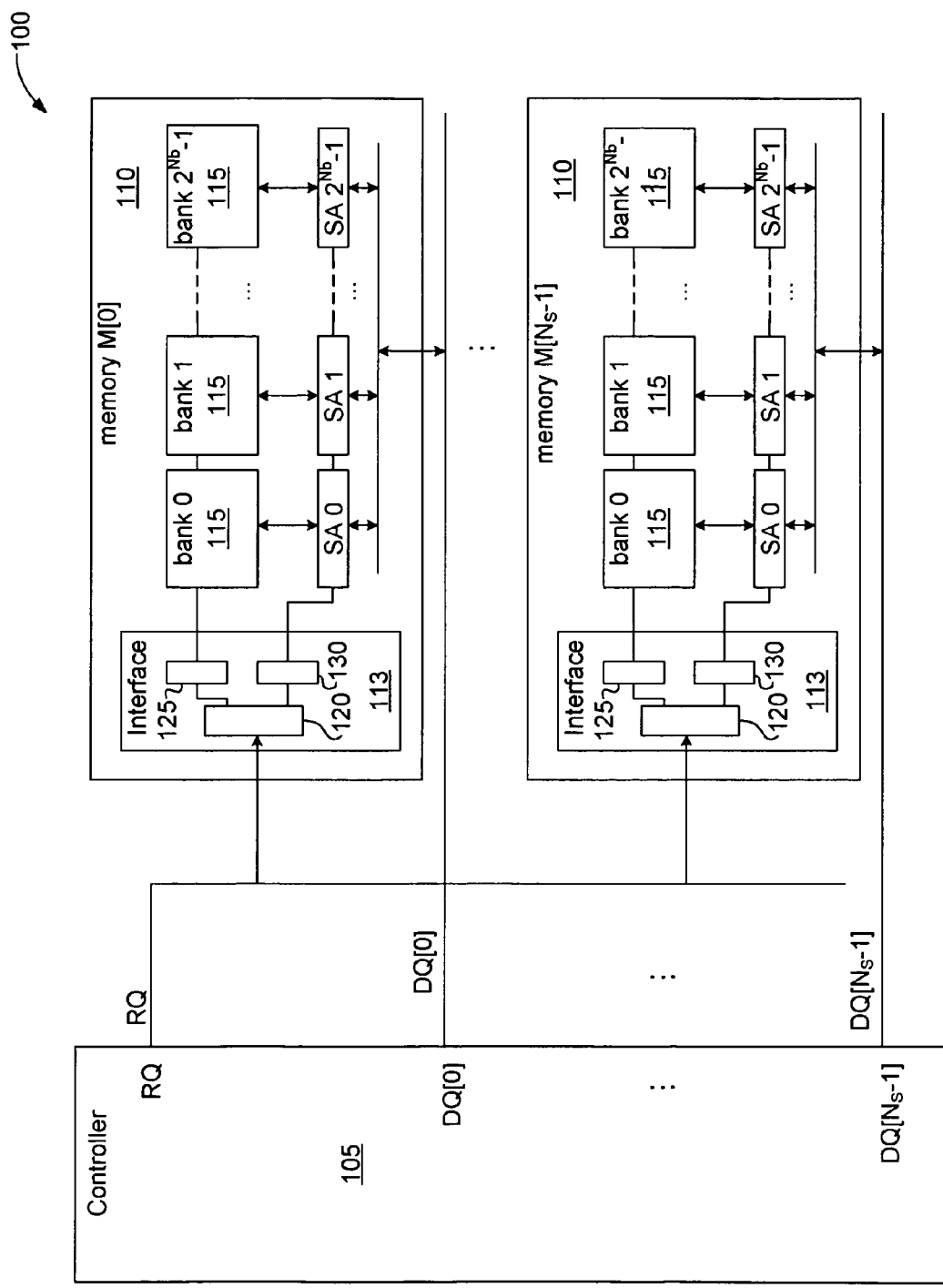
FIG. 1 (prior art) shows a block diagram of a basic memory system 100.
Figure 2:
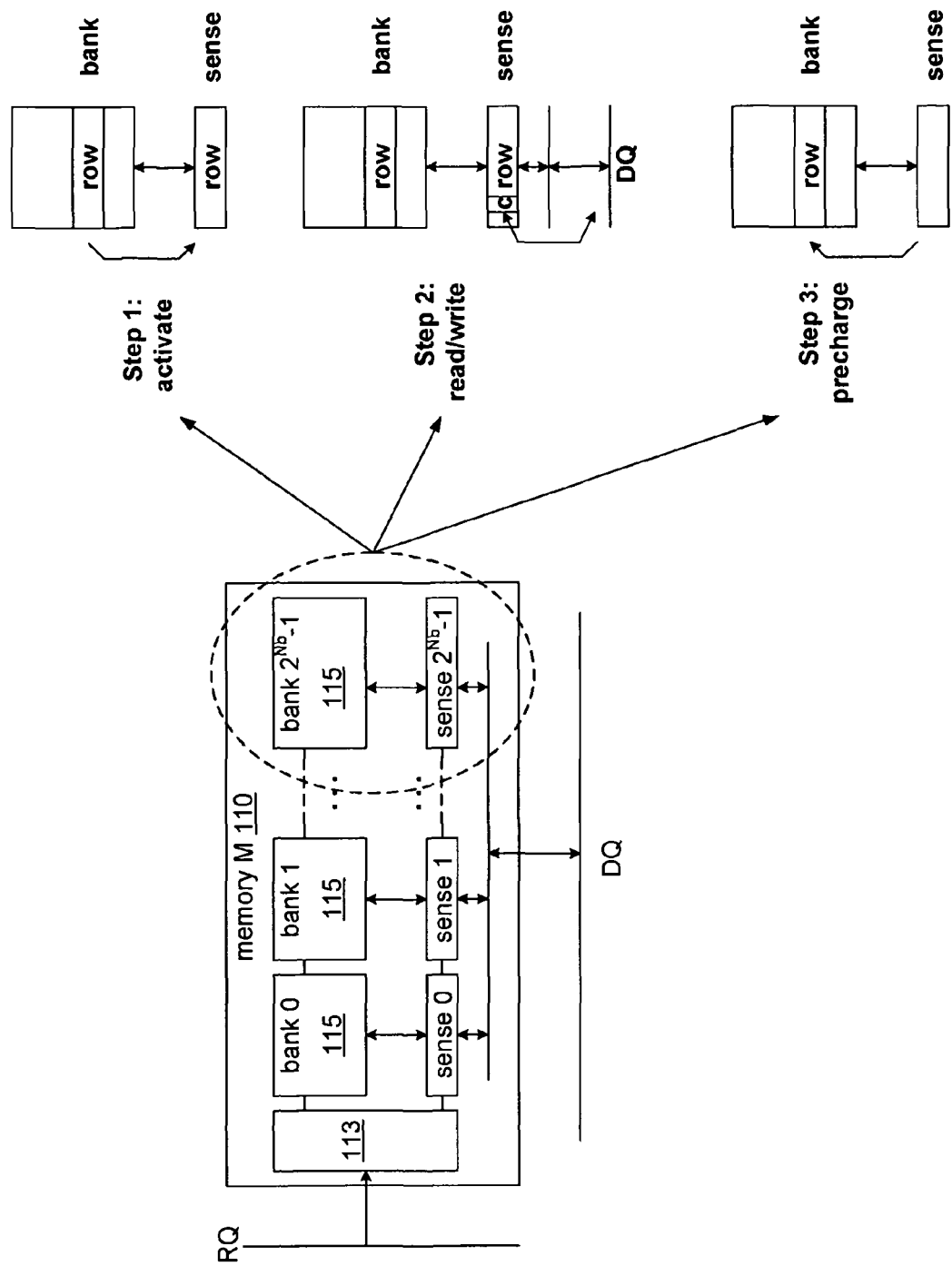
FIG. 2 (prior art) illustrates the movement of data during three steps for accessing data in one of banks 115 first introduced in FIG. 1.
Figure 3:
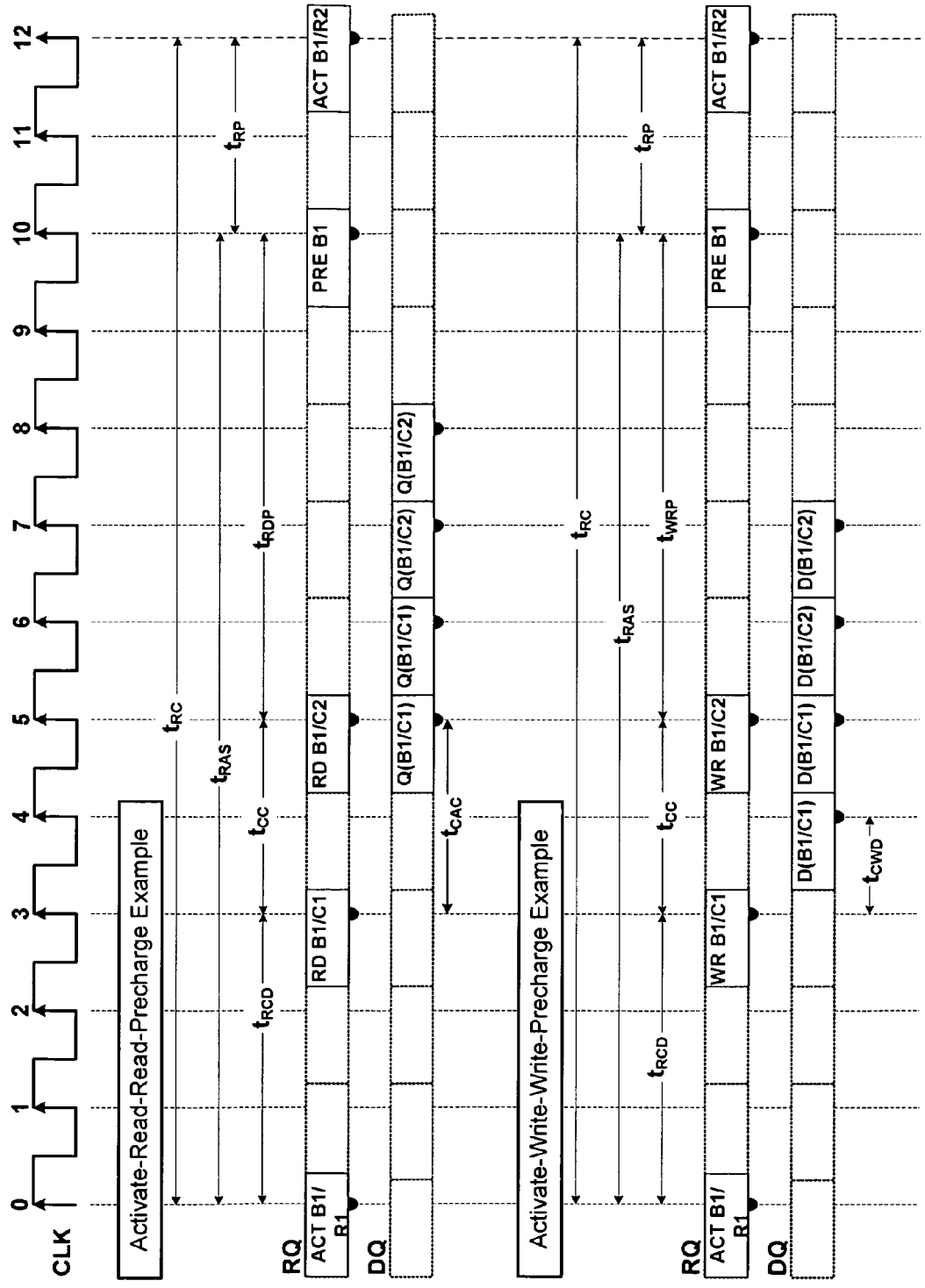
FIG. 3 (prior art) is a timing diagram illustrating the three operations that comprise both a read transaction and a write transaction.

In FIG. 1A, lines RRef (for "row-refresh") and BRef (for "bank-refresh") employ the values in respective registers REF-ROW and REF-ACT to select the bank and row to be refreshed. Lines BA (for "bank-address") and RA (for "row-address") likewise employ the values in register DA-ACT to select the designated bank and row to be read. Bank-address lines BRef and BA separately access different banks for refresh and data-access operations, allowing memory 1010 to carry out the refresh and data-access operations concurrently.

Turning to FIG. 11B, at time 10 address data derived from a refresh-precharge (REFP) command and stored in register REF-PRE specifies bank B0 and address data derived from a data-access precharge command PRE and stored in register DA-PRE specifies bank B1. Register REF-PRE precharges the bank specified in the precharge command via lines BPRef (for "Bank-Precharge Refresh") and register DA-PRE precharges the bank specified in the refresh-precharge command via lines BP (for "Bank Precharge").

In the example just described, interface 1015 simultaneously issues the refresh-activate command to bank B0 and the read-activate command to bank B1. The refresh and data-access activate commands need not be issued simultaneously, however. A REFA command may start a refresh transaction without fear of conflict if the two preceding memory transactions, the simultaneous transaction, and the following two transactions are directed to banks other than the bank that is to be refreshed. In the example of FIGS. 11A and 11B, these criteria can be satisfied with as few as four banks, and can be guaranteed to be satisfied with six or more banks (five banks for the background read and write transactions and one bank for the refresh transaction). This ability to overlap refresh and data-access operations while avoiding bank conflicts, a property herein referred to as "simultaneous refresh," is one major advantage of embodiments of the invention over multi-bank refresh: with eight banks, multi-bank refresh has barely enough banks to work, and still incurs significant performance losses due to bank interference. With eight banks, memory systems in accordance with the invention can choose from at least three possible banks for refresh at each point that a refresh transaction is to start.

A second advantage of simultaneous refresh is that no timing slots on request interface RQ need be allocated to refresh commands. Refresh commands may instead be specified along with data-access commands. Specific examples of how this can be done are detailed below.

In FIGS. 11A and 11B, the REFA command is aligned with an ACT command, causing each refresh transaction to align with one of the data-access transactions. It is not necessary that the transactions be aligned in this way, but this alignment has the benefit that the refresh transaction overlaps the smallest number of ongoing data-access transactions. For example, if the REFA command in FIG. 11A were received at edge 2 instead of edge 0, the refresh transaction would overlap six data-access transactions instead of five. Such timing would therefore reduce the number of banks available for refresh at each point that a refresh transaction could be started. Furthermore, it may be advantageous from a memory-core design perspective to require that a refresh transaction align with an ongoing read or write transaction; that is, each REFA command aligns with an ACT command and each REFP command aligns with a PRE command. This timing alignment could prevent a power-supply current pulse resulting from a data-access activate operation from occurring in the middle of a refresh-activate operation, or vice-versa.

Memory systems that support simultaneous refresh and data-access commands will become increasingly important with future increases in the number of storage cells in dynamic memories. For a typical memory component today, the number of rows times the number of banks might be approximately 32,000, the $t_{REF}$ refresh interval might be approximately 32 ms, and the $t_{RC}$ interval might be approximately 40 ns. In this example, and assuming only one refresh transaction occurs in any $t_{RC}$ interval, there are approximately 800,000 points at which a simultaneous refresh transaction could be started, which is about 25 times the required number of refresh commands slots. Using the present invention, refresh overhead can be virtually eliminated, even in memory components having densities twenty-five times greater than current memory components, without changing the $T_{REF}$ or $T_{RC}$ parameters.

If the refresh transactions were interleaved (e.g., by a factor of 3-4), the row size increased (e.g., by a factor of 2-8), and the $t_{REF}$ interval increased (e.g., by a factor of 2-4), then simultaneous refresh could support a memory component with 3,000 times more storage cells than a typical modern memory component. And this can be done with no impact on the data-access transactions that are being simultaneously processed. This conclusion assumes enough banks are available to avoid bank interference.

Controller Embodiments

Returning to FIG. 10A, controller 1005 is modified in accordance with one embodiment to efficiently support simultaneous refresh. Read/write transaction queue 1040 stores a sequence of data-access requests. Conflict check circuitry 1050 monitors queue 1040 to note (1) which of banks 1020 were used by read or write transactions issued over the last ($t_{RC}$−$t_{RR}$) interval; and (2) which of banks 1020 will be used by read or write transactions issued over the next ($t_{RC}$) interval. Refresh-transaction generator 1045 uses this information to generate refresh requests (RRQs) that do not conflict with the data-access requests DRQs in queue 1040 that are to take place over the combined $2t_{RC}$−$t_{RR}$ interval. In other embodiments discussed below, conflict check circuit 1050 can reorder refresh requests and data-access requests to more efficiently place refresh commands.

A bank that will not conflict with the sequence of read or write transactions specified in queue 1040 over the interval $2t_{RC}$−$t_{RR}$ can always be found if there are enough banks 1020 in memory component 1010. In the example of FIG. 10A and FIGS. 11A and 11B, a maximum of five banks could be busy with read and write transactions in a $2t_{RC}$−$t_{RR}$ interval, meaning that the memory needs six or more banks to guarantee that a simultaneous refresh can always be issued. For example, assume that the following sequence of read transactions is to be issued by controller 1005:
1. ACT B1/R1, RD B1/C1, RD B1/C2, PRE B1;
2. ACT B2/R1, RD B2/C1, RD B2/C2, PRE B2;
3. ACT B3/R1, RD B3/C1, RD B3/C2, PRE B3;
4. ACT B4/R1, RD B4/C1, RD B4/C2, PRE B4; and
5. ACT B5/R1, RD B5/C1, RD B5/C2, PRE B5.

In such a case, conflict check circuitry 1050 determines that after read transactions [1] and [2] have started, a REFA command could be issued to any row of banks B0, B6, or B7 at the same time that the ACT B3/R1 command is issued for read transaction [3]. Circuitry 1050 thus grants refresh transaction generator 1045 permission to issue refresh requests for banks B0, B6, or B7. In some applications, this form of opportunistic refresh may require that banks 1020 be refreshed, as needed, in any arbitrary order.

In some systems that support simultaneous refresh, the REFP command includes a bank address and no row address. Memory component 1010 supports such embodiments with row-address register REF-ROW. Controller 1005 provides for a minimum row set size (e.g., one row set), and the same row of each bank is refreshed in any bank order until all banks are refreshed. The row address (e.g., the value in row-address register REF-ROW) is then changed to a new value (e.g., by incrementing), and the newly addressed row set is refreshed in all the banks. The row address could be changed by a special command, or be changed when a particular bank value is used. The benefit of this approach is that the row address does not have to be bundled into the REFP command.

Figure 12A:
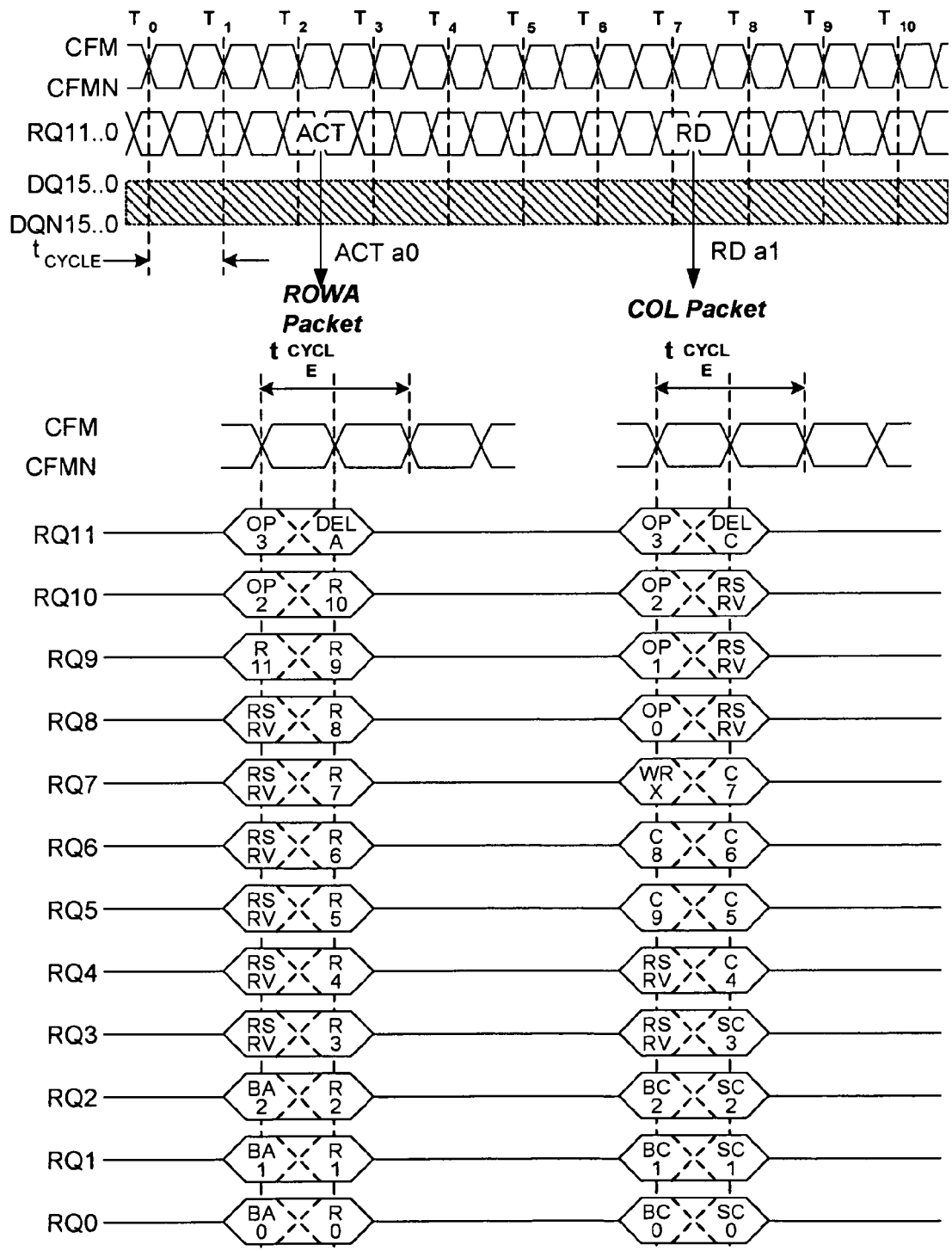
FIGS. 12A and 12B show request packet formats used by an embodiment of memory component 1010 of FIG. 10A.
Figure 12B:
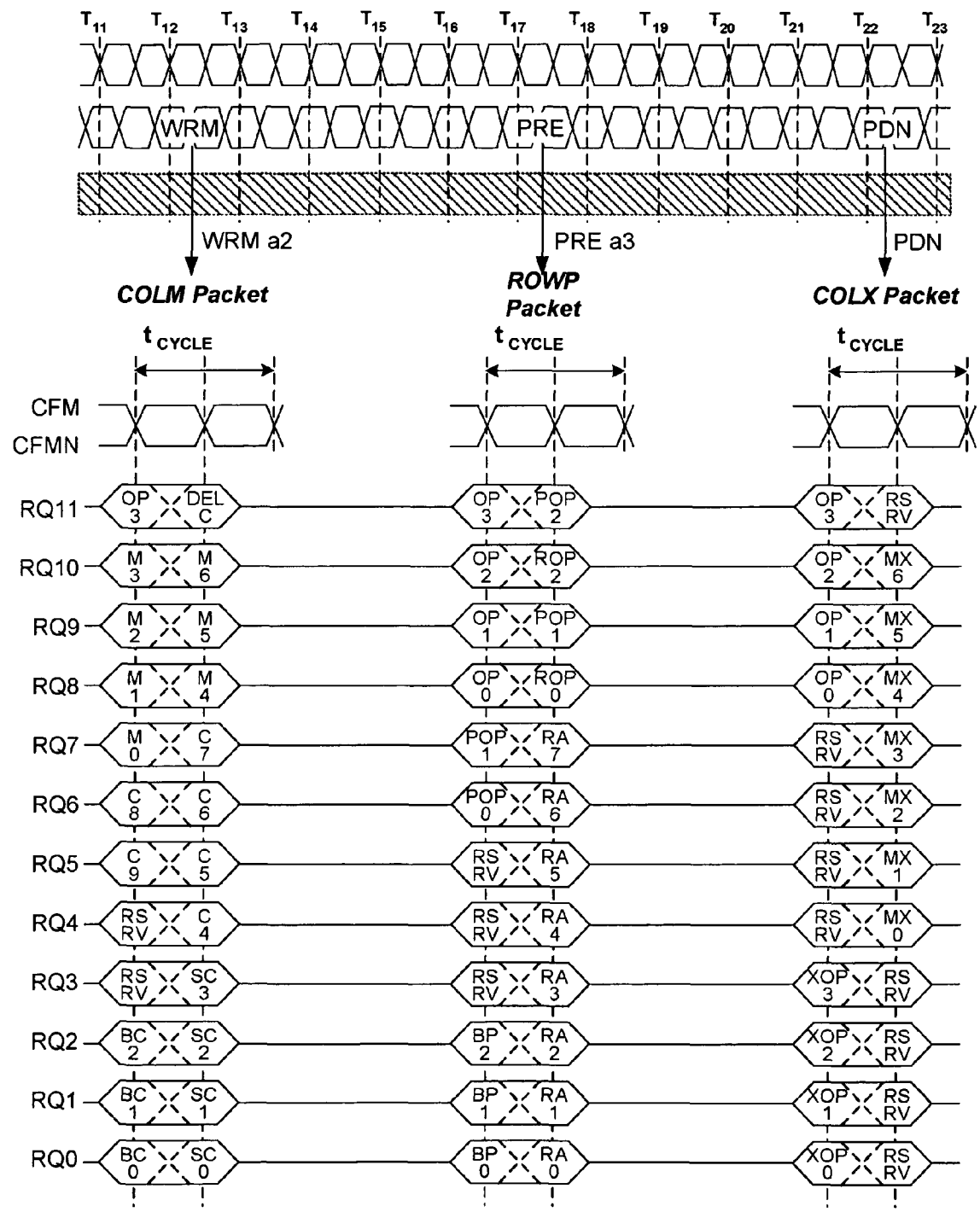

FIGS. 12A and 12B show exemplary request packet formats that may be used by an embodiment of memory component 1010 of FIG. 10A (a key 1200 at the bottom of FIG. 12A shows how FIGS. 12A and 12B fit together). A packet contains all the information needed to specify a command. In one embodiment, the RQ interface of memory component 1010 of FIG. 10A may be configured to receive twelve signals, or in the case of a memory component utilizing differential signals, twelve differential pairs of signals. Each signal provides two bits of information in each clock cycle, and each clock cycle is framed by differential master clock signals CFM and CFMN. Thus, in this exemplary embodiment, twenty-four bits of information form each request packet for the memory. The DQ interface, in this exemplary embodiment, may be configured to receive sixteen signals (or in the case of differential signaling, sixteen differential signals). Each read or write command on the RQ interface causes 256 bits of information to be transferred on the DQ interface during an interval of two clock cycles.

FIGS. 12A and 12B summarize five exemplary request packet formats:
1. ROWA—specifies an ACT command;
2. COL—specifies RD and WR commands;
3. COLM—specifies a WRM (masked write) command;
4. ROWP—specifies PRE, REFA and REFP commands; and
5. COLX—specifies the remaining commands.

The COLM and COLX packet formats are not relevant to the discussion of simultaneous refresh, and will not, therefore, be described further. The remaining packet formats have the following fields:
1. ROWA Packet Format:
 a. OP3..2—indicates this is ROWA packet and specifies the ACT (activate) command;
 b. BA2..0—specifies a bank address;
 c. DELA—specifies a delay of zero or one clock cycles;
 d. R11..0—specifies a row address.
 e. RSRV—reserved slots (for all packet formats).
2. COL Packet Format:
 a. OP3..0—indicates this is COL packet;
 b. WRX—specifies a RD (read) or a WR (write) command;
 c. BC2..0—specifies a bank address;
 d. DELC—specifies delay of zero or one clock cycles; and
 e. C9..4, SC3..0—specifies a column address.
3. ROWP Packet Format (for precharge):
 a. OP3..0—indicates this is a ROWP packet;
 b. POP2—specifies a PRE (precharge) command;
 c. POP1..0—specifies a delay of zero, one, two, or three clock cycles for precharge commands; and
 d. BP2..0—specifies a bank address for a PRE command.
4. ROWP Packet Format (for refresh):
 a. ROP2..0—specifies the REFA and REFP commands introduced above plus two additional commands, REFI (refresh increment) and LRR (load row register);
 b. RA7..6—specifies a delay of zero, one, two, or three clock cycles for REFA, REFP, and REFI commands;
 c. RA2..0—specifies bank addresses for REFA, REFP, and REFI commands; and
 d. RA7..0—row register value for the LRR command.

The ROWA packet is used for the ACT command, the COL packet is used for the RD and WR commands, and the ROWP packet is used for the PRE command. In addition, the ROWP packet is also used for the simultaneous refresh commands (REFA, REFI, REFP, and LRR), as detailed below.

There are a number of reasons for using the ROWP packet for simultaneous refresh commands. First, the size of the request packet is twenty-four bits. As can be seen from the above summary of fields within each packet format, that is about the right size for the ACT command (with its bank and row address fields) and for the RD and WR commands (with their bank and column address fields). However, the size of the request packet is much larger than what is needed for a PRE command (with just a bank address field). The packet format associated with the PRE command is therefore a logical format to use for the shared refresh commands. The precharge commands use thirteen bits and the refresh commands use eleven bits.

For other memory systems in accordance with the invention, format sharing by the precharge command PRE and refresh commands may also be a logical choice. Particularly when, for example, the activate, read, and write commands (ACT, RD, and WR) have large address fields that preclude format sharing with the refresh commands. However, for other memory systems in accordance with the invention, format sharing by the simultaneous refresh commands with activate, read, or write commands may be logical. Particularly when, for example, the simultaneous refresh commands use internal registers for both the row address and the bank address.

Figure 4:
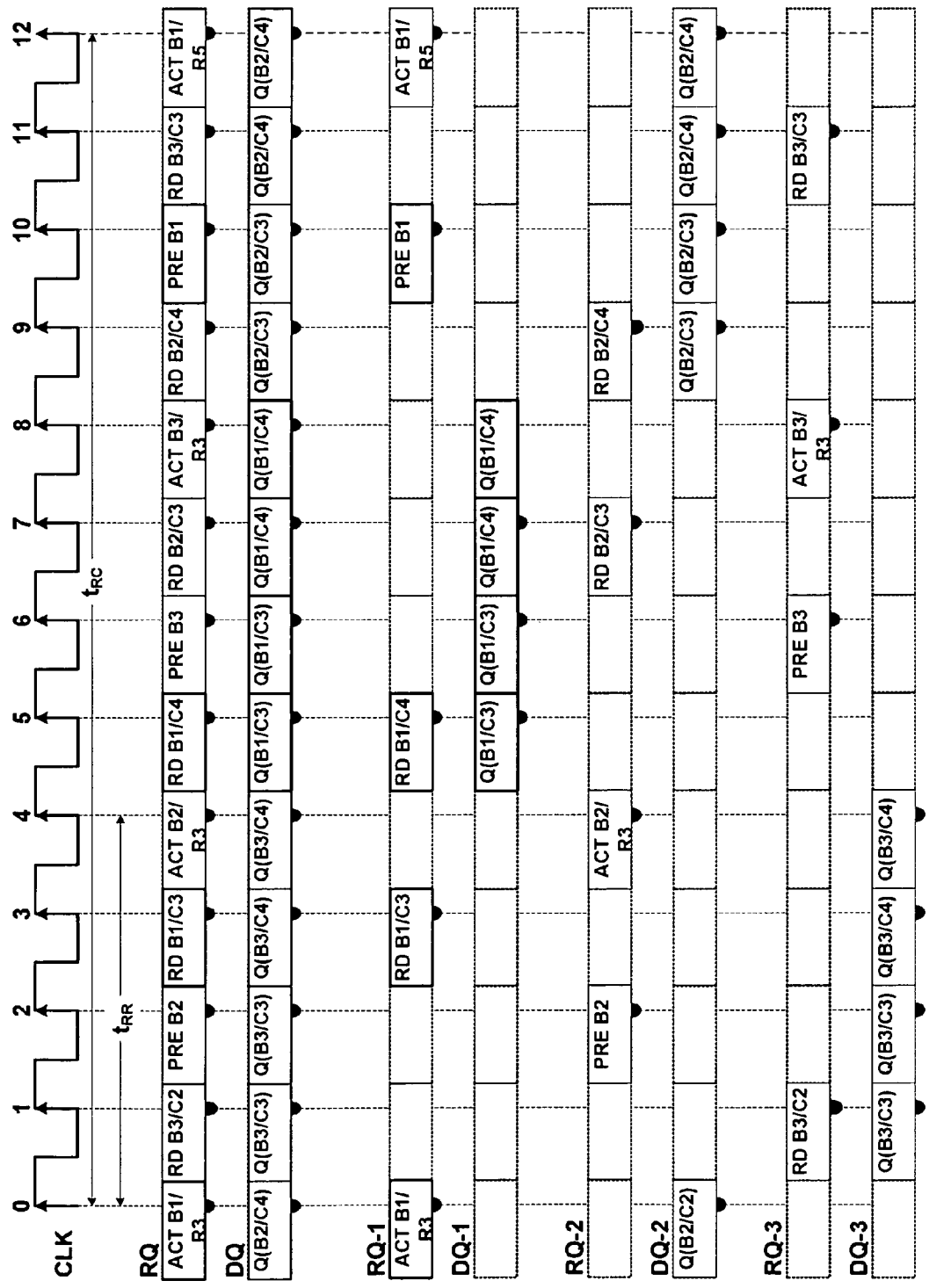
FIG. 4 (prior art) illustrates a sequence of interleaved (pipelined) read transactions.
Figure 5:
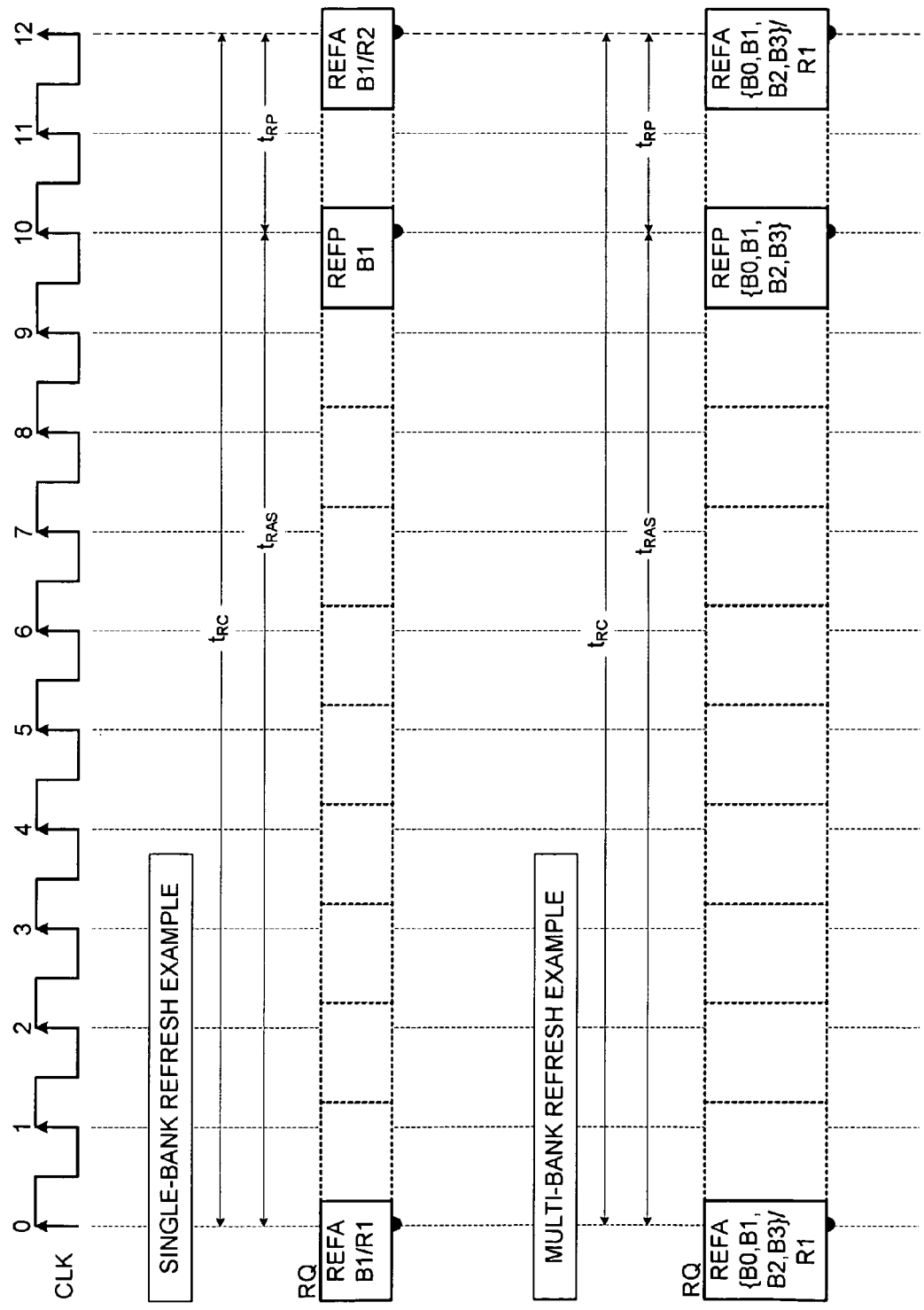
FIG. 5 (prior art) is a waveform diagram illustrating single- and multi-bank refresh transactions.
Figure 6:
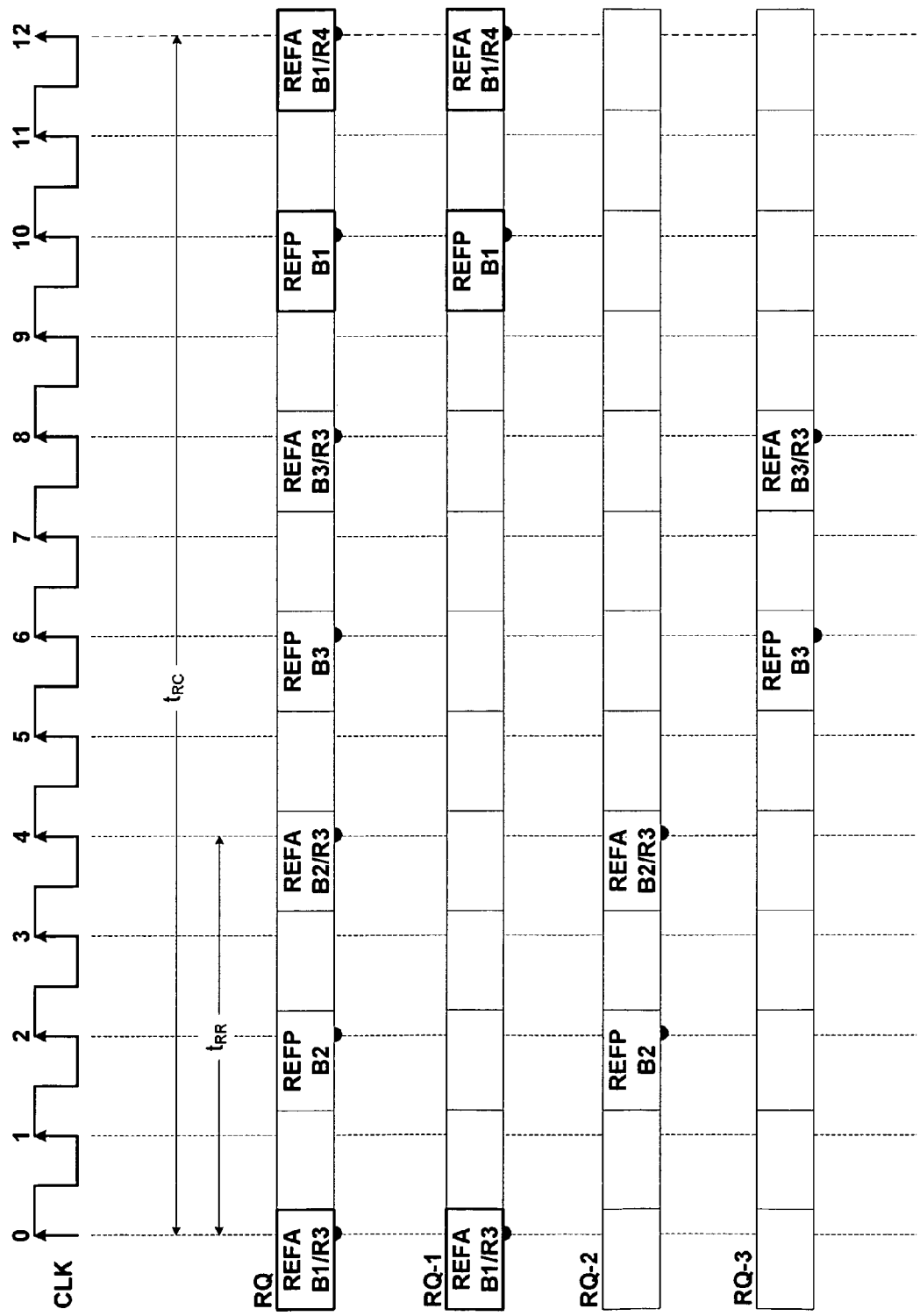
FIG. 6 (prior art) illustrates a sequence of interleaved (pipelined) single-bank refresh transactions.
Figure 7:
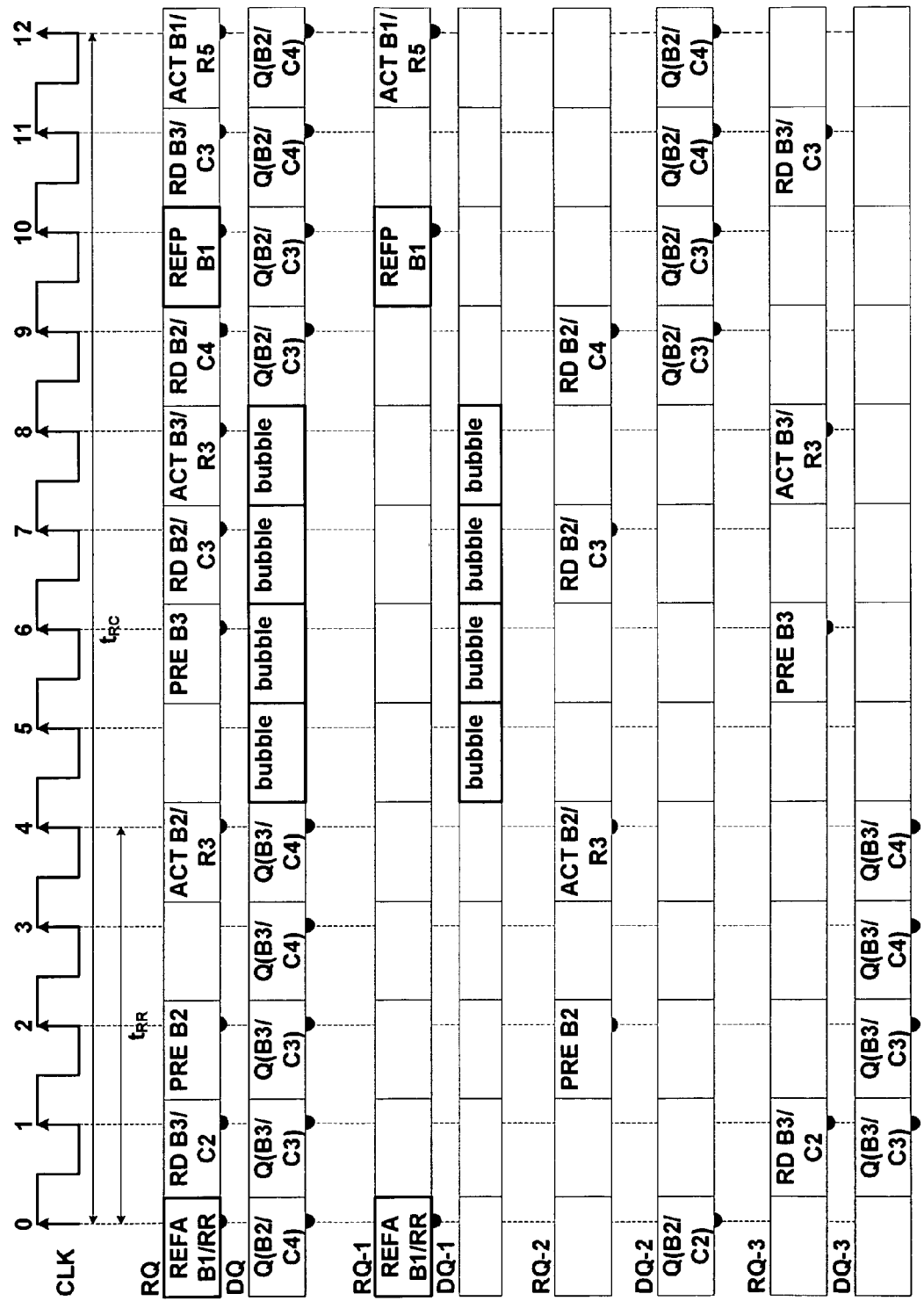
FIG. 7 (prior art) shows the interleaved read transaction example from FIG. 4 with one single-bank refresh transaction interspersed.
Figure 8:
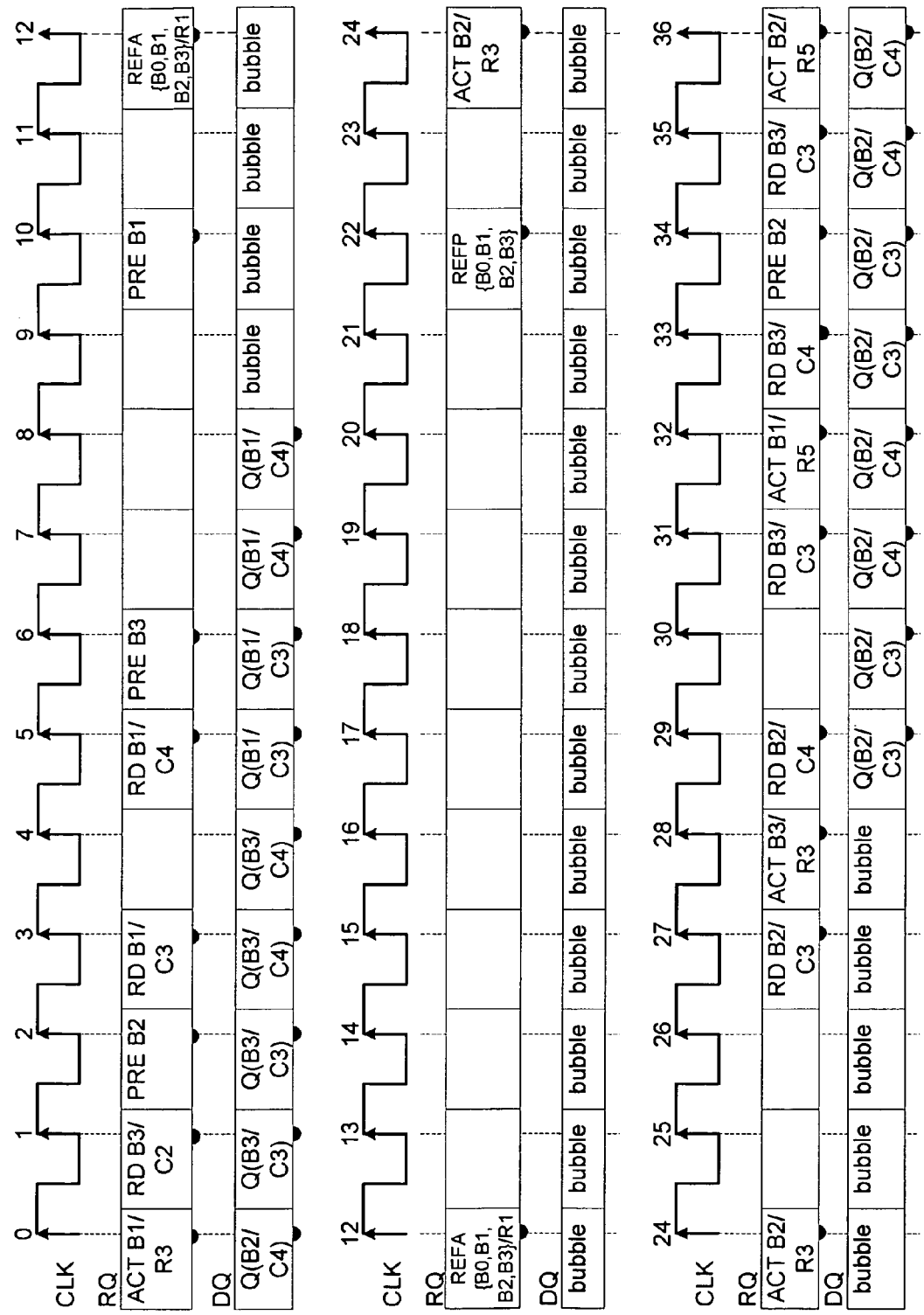
FIG. 8 (Prior Art) illustrates the interleaved read transaction sequence of FIG. 4, but with a single burst refresh transaction inserted at edge 12.
Figure 9:
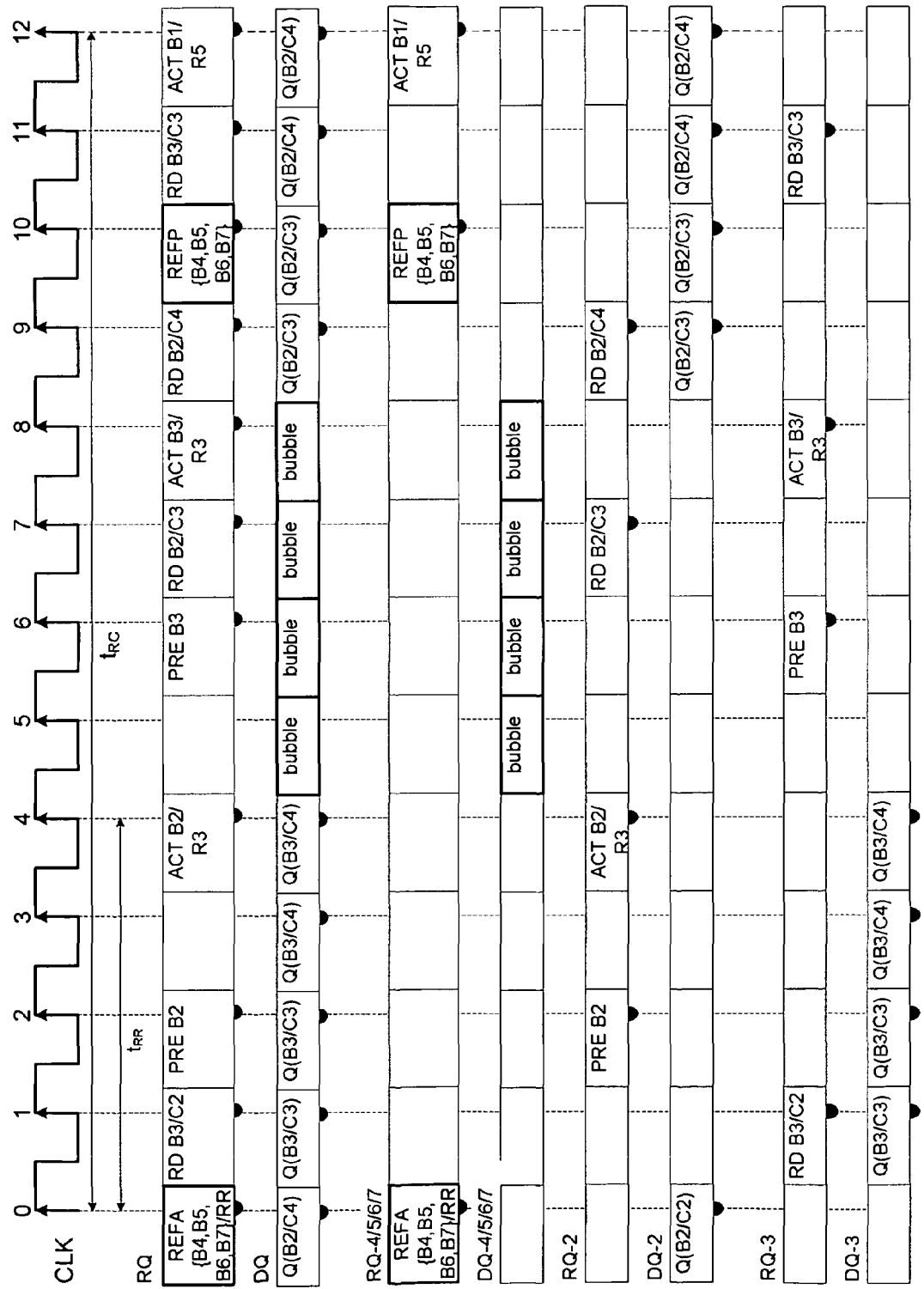
FIG. 9 (prior art) illustrates another example of multi-bank refresh.

A second reason for using the ROWP packet to support simultaneous data-access and refresh commands is that precharge commands PRE are issued frequently. In the example of interleaved read transactions in FIG. 4, a ROWP command is issued every four cycles (matching the $t_{RR}$ interval). This scenario provides plenty of opportunities to insert refresh commands. As mentioned earlier, a typical memory of today would only need to use one out of every twenty-five possible simultaneous refresh slots to keep the storage cells refreshed.

Each packet format includes a delay field. The DELA and DELC fields permit an ACT command and RD or WR commands to be delayed by 0 or 1 cycle before execution by the memory component. The POP1..0 field permits a PRE command to be delayed by from zero to three cycles before execution. These fields permit the ROWA, COL, and ROWP packets to be efficiently slotted at the RQ interface of the memory component, regardless of the exact value of the various timing parameters that determine the separation of the request packets ($t_{RCD}$, $t_{CC}$, $t_{RDP}$, $t_{WRP}$, and $t_{RP}$).

A delay field is also present in the RA7,6 bits of the ROWP packet, permitting the REFA, REFI, and REFP commands to be delayed by from zero to three cycles before being executed by the memory component. One reason for this delay field is to satisfy the value of the various timing parameters that determine the separation of the request packets with refresh commands ($t_{RAS}$ and $t_{RP}$). This could be required because the ROWP packets could already be satisfying timing constraints imposed by ongoing read or write transactions (for the PRE commands). However, a more important reason for the RA7,6 delay field is that it permits the refresh-activate and refresh-precharge operations to be overlaid exactly on an activate or precharge operation from an ongoing read or write transaction. This alignment can prevent a current supply pulse from a refresh-activate operation from interfering with an activate operation, and vice versa. With the delay feature, the synchronized, combined current supply pulse from a refresh-activate operation (from a simultaneous refresh transaction) and an activate operation (from an ongoing read or write transaction) will be comparable to the current supply pulse for a multi-bank refresh of two banks.

Figure 10E:
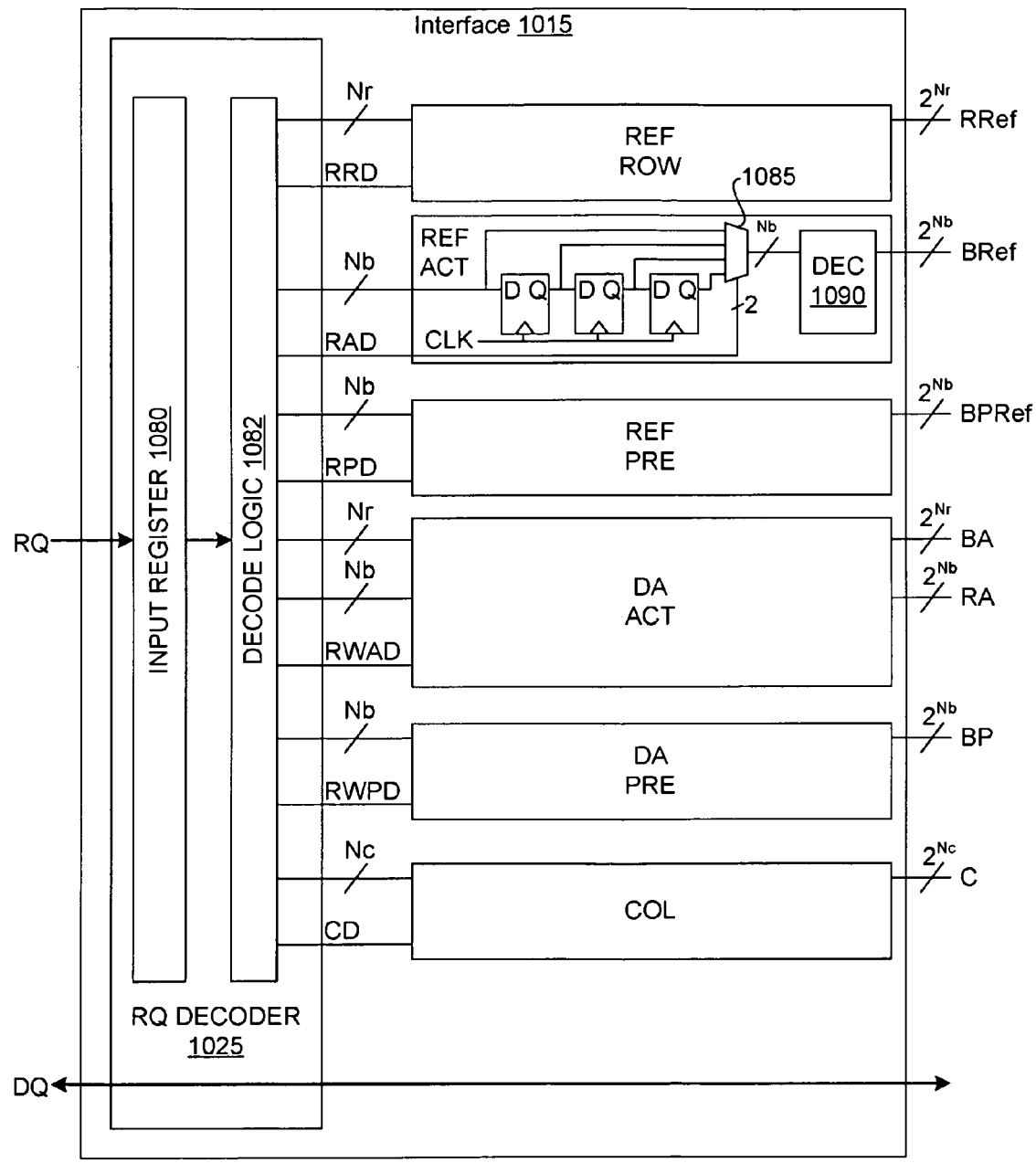
FIG. 10E details an embodiment of interface 1015 of FIGS. 10A and 10B.

FIG. 10E details an embodiment of interface 1015 of FIGS. 10A and 10B, including request decoder 1025 and the six data-access and refresh control registers. The depicted embodiment supports delay features introduced above.

Request decoder 1025 includes an input register 1080 and some decode logic 1082. Decode logic 1082 extracts address and delay information from commands in register 1080 and passes that information to appropriate ones of the data-access and refresh registers.

Each data-access and refresh register is adapted to introduce some measure of delay, as directed by decode logic 1082. The data-access and refresh registers and their respective inputs are:

REF-ROW: The refresh-row register receives Nr row address bits and a two-bit refresh-row-delay signal RRD controlling the number of clock cycles of delay;

REF-ACT: The refresh-activate register receives Nb bank address bits and a two-bit refresh-activate-delay signal RAD controlling the number of clock cycles of delay;

REF-PRE: The refresh-precharge register receives Nb bank address bits and a two-bit refresh-precharge-delay signal RPD controlling the number of clock cycles of delay;

DA-ACT: The data-access activate register receives Nr row address bits, Nb bank address bits, and a one-bit read/write-activate-delay signal RWAD controlling the number of clock cycles of delay;

DA-PRE: The data-access precharge register receives Nb bank address bits and a two-bit read/write-precharge-delay signal RWPD controlling the number of clock cycles of delay; and COL: The column register receives Nc column address bits and a one-bit column-address delay signal CD controlling the number of clock cycles of delay.

Each of the foregoing registers is, in this embodiment, a configurable delay register. Register REF-ACT, detailed to illustrate the workings of one embodiment of a configurable delay register, includes three sub-registers, each imposing one clock cycle of delay. Nb bank address lines connect through the three sub-registers and a multiplexer 1085 to a decoder 1090. Based on the control signals on lines RAD, multiplexer 1085 selects zero, one, two, or three clock delays and provides the resulting bank address signals to decoder 1090. Decoder 1090 decodes the Nb-bit signal to $2^{Nb}$ bank select lines, each of which connects to a precharge terminal of a corresponding memory bank. The remaining data-access and refresh registers are similarly constructed to produce either two or four possible increments of delay, as indicated in the foregoing list.

Figure 13A:
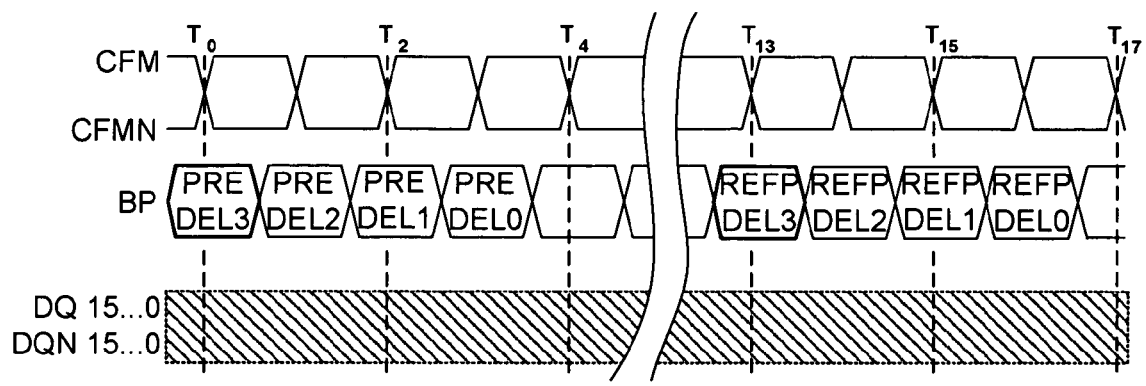
FIGS. 13A and 13B show examples of the use of delay fields.
Figure 13B:
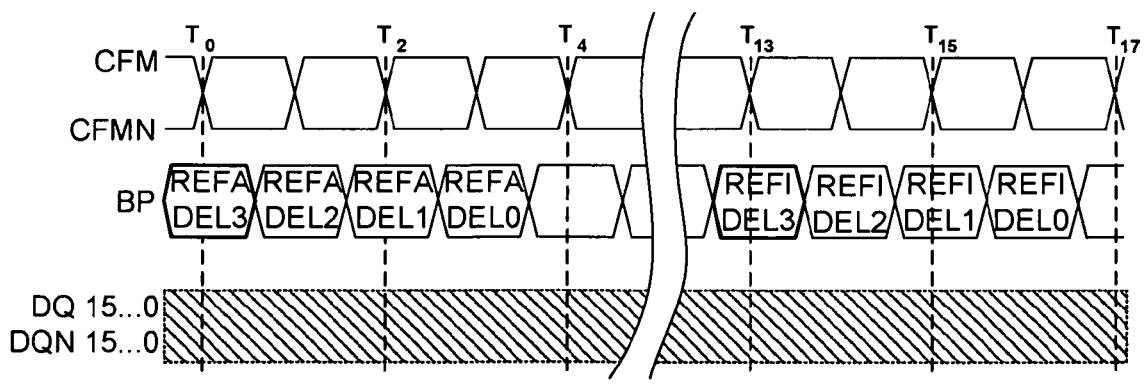

FIGS. 13A and 13B show examples of how delay fields are used in some embodiments. In FIG. 13A, a ROWP packet with a PRE command is present at cycle T0. The DEL field (POP[1:0]) is set to "11," a binary three, which provides a delay of zero clock cycles. This request packet is equivalent to a ROWP packet with a PRE command at cycle T1 and the delay field set to "10," a ROWP packet with a PRE command at cycle T2 and the delay field set to "01," or a ROWP packet with a PRE command at cycle T3 and the delay filed set to "00." The equivalent packets are depicted adjacent one another. This equivalence should be used when analyzing request packet interactions.

To the right of FIG. 13A, a ROWP packet with a REFP command is present at cycle T13. The DEL field (RA[7:6]) is set to "11." This request packet will be equivalent to a ROWP packet with a REFP command at cycle T14 and the delay field set to "10," a ROWP packet with a REFP command at cycle T15 and the delay field set to "01," or a ROWP packet with a REFP command at cycle T16 and the delay field set to "00."

The left and right sides of FIG. 13B respectively depict equivalent packets for the REFA and REFI commands. The REFA and REFI commands are essentially identical to the example just described for the REFP command; a discussion of the delay function of the REFA and REFI commands is therefore omitted for brevity.

Returning to FIG. 13A, the ROWP packet specifies two independent transactions. A PRE precharge command uses the POP and BP fields, and the REFP, REFA, or REFI commands use the ROP and RA fields. Both transactions have an optional delay field (the POP field for the PRE command and the RA field with the REFP, REFA, or REFI commands). The two delay mechanisms are independent of one another: the POP field does not affect the timing of the REFP, REFA, or REFI commands, and the RA field does not affect the timing of the PRE command.

When the interactions of a ROWP packet are analyzed, there are two independent commands specified, both of which may affect how soon the next request packet will issue. The constraints from both commands in a ROWP packet are considered, and the memory controller issues the command requiring the longer time interval to the next request packet. Furthermore, the two commands within a ROWP packet should not reference the same bank in the BP and RA fields.

There are four refresh commands, including the refresh-activate REFA command and the refresh-precharge command REFP discussed above. The other two refresh commands control the contents of the refresh-row register (e.g., register REF-ROW of FIGS. 10A and 10B). The first of these two commands, load-refresh row LRR, loads the RA7..0 field of the ROWP packet into sub-fields of register REF-ROW to specify a row address for refresh. The second command, refresh increment REFI, is a refresh activate command like REFA but additionally increments register REF-ROW after the refresh-activate operation. The REFI and LRR commands support some of the simultaneous refresh optimizations described above.

Figure 14A:
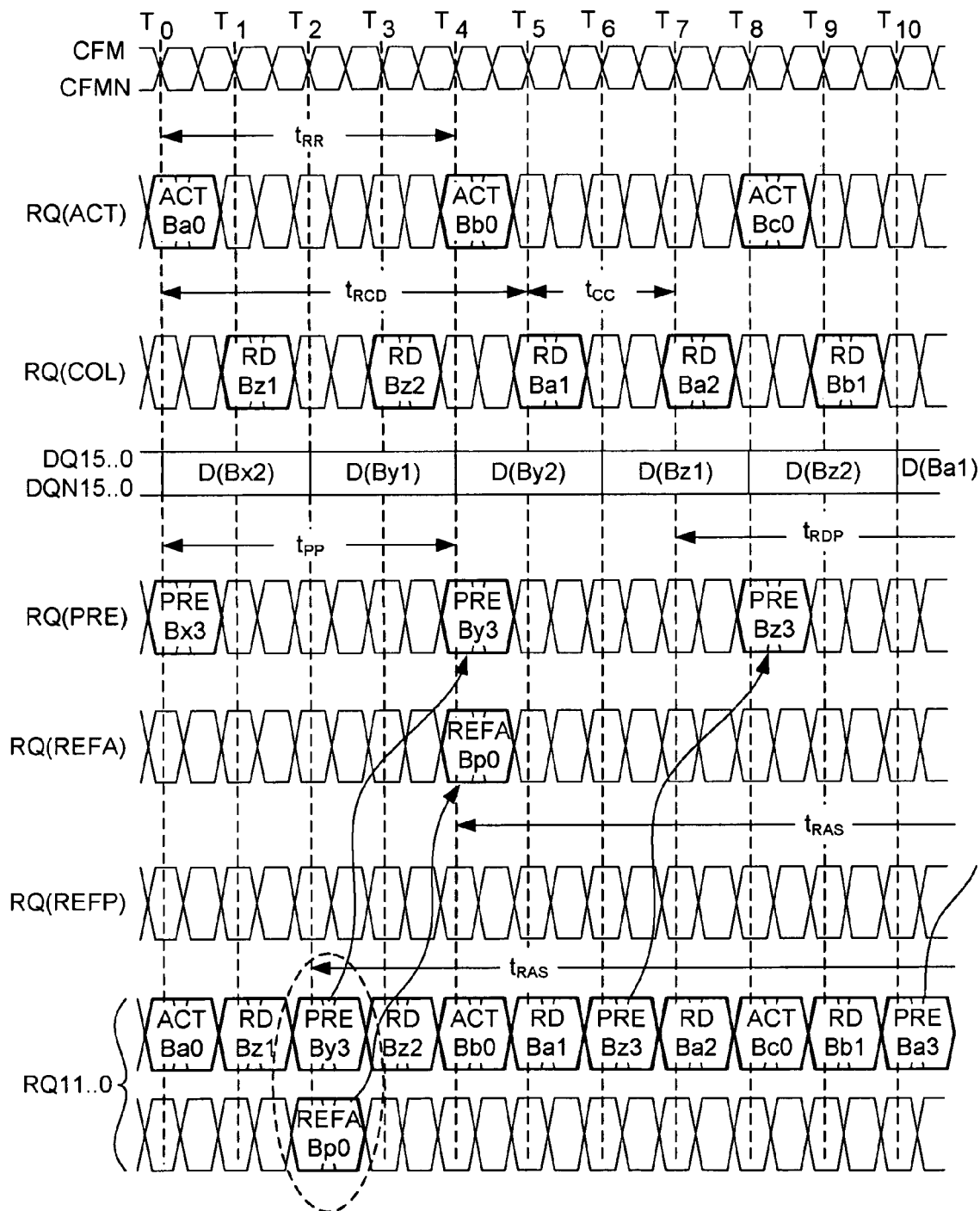
FIGS. 14A and 14B collectively show an example of the use of simultaneous refresh transactions in accordance with one embodiment of the invention.
Figure 14B:
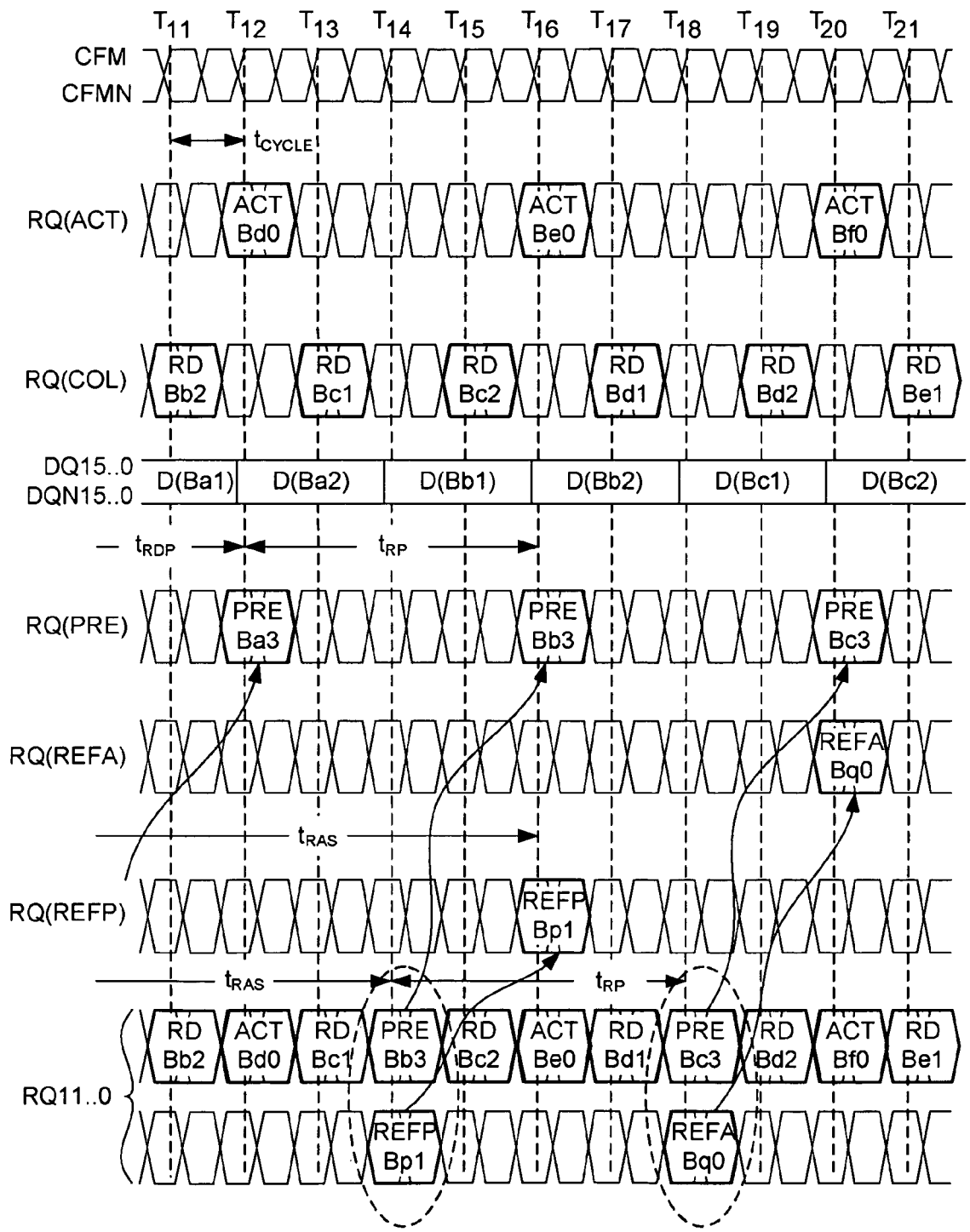

FIGS. 14A and 14B collectively show an example of the use of simultaneous refresh transactions in accordance with one embodiment (a key 1400 at the bottom of FIG. 14A shows how FIGS. 14A and 14B fit together). This example depicts a continuous background of interleaved read transactions directed to appropriate banks to avoid bank conflicts. It is assumed that the controller is pursuing a "closed-bank policy"; that is, each transaction will activate a closed bank, perform a read transfer, and precharge the bank to leave it closed.

The illustrated transactions of FIGS. 14A and 14B are defined in the following table:

TABLE 1

| TRANS | Op. #1 | Op. #2 | Op. #3 | Op. #4 | Restricted Banks |
|---|---|---|---|---|---|
| x: Read Bx, Rx | Bx0 = ACT (Bx, Rx) | Bx1 = RD (Bx, Cx1) | Bx2 = RD (Bx, Cx2) | Bx3 = PRE (Bx) | Bu, Bv, Bw, By, Bz, Ba |
| y: Read By, Ry | By0 = ACT (By, Ry) | By1 = RD (By, Cy1) | By2 = RD (By, Cy2) | By3 = PRE (By) | Bv, Bw, Bx, Bz, Ba, Bb |
| z: Read Bz, Rz | Bz0 = ACT (Bz, Rz) | Bz1 = RD (Bz, Cz1) | Bz2 = RD (Bz, Cz2) | Bz3 = PRE (Bz) | Bw, Bx, By, Ba, Bb, Bc |
| a: Read Ba, Ra | Ba0 = ACT (Ba, Ra) | Ba1 = RD (Ba, Ca1) | Ba2 = RD (Ba, Ca2) | Ba3 = PRE (Ba) | Bx, By, Bz, Bb, Bc, Bd |
| b: Read Bb, Rb | Bb0 = ACT (Bb, Rb) | Bb1 = RD (Bb, Cb1) | Bb2 = RD (Bb, Cb2) | Bb3 = PRE (Bb) | By, Bz, Ba, Bc, Bd, Be |
| c: Read Bc, Rc | Bc0 = ACT (Bc, Rc) | Bc1 = RD (Bc, Cc1) | Bc2 = RD (Bc, Cc2) | Bc3 = PRE (Bc) | Bz, Ba, Bb, Bd, Be, Bf |
| d: Read Bd, Rd | Bd0 = ACT (Bd, Rd) | Bd1 = RD (Bd, Cd1) | Bd2 = RD (Bd, Cd2) | Bd3 = PRE (Bd) | Ba, Bb, Bc, Be, Bf, Bg |
| e: Read Be, Re | Be0 = ACT (Be, Re) | Be1 = RD (Be, Ce1) | Be2 = RD (Be, Ce2) | Be3 = PRE (Be) | Bb, Bc, Bd, Bf, Bg, Bh |
| f: Read Bf, Rf | Bf0 = ACT (Bf, Rf) | Bf1 = RD (Bf, Cf1) | Bf2 = RD (Bf, Cf2) | Bf3 = PRE (Bf) | Bc, Bd, Be, Bg, Bh, Bi |
| ... | ... | ... | ... | ... | ... |
| p: Refresh Bp | Bp0 = REFA (Bp) | Bp1 = REFP (Bp) | | | Bx, By, Bz, Ba, Bb, Bc, Bd |
| q: Refresh Bq | Bp0 = REFA (Bq) | Bp1 = REFP (Bq) | | | Bc, Bd, Be, Bf, Bg, Bh, Bi |

The transactions of Table 1 and FIGS. 14A and 14B assume a memory of eight or more banks (but the timing examples shown could work with as few as five banks). The bank labels in the example are symbolic (Ba through Bz), with each symbolic bank having a different address than the three previous banks and three subsequent banks. Each symbolic bank must also be different than a bank used for a simultaneous refresh. For example, in the first line of the table, bank Bx must not have the same value (address) as banks Bu, Bv, Bw, By, Bz, or Ba. However, it is permissible for Bu to be the same bank as By, since they will not be used in the same $t_{RC}$ interval. For ease of illustration, each bank and row accessed is named for the transaction responsible for the access, and the types of transactions are limited to read and refresh. For example, the fourth row of Table 1 relates to a read transaction "a" in which two columns Ca1 and Ca2 from row Ra of bank Ba are read. The first operation of the read transaction for bank Ba (i.e., Ba0) is an activate operation ACT(Ba,Ra) that activates row Ra of Bank Ba; the second operation of read transaction a (i.e., Ba1) is a read operation RD(Ba,Ca1) directed to bank Ba, column Ca1; the third operation of read transaction a (i.e., Ba2) is a second read operation RD(Ba,Ca2) directed to bank Ba, column Ca2; and the fourth operation of read transaction a (i.e., Ba3) is a precharge operation PRE(Ba) directed to bank Ba. To avoid access contention, banks Bx, By, Bz, Bb, Bc, and Bd (which are used during read transaction a) must be different than bank Ba. The remaining transactions b through z are formatted analogously in Table 1.

FIGS. 14A and 14B illustrate the timing of a subset of transactions of Table 1, including transaction a, the read transaction to bank Ba outlined in the preceding paragraph. The first operation of this transaction is the activate operation ACT Ba0 initiated at time $T_0$. The second and third operations are read operations RD Ba1 and RD Ba2 at respective times $T_5$ and $T_7$. The final operation of transaction a is a precharge operation PRE Ba3 at time $T_{12}$.

Table 1 also illustrates a pair of refresh transactions p and q. For Refresh p, the first operation is a refresh-activate operation REFA(Bq) directed to bank q, and the second operation is a refresh-precharge operation REFP(Bq) directed to the same bank. To avoid access contention, banks Bx, By, Bz, Ba, Bb, Bc, Bd (which are used during the refresh p transaction) must be different from bank Bp. Refresh transaction q has a similar bank restriction issue.

The examples of Table 1 and FIGS. 14A and 14B utilize every available timing slot on the DQ and RQ interfaces. However, there is a refresh solution for this heavily utilized memory system that does not degrade performance. The ROWP packet is adapted to issue a combined memory command that includes a data-access precharge command and either a refresh-activate or refresh-precharge command. Also, a refresh transaction does not require any timing slots on the DQ interface. As a result, there is an RQ slot during each ROWP packet (one out of every four RQ packets) available for refresh. The available timing slots offer far more control bandwidth than is needed for refresh, so it is not necessary to interleave successive refresh transactions (although embodiments of the invention would permit this, if desired).

The waveform RQ11..0 at the bottom of FIG. 14A illustrates the timing of requests arriving on request interface RQ, from controller 1005 of FIG. 10, for example. As noted above in connection with FIG. 1C, requests on interface RQ can be delayed a number of clock cycles. The preceding request waveforms—RQ(ACT), RQ(COL), RQ(PRE), RQ(REFA), and RQ(REFP)—illustrate the "effective" timing of the requests on lines RQ11..0, factoring in any delays associated with the various commands.

Referring to waveform RQ11..0, the memory controller places a REFA command directed to bank Bp (REFA Bp0) along with a precharge command directed to bank By (PRE By3) in the ROWP packet on cycle T2 and conveys the resulting combined command on request lines RQ11..0. A time $t_{RAS}$ later, the controller places a REFP command directed to bank Bp (REFP Bp1) along with another precharge command (PRE Bb3) in the ROWP packet that is cycled on cycle T14. A time $t_{RP}$ later, the controller places another REFA command in the ROWP packet cycled on cycle T18. A refresh transaction will therefore be scheduled concurrently with seven interleaved read transactions. The refreshed bank (bank Bp in the example) is not one of the banks involved in the interleaved read transactions (Bx, By, Bz, Ba, Bb, Bc, and Bd in the example) with which the refresh interval $t_{RC}$ overlaps.

Note that the REFA and REFP commands use the delay field in the ROWP packets and are supported by registers REF-ACT and REF-PRE. The delay values selected are two cycles in this example, the same as the delay of the PRE commands in the same ROWP packets. These values are selected so the REFA commands are executed in the same cycle as a ACT command for an interleaved read transaction. Likewise, the REFP commands are executed in the same cycle as a PRE command for an interleaved read transaction. By aligning a refresh transaction with one of the interleaved read transactions, the refresh transaction overlaps seven read transactions and not eight, and thus ensures there will be a bank available to refresh. In an actual implementation, a controller managing a request stream may introduce delays in the request stream to account for write-read turnaround and for bank conflicts. The controller may also be dealing with a page policy in which some pages are left open and some are left closed. As a result, a simultaneous refresh transaction may overlap fewer than seven other transactions.

Assuming an embodiment of system 1000 of FIG. 10A in which the ratio of $T_{RC}$ to $T_{RR}$ is four (i.e., $T_{RC}/T_{RR}=4$), transaction queue 1040 keeps track of the last three transactions issued and the next four transactions. The transaction depths of three and four assume a closed-page policy; an open-page policy or a mixed-page policy would have some differences. Knowing what banks the last three and the next four transactions will use, controller 1005 can schedule a simultaneous refresh transaction to an unused bank. This simultaneous refresh transaction requires no overhead because the simultaneous refresh transaction will use the available ROP and RA fields of the ROWP packets that are being issued with the transactions.

The optional refresh memory 1070 (FIG. 10B) tracks which banks have been refreshed with the current row value in register REF-ROW. Because a simultaneous refresh transaction is issued once in approximately every hundred read/write transactions, there are many opportunities to refresh all the banks before updating the current row value. As a last resort, the controller can delay read/write transactions to refresh a bank that is being heavily utilized.

The ROP and RA fields of the ROWP packet can issue LRR commands to load register REF-ROW with an arbitrary value. This permits controller 1005 to refresh many rows in one set of banks while data-access requests take place to the remaining banks. This embodiment benefits from additional tracking structures, such as refresh memory 1070, to keep track of which rows of which banks have been refreshed.

Additional Command-Scheduling Embodiments

As noted above, memory controllers in accordance with some embodiments issue commands that include delay information, typically a delay value. Multiple commands can thus be queued for execution within a memory component receiving the commands.

Delay information associated with a given command can be used to determine an amount of delay in a number of ways. For example, the amount of delay may be directly encoded, where the amount of delay corresponds to the value, or the value can be used as an index into a storage entity, which may be programmable or non-programmable (e.g., fixed), such as registers or a lookup table, containing the delay values representative of amounts of delay. Alternatively, some amount of delay may be directly encoded, while another amount of delay for the same command may be obtained by reference to a storage entity, which may be programmable or non-programmable. In addition, a command may be associated with a separate delay register, which may be programmable or non-programmable, to provide an additional fixed delay to every command. By issuing delay information with a command, the amount of delay may be changed dynamically, as frequently as once per command issued.

In some cases, a minimum granularity of external bus clock cycles applies to the timing of the issuance of commands over an external bus. A device coupled to an external bus may require several clock cycles to complete performance of a command. The time required to complete performance of a command may not coincide precisely with the minimum temporal granularity for issuance of commands over the external bus. In such a situation, one or more clock cycles may be lost until all of the conditions of the system are satisfied so that a new command may be issued and performed. Embodiments of the invention may be used to overcome such problems, avoiding lost clock cycles and improving system efficiency and performance characteristics.

Another example is where two or more devices (DRAMs) are coupled to a single command bus. Commands take one or more clock cycles to transmit. A situation may arise, for example, where, for optimal system performance, an ACT directed to a first device and a READ directed to a second device should be transmitted by the controller at the same time (i.e., within the same clock cycle). Transmitting either earlier would violate a timing parameter of the respective device. Transmitting either later would impair performance. In accordance with various embodiments of the invention, one of the commands can be transmitted earlier, and the execution of that command will be delayed by the corresponding device. Thus, both devices will execute their respective commands at the same time, thereby providing optimal system performance, even though the commands were transmitted at different times.

Various embodiments of the invention may be applied to reordering commands. The earlier of two commands can be assigned a delay value much greater than the later of the commands, resulting in a DRAM executing the second command first, and the first command later. This can provide flexibility in systems where the command issue order is constrained in the controller or where some commands can be pre-empted or cancelled by later commands. Thus, the ability to schedule commands so as to overcome limitations in command bus bandwidth or in the manner in which commands are pipelined in a device is provided. Performance may be optimized for minimal latency, maximal effective bandwidth, or some other desirable characteristic that may be achieved through the use of different command timing relationships, for example, depending upon system load and configuration.

In accordance with other embodiments, additional information is transmitted from a controller to a memory component, wherein the additional information is associated with a command to the component. The information relates to a delay period from the time the command is received by the component until the time the command is executed by the component. The information may be directly representative of a delay value, or may be used to obtain a delay value indirectly, for example, if used as an index to a fixed or programmable on-chip delay table. The delay value can be denominated in any meaningful manner, for example in standardized units of time, such as nanoseconds, or in clock cycles. For example, it can be any integer multiple or sub-multiple (e.g., 4, 2, 1, ½, ¼, etc.) of a clock, such as an external clock provided to the device.

In addition to an amount of delay derived either directly or indirectly from the additional information transmitted from the controller to the memory component, one or more on-chip registers in the component may be used to add amounts of fixed delay and increase the delay period. Such on-chip registers may be configured to add delay under certain conditions or independent of those conditions. For example, the on-chip registers may be used to increase the delay period in the same or different amounts for one or more specific command types. A mode register may be provided to store information relating to a mode of the device, and such a mode register may be used to enable and disable amounts of fixed delay such as those provided based on values stored in one or more fixed delay registers. Although the term "fixed delay" is used, it is understood that such fixed delay may be set when a device is manufactured or before it is used in normal operation (for example, upon application of power to the device), but that the fixed delay remains relatively fixed thereafter and does not change on a per-command basis.

The memory component queues the commands it receives in a command queue until their scheduled performance time. Other information associated with a given command (e.g., an address) may also be queued so as to be available at the scheduled performance time.

A precedence mechanism, such as conflict-check circuit 1050 of FIG. 10, may be required to avoid scheduling conflicts. As one example, the precedence mechanism may provide that the first command received is executed first. As another example, the precedence mechanism may provide that the last command received is executed first. As yet another example, priority information may be provided. Priority information is associated with the commands and used to determine the actual performance times of command and, accordingly, may be used to overcome scheduling conflicts.

Figure 15:
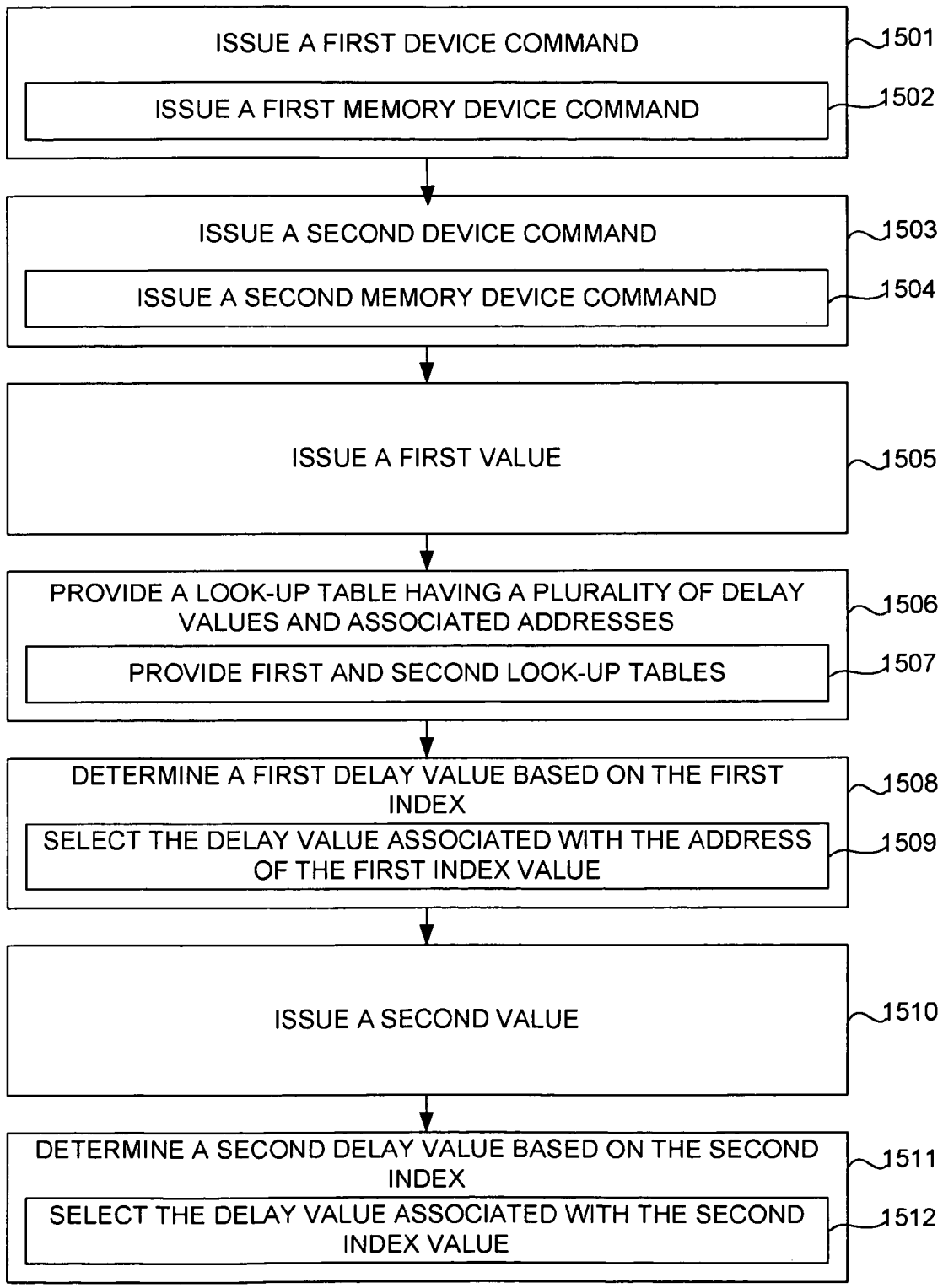
FIG. 15 is a flow diagram illustrating a method for scheduling a device command in accordance with an embodiment of the invention.

FIG. 15 is a flow diagram illustrating a method for scheduling a device command in accordance with an embodiment of the invention. The method begins in step 1501, where a first device command is issued. If the device is a memory device (e.g., a memory component), step 1501 comprises step 1502, where a first memory device command is issued, and the first performance time is a time at which the first memory device command is to be performed. In step 1503, a second device command is issued. If the device is a memory device, step 1503 comprises step 1504, where a second memory device command is issued, and the second performance time is a time at which the first memory device command is to be performed. In step 1505, a first value is issued, which may, for example, be a first index value or a first delay value. If the device is a memory device, the first value is communicated from a memory device controller to a first memory device. The first value determines, at least in part, a first performance time at which the first device command is to be performed. The second value determines, at least in part, a second performance time at which the second device command is to be performed. Other factors, such as intrinsic delays in the system, which may include propagation delays of output buffers, wires, and/or input buffers, as well as timing uncertainty that is inherent in the system, may also influence the timing of the first performance time.

The first delay value is representative of delay measured in time units or by the passage of one or more events, such as events occurring within the device. For example, the first delay value may be expressed relative to a standardized unit of time or in units of a clock period, such as a case where the first delay value denotes an integer multiple or sub-multiple of a clock period. The first delay value has or connotes a nonzero value, such as a positive (i.e., greater than zero) or negative value (i.e., less than zero).

In step 1506, a look-up table having a plurality of delay values and associated addresses is provided, wherein each of the delay values is associated with one of the addresses and wherein the first index value represents one of the addresses in the look-up table. Step 1506 preferably comprises step 1507. In step 1507, a first look-up table and a second look-up table are provided, wherein the first address is associated with the first look-up table and the second address is associated with the second look-up table. The first and second look-up tables may be separate look-up tables or may be the same. A single look-up table may be used in place of the first and second look-up table. The first and second addresses may be the same address or different addresses.

In step 1508, a first delay value is determined based on the first index. Step 1508 preferably comprises step 1509. In step 1509, the delay value associated with the address of the first index is selected. In step 1510, a second value is issued, wherein the second value determines, at least in part, a second performance time at which the second device command is to be performed. In step 1511, a second delay value based on the second index is determined. The second index preferably represents a second address in the look-up table. Step 1511 preferably comprises step 1512. In step 1512, the delay value associated with second address is selected.

The method may be performed in a variety of different manners. For example, step 1501 and/or 1502 can occur at a first issuance time and step 1505 can occur at a second issuance time. The first and second issuance times may be the same or different. If the first and second issuance times are different, the difference between the first issuance time and the second issuance time is a time gap. The time gap may or may not be predetermined, wherein the time gap is known at or before the first issuance time, or it may or may not be fixed, wherein the time gap remains the same from one command to the next.

A delay occurs between the first issuance time and the first performance time. This delay is determined by the first delay value and an additional delay value. The additional delay value is not necessarily known or fixed. For example, the additional delay value may be influenced by other factors, such as inherent delays in the system or timing uncertainty of the system.

As another example of how the first delay value may be used in the system, a delay between the first issuance time and a first decoding time at which the first memory device command is decoded may be determined by the first delay value and an additional delay value. As yet another example, a delay between a first decoding time at which the first memory device command is decoded and the first performance time at which the first memory device command is performed may be determined by the first delay value and an additional delay value.

As another example of timing relationships in the system, the first performance time may be determined by the first delay value, an additional delay value, and a second delay value, wherein the second delay value is derived from a delay register. The delay register may be programmable or predetermined (i.e., its contents may be programmable or predetermined).

The memory device command referred to above may be, for example, a column access strobe (CAS) command, a precharge command, a row access strobe (RAS) command, a refresh command, a command including the functionality of a refresh command and a RAS command, a command including the functionality of a refresh command and a pre-charge command, a mode register operation command, a power mode command, or another command.

As an example of how a memory device command may be processed, a first parameter associated with the first memory device command may be queued until the first performance time. Such a first parameter may, for example, comprise a memory address or data to be stored in the first memory device.

If a first device command and a second device command are issued, the step of issuing the first memory device command occurs at a first issuance time, the step of issuing the first value occurs at a second issuance time, the step of issuing the second memory device command occurs at a third issuance time, and the step of issuing the second value occurs at a fourth issuance time. The first issuance time may be the same as or different than the second issuance time; and the third issuance time may be the same as or different from the fourth issuance time. A first difference between the first issuance time and the second issuance time may or may not be of equal duration to a second difference between the third issuance time and the fourth issuance time. In one example, the first difference is known at or before the first issuance time.

The first value may be a first delay value, and the second value may be a second delay value. Alternatively, the first value may be a first index value, and the second value may be a second index value. As another alternative, the first value may be a delay value, and the second value may be an index value. As yet another alternative, the first value may be an index value, and the second value may be a delay value. The second delay value may be the same as or different than the first delay value. The second index value may be the same as or different than the first index value. A delay value (for example, the first value or the second value) may be different from a delay derived from an index value (for example, the second value or the first value, respectively). The first performance time may occur before or after the second performance time.

The first memory device command may be a precharge command, a row access strobe (RAS) command, a refresh command, a command providing the functionality of a refresh command and a RAS command, a command comprising the functionality of a refresh command and a pre-charge command, a mode register operation command, a power mode command, or another command.

In some situations, system performance may be optimized if a first device command is performed by a first device, such as a first memory device, while a second command is performed by a second device, such as a second memory device. For example, system performance may be optimized in some cases when a first performance time at which the first device is performing the first device command temporally overlaps, wholly or partially, a second performance time at which the second device is performing the second device command. In such situations, a controller may issue the first device command to the first device at a different time than it issues the second device command to the second device, yet, by virtue of the scheduling capability described herein, the controller may schedule the first device to perform the first device command at the same time as the second device is scheduled to perform the second device command.

When a first memory command comprises a first index and a second memory device command comprises a second index, a first temporal value associated with a first performance time at which the first device command is to be performed may be determined based on the first index, and a second temporal value associated with a second performance time at which the second device command is to be performed may be determined based on the second index. The second temporal value may be the same as or different than the first temporal value.

Various techniques may be used to arbitrate between performance of commands that are scheduled to be performed at the same time by the same device. For example, whichever of the first memory device command and the second memory device command is first received at a memory device may be selected to be performed first. As another example, whichever of the first memory device command and the second memory device command is last received at a memory device may be selected to be performed first. As yet another example, if the first memory device command comprises first priority information, and the second memory device command comprises second priority information, the order of performance of the first memory device command and the second memory device command may be determined in accordance with the first priority information and the second priority information. If it is desired for a second memory device command to preempt a first memory device command, the second memory device command can cause reordering of the performance of the first memory device command and the second memory device command, causing the second memory device command (which may have been issued later) to be performed before the first memory device command (which may have been issued earlier). Alternatively, in some situations, it may be appropriate for the second memory device command to cause cancellation of the first memory command. In such situations, even though the first memory device command was issued, the subsequent issuance of the second memory device command before scheduled performance of the first memory device command causes the first memory device command not to be performed. While the foregoing are described in the context of memory device commands, it should be understood that they may be practiced using device commands for devices other than memory devices.

Methods in accordance with the above description may be applied to scheduling commands under a variety of circumstances, for example, when a time gap between issuance of a command and a value associated with that command used for scheduling is fixed, when commands are to be preempted, for example, by being reordered or cancelled, and when commands for multiple devices are scheduled so as to coordinate the timing of operations occurring at these multiple devices and improve system efficiency and performance characteristics.

Besides memory devices, the methods described above may be applied to dynamic scheduling of commands for other types of systems and integrated circuits. For example, a first command of the commands may be used to access data within an integrated circuit device to be communicated to an integrated circuit controller. The first command may be issued by the integrated circuit controller that controls the integrated circuit device. The first command may include a first temporal value that represents a delay until a first performance time at which the first command is to be performed by the integrated circuit device.

Figure 16:
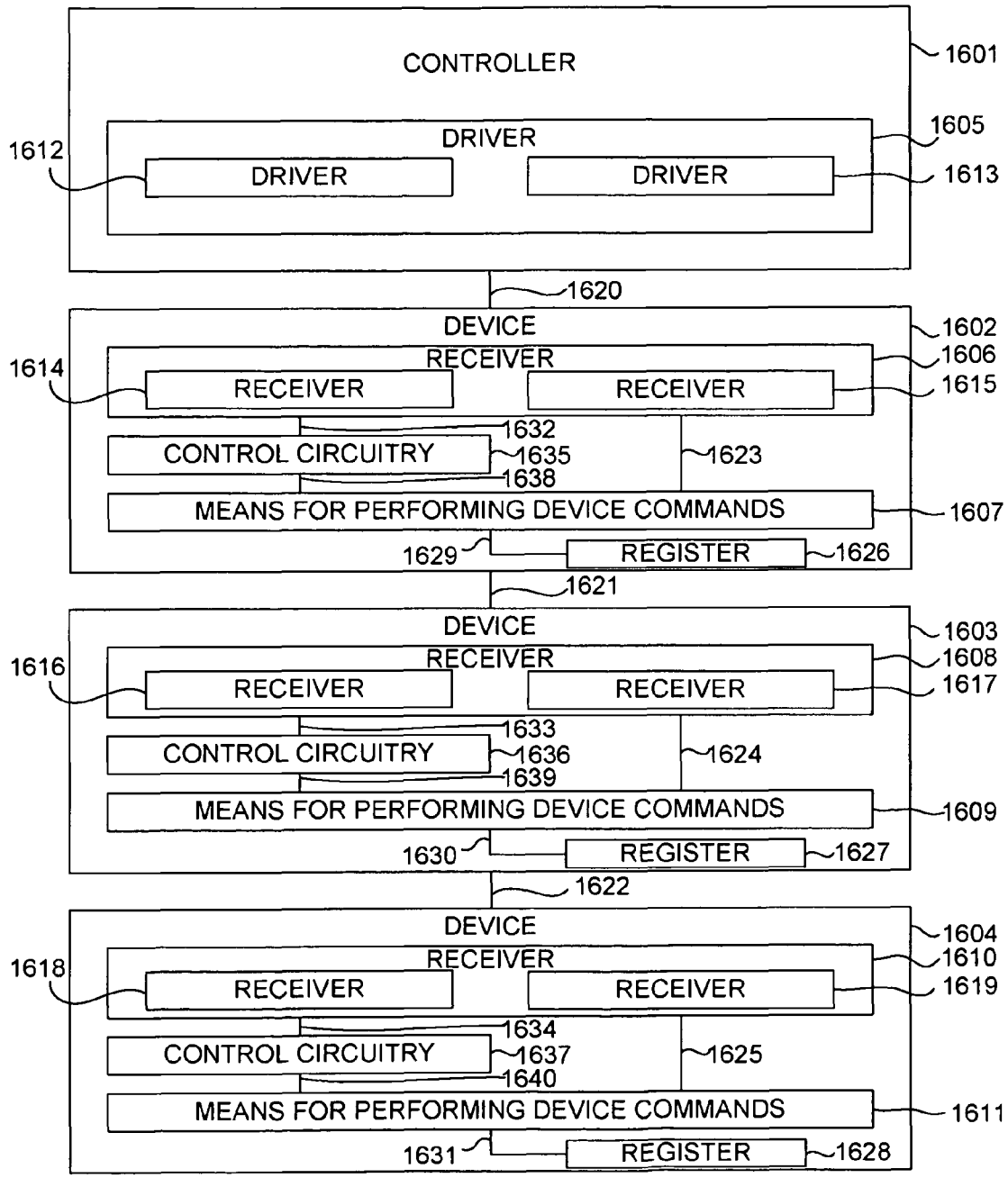
FIG. 16 is a block diagram illustrating a controller for scheduling commands and a device in accordance with an embodiment of the present invention.

FIG. 16 is a block diagram illustrating a controller for scheduling commands and a device in accordance with an embodiment of the present invention. The controller 1601 comprises a driver 1605 for issuing commands and associated non-zero delay values to at least one device 1602 coupled to the controller. A first delay value is associated with a performance time at which the associated command is to be performed by the device. The driver 1605 preferably comprises a first driver 1612 for issuing commands to the device 1602 and a second driver 1613 for issuing delay values to the device 1602. Alternatively, a single driver 1605 may be used to issue both the commands and the delay values. As one example, the controller 1601 may be a memory controller and the device 1602 may be a memory component.

As an example of the operation of such a controller 1601, the driver 1605 that issues commands may issue a first command with a first delay value, wherein the first command has a first performance time, and a second command with a second delay value, wherein the second command has a second performance time. The controller 1601 may determine performance constraints of the device to determine the first performance time and the second performance time. For example, the performance constraints may be dependent upon a physical location of the device 1602 relative to the controller 1601, such as being dependent upon a propagation delay affecting reception of the first command at the device or a propagation delay affecting reception of the data from the device. As another example, the performance constraints are dependent upon a state of the device. As yet another example, the performance constraints are dependent upon an operational speed limitation of the device. As a further example, the performance constraints are dependent upon a difference in timing granularity between an internal bus 1623 of the device and an external bus 1620 coupling the device to the controller. The controller 1601 of FIG. 16 is capable of being used in accordance with the methods described in reference to FIG. 1.

The device 1602 of FIG. 16 comprises a receiver 1606 for receiving a first device command and a first value associated with the first device command (and optionally a second device command and a second value associated with the second device command), means 1607 for performing the first device command at the first performance time and the second device command at the second performance time, and control circuitry 1635 for controlling the means 1607 to cause the means to perform the first device command at the first performance time. A first performance time is associated with the first index and a second performance time is associated with the second index. The device 1602 may or may not be a memory device. If it is, the first device command may be a first memory device command and the second device command may be a second memory device command. The receiver 1606 comprises a first receiver 1614 for receiving the first device command and a second receiver 1615 for receiving the second device command. Optionally, the first receiver 1614 is also for receiving the first index and the second receiver 1615 is also for receiving the second index. As an example, the first and second receivers 1614 and 1615 may be configured to receive the first and second device commands and the first and second indices from the controller 1601, which, in the case of a memory device, is a memory controller. As yet another example, the first receiver 1614 receives the first device command, the second receiver 1615 receives the first value, then the first receiver 1614 receives the second device command, and the second receiver 1615 receives the second value. The receiver 1606 is coupled to the means 1607 for performing device commands by the internal bus 1623. The receiver 1606 is coupled to control circuitry 1635 by the internal bus 1632. The control circuitry 1635 is coupled to the means 1607 by internal bus 1638.

The device 1602 further comprises a register 1626 coupled to the means 1607 for performing device commands and/or the receiver 1606 via internal bus 1629. When the register is used, the first performance time is dependent on the first delay value and an additional delay value derived from a stored value stored in the register. The device 1602 is capable of accepting multiple commands with multiple values from controller 1601. The commands are scheduled in accordance with the values, allowing various temporal relationships between the performance times of the commands to be achieved. For example, the device 1602 may be configured such that the receiver 1606 first receives the first command and the first delay value, then later receives the second command and the second delay value, wherein the device 1602 performs the second command before performing the first command. Buses 1623, 1629, 1632, and/or 1638 may be the same or different buses.

Means 1607 for performing device commands may be of a type well known to those of ordinary skill in the art. For example, if device 1602 is a memory device, means 1607 for performing device commands may comprise circuits of the type typically used for performing memory device commands, such as read commands, write commands, refresh commands, row precharge commands, row access strobe (RAS) commands, mode register operation commands, power mode commands, or commands combining the functionality of several of the foregoing commands, such as a command comprising a refresh command and a RAS command or a command comprising a refresh command and a pre-charge command. Alternatively, for other types of devices, means 1607 for performing device commands may comprise circuits of the type typically used for performing commands in those types of devices, which may include, for example, microprocessors, digital signal processing (DSP) devices, video processing devices, audio processing devices, communication devices, storage devices, memory controllers, input devices, output devices, devices providing both input and output capabilities, and other types of devices.

Control circuitry 1635 comprises circuitry for controlling means 1607 to cause means 1607 to perform a first device command at a first performance time, wherein the first performance time is associated with a first value associated with a first device command received by receiver 1606. For example, when receiver 1606 receives a first device command, receiver 1606 may pass a first value contained in or received with the first device command to control circuitry 1635 or may convert information associated with the first device command into a first value, which receiver 1606 then passes to control circuitry 1635. Control circuitry 1635 then communicates with means 1607 for performing device commands to cause means 1607 to perform the first device command at the first performance time.

Commands to be performed may include commands that result in communication over a data bus of information resulting from the execution of those commands, which may be referred to as data-bus commands, and/or commands that do not result in such communication over the data bus, which may be referred to as non-data-bus commands. Non-data bus commands may involve data bus communication, such as communication of the command from a controller to a device, but communication over a data bus of information resulting from the execution of the command. Examples of non-data-bus commands include precharge commands, recharge commands, and other types of non-data-bus commands. Examples of data-bus commands include commands that result in asserting information onto a data bus, such as a read command, and commands that result in storing information present on a data bus, such as a write command.

Processing of a non-data-bus command includes receiving the command, decoding the command, and executing the command. When a first value is associated with a first device command, a single decoding process may be used for decoding related to the first value and for decoding related to other information, such as the type of device command and the parameters associated therewith other than the first value. As another example, one decoding process may be used for decoding related to the first value, and another decoding process may be used for decoding related to other information. Such decoding processes may occur at the same or overlapping times or at different times. Also, communication of the first value and the first device command may occur together (e.g., at the same time or sequentially consecutive times) or separately (e.g., non-consecutively).

Processing of a data-bus command includes the steps described above in relation to the processing of a non-data-bus command, followed by the step of bus communication of information consequent to the execution of the command. This bus communication occurs after internal processes (i.e., processes that occur internal to the device and do not involve the bus communication activity). Such internal processes include receiving processes and decoding processes, as described above, as well as any internal processes related to preparing a device for the step of bus communication of information consequent to the execution of the command (e.g., processes for executing the command). In the case of a non-data-bus command, such internal processes include processes for receiving, decoding, and executing the command, as described above.

In accordance with embodiments of the invention, a delay in accordance with a value associated with a device command may be provided before the device command is executed. Such a delay may occur before, after, or during a single decoding process or before, after, during, or between multiple decoding processes (e.g., wherein one decoding process relates to decoding a value associated with a performance time and another process relates to decoding other information (e.g., the type of device command and the parameters associated therewith except for the value associated with the performance time). Thus, both execution of the device command may occur after a delay associated with a value associated with a device command has elapsed. For a data-bus command, execution and bus communication activity may occur after a delay associated with a value associated with a device command has elapsed.

A delay in accordance with a value associated with a device command may be provided before all internal processes associated with performance of a device command are completed. For a data-bus command, one or more steps of one or more internal processes that are prerequisite to bus communication of information consequent to execution of the device command may be performed after the delay has occurred. For a non-data-bus command, processing activity may occur in the device after the delay has occurred.

Several periods of time can defined for activities related to processing of a device command. For example, prior to the beginning of the decoding of the device command, a pre-decoding period may be defined. Receiving of the device command at the device occurs during this pre-decoding period. After the beginning of the decoding of the device command and before execution of a device command has been completed, a pre-execution period may be defined. After execution of a device command has been completed, but before bus communication of information consequent to execution of the device command occurs, a post-execution period can be defined. A delay may be provided during one or more of these periods. For example, a delay may be provided during the pre-decoding period or during the pre-execution period. As another example, a first portion of an aggregate amount of delay may be provided during the pre-decoding period and a second portion of the aggregate amount of delay may be provided during the pre-execution period. Alternatively, a portion or all of the delay may be provided during the post-execution period.

While delay may be provided during one or more of the above periods, providing the delay earlier in the processing of a device command can be particularly advantageous. For example, by introducing the delay in the pre-decoding period, both decoding and executing of the device command can be deferred, allowing elements of the device utilized for decoding and executing the device command to be beneficially applied to processing of other device commands. As another example, by introducing the delay in the pre-execution period, some or all of the execution of the device command can be deferred, allowing elements of the device utilized for executing the device command to be beneficially applied to processing of other device commands. Such deferral can be particularly advantageous in situations wherein a device command may be preempted or modified by a subsequently issued device command. For example, if decoding and execution of a device command is deferred until after a time at which that device command is preempted, decoding and execution of that device command can be avoided, freeing the elements of the device utilized for decoding and execution to be beneficially applied to processing of other device commands and improving device performance. Preemption of a device command may include cancellation of the device command and/or replacement of the device command with another device command.

While the foregoing description of FIG. 16 has referred to controller 1601 and receiver 1602 and communication between those elements, it should be understood that controller 1601 may be coupled to multiple devices, including, for example, devices 1603 and 1604. Device 1603 is coupled to external bus 1621, and device 1604 is coupled to external bus 1622. External buses 1621 and 1622 may be different buses than external bus 1620 or they may form a single bus with external bus 1620, either as one contiguous bus or as bus segments carrying information common to both. Device 1603 comprises a receiver 1608, means 1609 for performing device commands, control circuitry 1636 for controlling the means 1609, and one or more registers 1627. Receiver 1608 is coupled to means 1609 via internal bus 1624, and means 1609 is coupled to registers 1627 via internal bus 1630. The receiver 1608 is coupled to the control circuitry 1636 via internal bus 1633. The control circuitry 1636 is coupled to means 1609 for performing device commands via internal bus 1639. Internal buses 1624, 1630, 1633 and/or 1639 may be the same bus or different buses. Receiver 1608 may include receivers 1616 and 1617, wherein receiver 1616 may be used to receive commands from controller 1601 and receiver 1617 may be used to receive values associated with those commands, such as delay values or index values for scheduling the commands. Control circuitry 1636 and means 1609 may be implemented as described above with respect to control circuitry 1635 and means 1607.

Device 1604 comprises a receiver 1610, means 1611 for performing device commands, control circuitry 1637 for controlling the means 1611, and one or more registers 1628. Receiver 1610 is coupled to means 1611 via internal bus 1625, and means 1611 is coupled to registers 1628 via internal bus 1631. The receiver 1610 is coupled to the control circuitry 1637 via internal bus 1634. The control circuitry 1637 is coupled to means 1611 for performing device commands via internal bus 1640. Internal buses 1625, 1631, 1634, and/or 1640 may be the same bus or different buses. Receiver 1610 may include receivers 1618 and 1619, wherein receiver 1618 may be used to receive commands from controller 1601 and receiver 1619 may be used to receive values associated with those commands, such as delay values or index values for scheduling the commands. Control circuitry 1637 and means 1611 may be implemented as described above with respect to control circuitry 1635 and means 1607.

Figure 17:
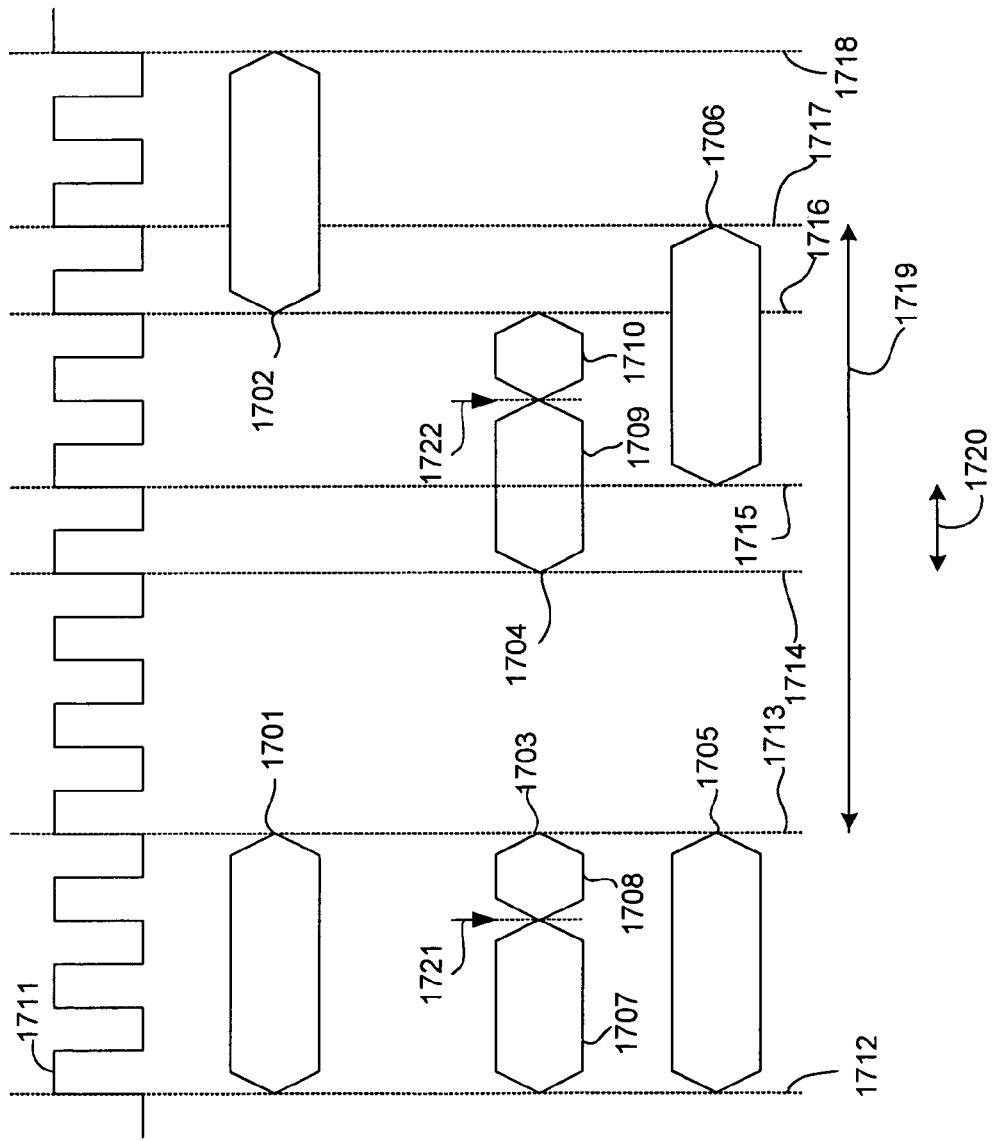
FIG. 17 is a timing diagram illustrating timing relationships, such as issuance times and performance times of commands in accordance with an embodiment of the invention.

FIG. 17 is a timing diagram illustrating timing relationships, such as issuance times and performance times of commands in accordance with an embodiment of the invention. The timing diagram is illustrated with reference to a clock signal 1711, such as a clock used for timing reference for external bus 1620 of FIG. 16. In a first example illustrated in FIG. 17, which does not utilize dynamic scheduling of commands, a first command is issued at time 1712 and performed immediately after issuance at time 1713. Due to system constraints, as illustrated by duration 1719, execution of a second command cannot begin until time 1717. However, due to other system constraints, commands are only issued on integer multiples of clock signal 1711 (in the illustrated example, three clock cycles of clock signal 1711). Since time 1717 does not fall at the end of such a multiple, the second command 1702 is issued at time 1716 such that the end of its transmission coincides with time 1718 at the end of such a multiple. Thus, two clock cycles between time 1717 and time 1718 are lost while waiting to satisfy the system constraints.

However, such loss can be avoided in accordance with the second example, which utilizes dynamic scheduling of commands. In the second example, a first command 1703, which includes command 1707 and value 1708 associated with command 1707. The first command 1703 is issued at a first issuance time 1712, with command 1707 being issued at first issuance time 1712 and value 1708 being issued at a second issuance time 1721. While first command 1703 is illustrated as being queued for performance at time 1713 immediately after issuance (shown as command 1705), it should be understood that the first command 1703 may be scheduled for a different time in accordance with information contained in or referred to by value 1708. As noted above, the system constraints illustrated by duration 1719 prevent performance of a second command until time 1717. However, by scheduling a delay for the performance of the second command 1704 until time 1717, optimal timing for the performance of the second command 1704 can be achieved. The second command 1704 includes command 1709 and value 1710 associated with command 1709. The second command 1704 is issued at time 1714, and the issuance ends at time 1716. Value 1710 specifies scheduling such that command 1709 is queued to begin being decoded at time 1715 and is performed at a second performance time at time 1717. Thus, command 1704 is effectively delayed by a delay value indicated by duration 1720. Thus, precise timing of the performance of commands can be provided even when system constraints limit the ability to control timing of the issuance of commands. It should be noted that, to avoid confusion, other delays, such as propagation delays, as well as other timing concerns, such as set-up and hold time requirements have not been illustrated, but are understood to affect timing relationships in any non-idealized system.

Terminology

The term "signal" refers to a stream of information communicated between two or more points within a system. An analog signal holds information directly as the value of some measured quantity, such as voltage. This value varies continuously over some range. A digital signal also holds information as the value of some measured quantity. However, the allowed values are limited to a set of non-overlapping ranges. Each value range encodes for a symbol. Typically the symbols used are "bits," in which two value ranges represent the "zero" and "one" symbols. Other symbol sets are possible. The measured quantity commonly used to represent the zero and one symbols are voltage levels, although alternatives are possible.

An "interconnect" is the physical medium used by a signal to travel from one point to another. Interconnects typically include one or more conducting wires surrounded by an insulating material, with another conducting sheet or wire to serve as a voltage reference or current return path.

A "system" can consist of discrete integrated components that are mounted on printed circuit boards (PCBs). The components use interconnects constructed from the wire layers within the PCB. A "component" contains interface circuitry that transmits signals onto interconnects. A component also contains interface circuitry that receives signals from the interconnects.

A system can also consist of discrete circuit blocks that are contained within a single discrete integrated component. The blocks use interconnect constructed from the wire layers within the integrated component. A block contains interface circuitry that transmits signals onto the interconnects. A block also contains interface circuitry that receives signals from the interconnects.

The mapping of a signal onto an interconnect involves tradeoffs related to system speed. The use of one physical wire per signal (single-ended-signaling) uses fewer wires. The use of two physical wires per signal (differential-signaling) permits higher signaling rates. The mapping of a signal onto an interconnect can also involve optimization related to system resources. Two signals can share the same interconnect (i.e., they are time-multiplexed) to minimize the number of interconnects. Typically, this is done so that the potential timing conflicts that result are acceptable with respect to system performance.

A signal requires time to travel from one point on an interconnect to another point. This time is called the "propagation time." The interval of time allocated for a bit in a digital signal is the "bit time." The bit time includes time to transmit the signal and time to receive the signal. The bit time may also include time for the signal to propagate between the transmitter and receiver.

Baseline System Topology Xa/Ya

Figure 18:
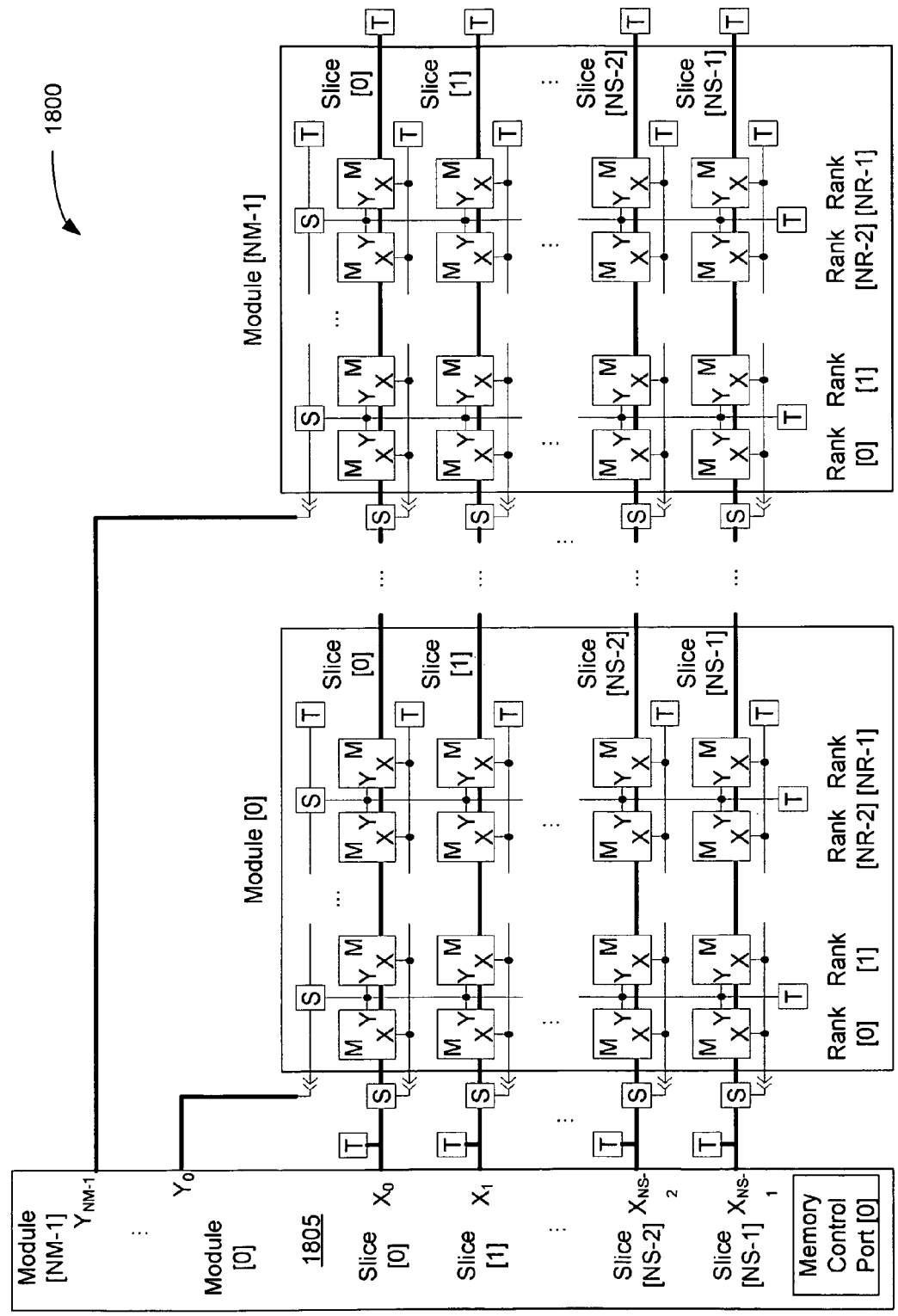
FIG. 18 shows a conventional baseline memory system topology 1800 that can benefit from application of the present invention.

FIG. 18 shows a conventional baseline memory system topology 1800 that can benefit from application of the present invention. It is similar to the topology of FIG. 1, but has been extended and generalized. The memory controller component 1805 is shown on the left side of FIG. 15. A single memory port (Port[0]) is shown. The controller could have additional memory ports. In general, the controller's interface can also attach to other external interconnects that are not directly related to the memory system(s).

The port is an interface that attaches to two sets of interconnect: the X interconnect set and the Y interconnect set. The X and Y interconnect sets carry different sets of signals and have different routing paths through the memory system. The X interconnect set usually carries data signals and the Y interconnect set usually carries address signals, but other variations are possible.

There are NS of the X interconnect sets, with each X interconnect set connecting all the memory components along one "slice." Typically, only one of the memory components along the slice will be active at a time, although variations to this are possible. The parameter NS can assume integer values greater than zero.

There are NM of the Y interconnect sets, with each Y interconnect set connecting all the memory components on one "module" (set of ranks). Each memory module can consist of NR ranks (rows) of memory components. Typically, all of the memory components along one rank of one module will be active at a time, although variations to this are possible. The parameters NM and NR can assume integer values greater than zero. In some systems, there may not be an intermediate module layer in the packaging hierarchy, and the memory system may consist of NR ranks of memory components attached to the same wiring board that holds the memory controller component.

Each module has a dedicated Y interconnect set, but typically most or all of the signals carried by a Y interconnect set are duplicates of the signals carried by other Y buses. There may be some signals used to perform module or rank selection that are not duplicated, but are dedicated to a particular module or rank.

Likewise each rank on a module connects to the module's Y interconnect set. Typically, most or all of the signals composing the Y interconnect set are connected to all memory components of each rank. There may be some signals used to perform rank selection that are not duplicated, and which connect to only the memory components of one rank.

It is assumed that all signals are operated at or near the maximum signaling rates permitted by the signaling technology utilized. This implies the use of sequential connection of components by the interconnect containing a signal (with a short stub interconnect branching from the main interconnect). This also implies careful impedance matching when signals are split (an interconnect divides into two interconnects) and when signals are terminated (the end of an interconnect is reached).

The Y interconnect set signals on a module may pass through splitting elements, labeled "S," in order to make duplicate copies of signals. (A number of conventional splitting elements are described below in connection with FIGS. 23A through 23D.) Alternatively, the signals may connect sequentially to all the memory components of one or more ranks (the figure shows sequential connection to two ranks). Another alternative is for the module to contain only one or two ranks, in which case no splitting element is needed on the module at all.

The Y interconnect set signals connect to a termination element, labeled "T," when they reach the end of a rank. (A number of conventional termination elements are described below in connection with FIGS. 24A through 24D.) The Y interconnect set signals are typically unidirectional, so termination elements are shown only at the memory end of the signals. If any Y interconnect set signals were bi-directional, or if any Y interconnect set signals drove information from memory to controller, then termination elements would be required on the controller end.

The X interconnect set signals are assumed to pass through a splitting element on the same wiring board that holds the controller. One of the duplicate signals enters the module, and the other continues on the wiring board to the next module. The X interconnect set signals connect sequentially to all the memory components of each slice and end at a termination element. Alternatively, if the system only contains a single module, no splitting elements would be needed for the X interconnect set signals.

The X interconnect set signals are typically bi-directional, so termination elements are also needed at the controller end of each signal. If any X interconnect set signals were unidirectional, then termination elements would be required only at the end that is opposite from the component that drives the signal.

Typically, all of the signals carried on the X interconnect set are connected to all memory components of each slice. There may be some signals used to perform selection that connect to only a subset of the memory components of a slice.

Topology Variation Yb

Figure 19:
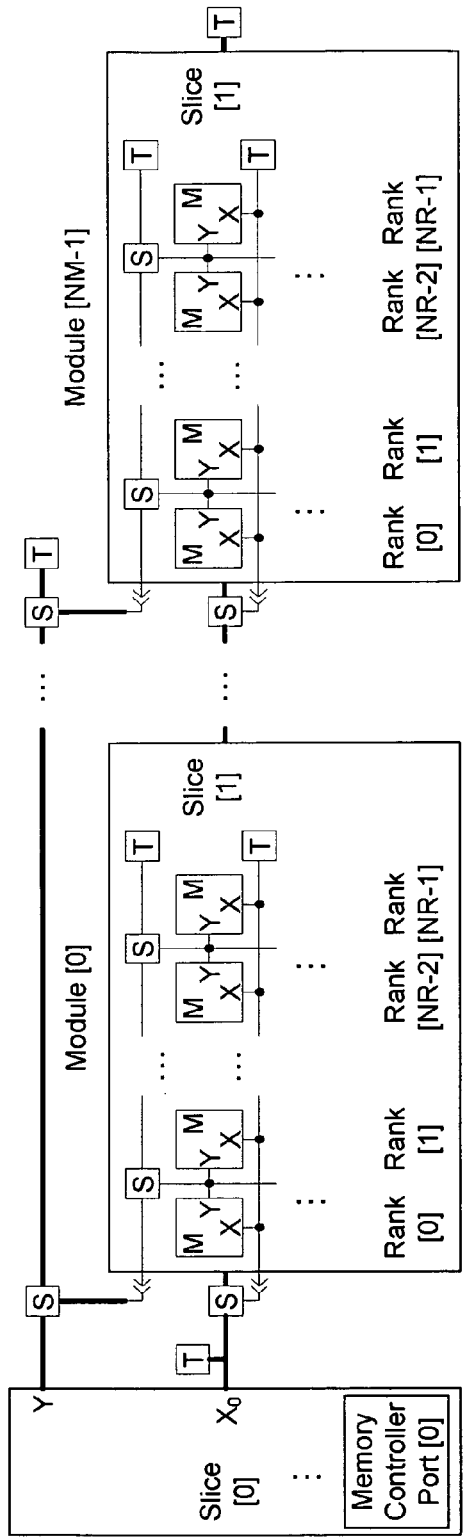
FIG. 19 shows another conventional baseline memory system topology 1900 that can benefit from application of the present invention.

FIG. 19 shows another conventional baseline memory system topology 1900 that can benefit from application of the present invention. System topology 1900 is a variation of a Y interconnect set topology in which the controller drives a single Y interconnect set to all the modules. A splitting element is used to tap off a duplicate of the Y interconnect set for each module. The benefit is that the controller will drive fewer Y interconnect sets, and the cost is that each Y interconnect set signal will pass through a larger number of splitting elements, possibly affecting signal integrity or propagation delay.

Topology Variation Yc

Figure 20:
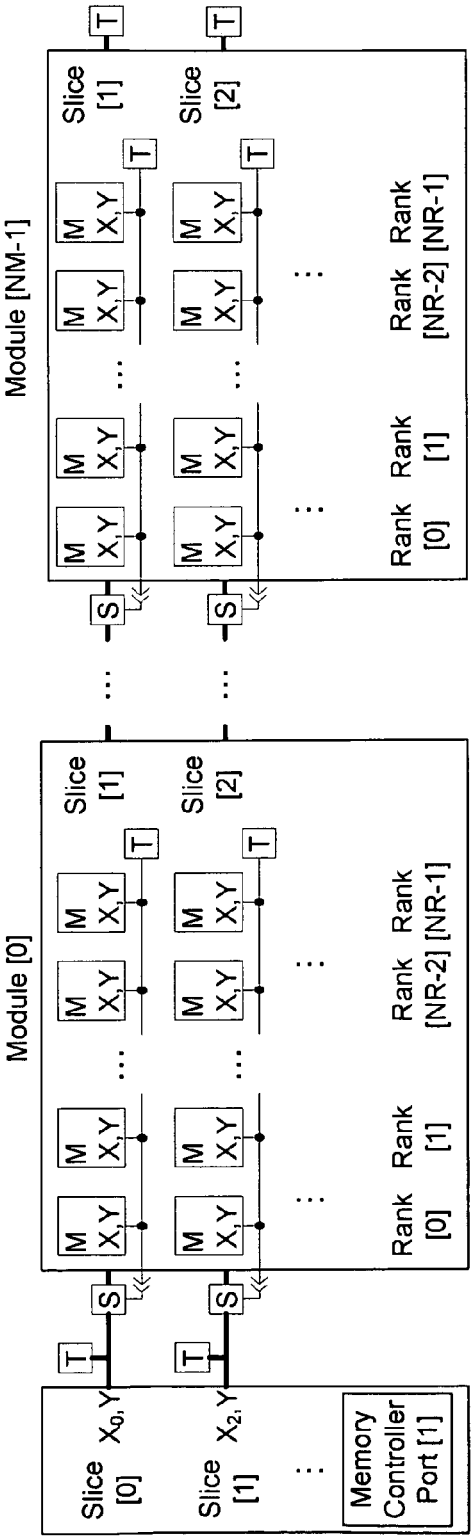
FIG. 20 shows a second variation of a conventional baseline memory system topology that can benefit from application of the present invention.

FIG. 20 shows a second variation of a conventional baseline memory system topology that can benefit from application of the present invention. In this topology, a controller 2000 drives the Y interconnect sets with the same topology as the X interconnect sets to the modules. In this variation, there are no Y interconnect sets flowing along each rank. There may be some signals in the X or Y interconnect set used to perform a rank and module selection which connect to only a subset of the memory components of a slice. Alternatively, module and rank selection may be performed by comparing X or Y interconnect set signals to an internal storage element (in each memory component) that contains the module or rank identification information.

Topology Variation Xb

Figure 21:
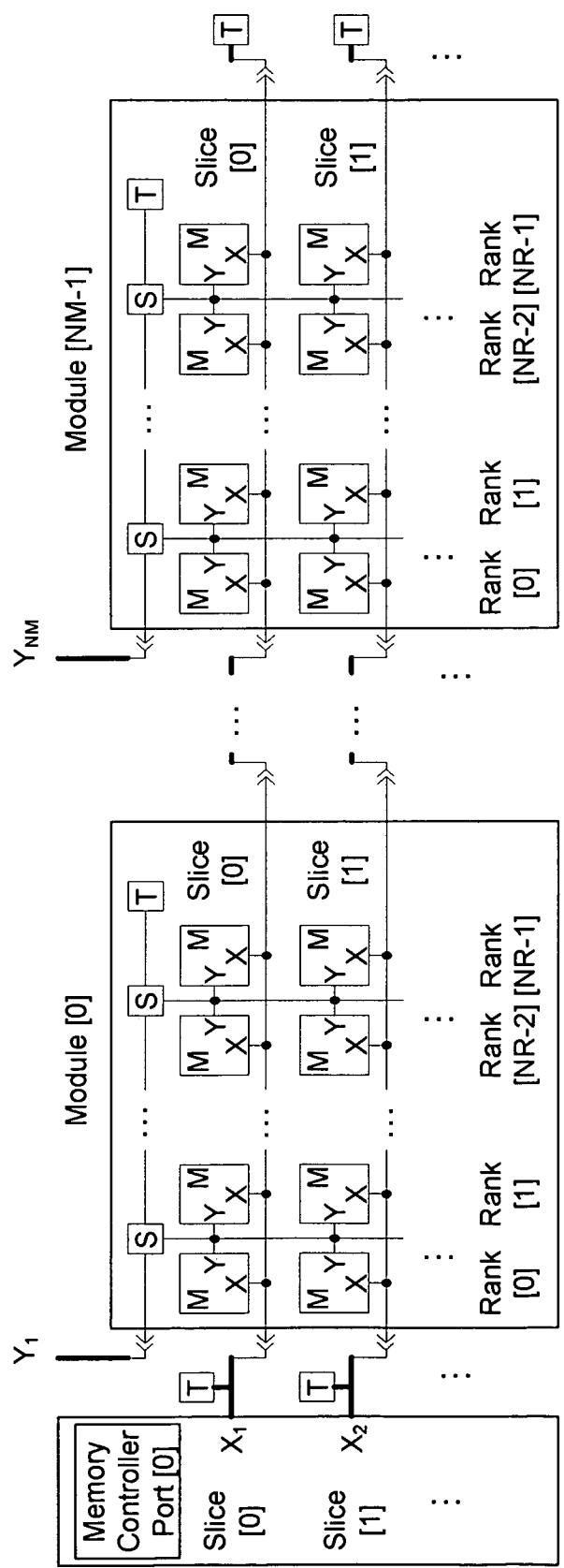
FIG. 21 shows a variation on a conventional X interconnect set topology.

FIG. 21 shows a variation on a conventional X interconnect set topology in which each interconnect passes through one set of pins on each module and exits through a different set of pins. As a result, no splitting element is needed on the main wiring board, and no termination elements are needed on the modules. The benefit is a reduction in the number of splitting and termination elements, the cost is the extra pins needed on each module and the longer propagation time of signals. As with the preceding example, the topology of FIG. 21 can benefit from application of the present invention.

Memory Component Organization

Figure 22:
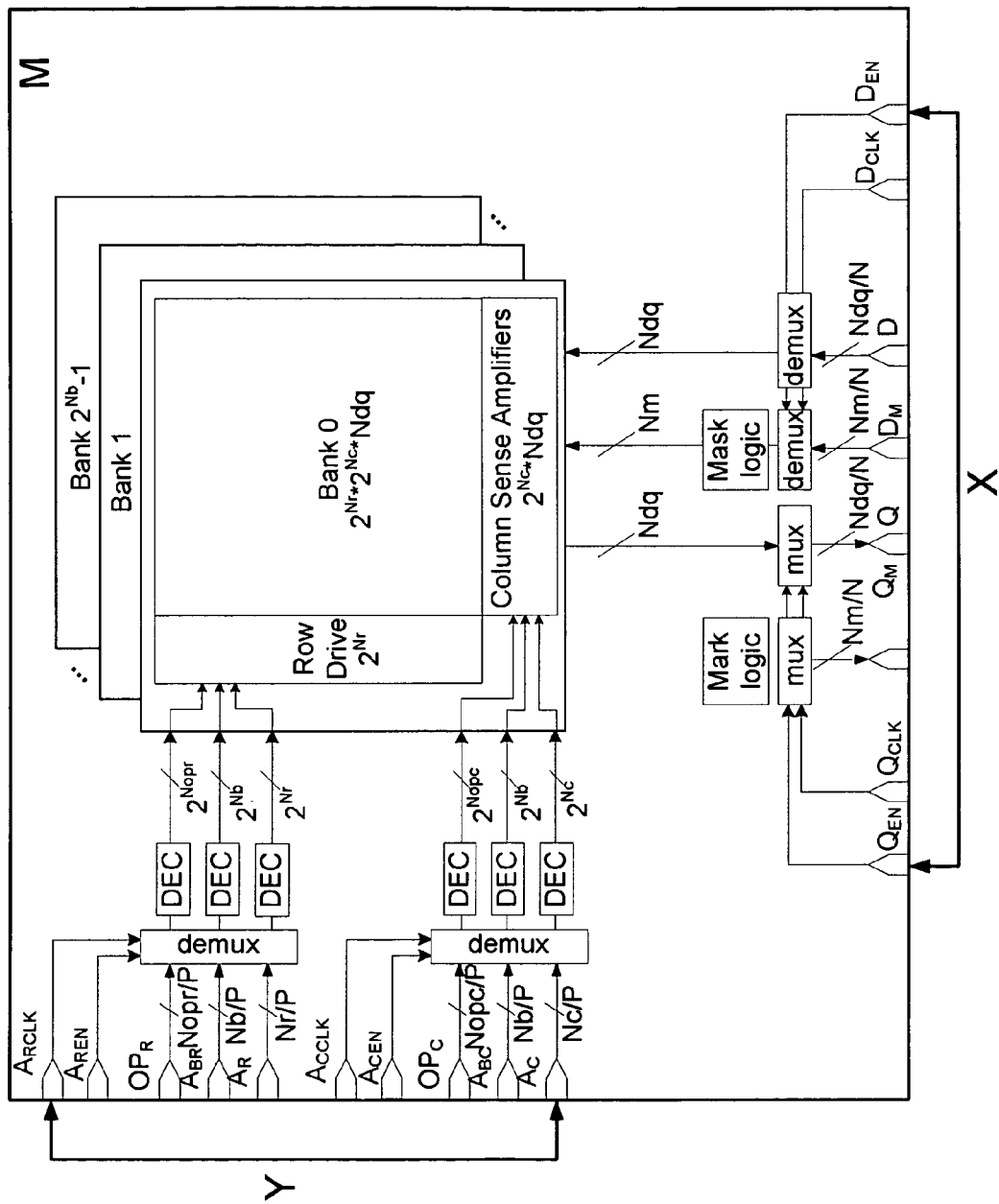
FIG. 22 shows a conventional baseline organization for the memory component "M" that is shown in the system topology diagrams.

FIG. 22 shows a conventional baseline organization for the memory component "M" that is shown in the system topology diagrams. Memory component M contains an interface to an X interconnect set and an interface to a Y interconnect set. X and Y interface logic contains circuits for receiving and transmitting the signals that are carried on the two interconnect sets. Memory component M also contains a memory core that consists of $2^{Nb}$ independent banks. The banks are capable of performing operations independent of one another, as long as the operations do not have resource conflicts, such as the simultaneous use of shared external interconnects.

The signals carried on the external Y interconnect set are divided into two groups: the row signals and the column signals. These signals contain information for the fields that form a command. Each group contains a timing signal (ARCLK and ACCLK), an enable signal (AREN and ACEN), operation code subgroups (OPR and OPC), bank address subgroups (ABR and ABR), and row or column address subgroups (AR and AC). These signals share like-named interconnect resources.

The number of signals in each subgroup is given as Nopr/P, Nopc/P, Nb/P, Nb/P, Nr/P, and Nc/P, respectively. The factor "P" is a multiplexing factor, indicating how many bits of a command field are received serially on each signal. The "demux" blocks convert the serial bits into parallel form. The parameters Nopr, Nopc, Nb, Nr, Nc, and P are the numbers of bits in the command field associated with each subgroup, and may contain integer values greater than zero. For example, there might be eight column address bits and two signals for the column address subgroup, meaning that four column address bits are received sequentially on each signal. The P factor for this example would be four. The baseline memory component uses the same P factor for all the subgroups of the Y bus, but different factors could also be used for the different subgroups in the same memory component.

It is also possible that some subgroups could be multiplexed onto the same interconnects. The operation code could be used to indicate which subgroup is being received. For example, the bank address subgroups could share one set of interconnects, and the row and column address subgroups could share a second set, and the operation code subgroups could share a third set.

The six subgroups are received by circuitry that uses the timing signals (ARCLK and ACCLK) as timing references that indicate when a bit is present on a signal. These timing signals could be periodic clocks, or could be a non-periodic strobes. There could be an event (rising or falling edge) corresponding to each bit, or each event could signify the presence of two or more sequential bits (with clock recovery circuitry creating two or more timing events from one). It is possible that the six sub-buses could share a single timing signal.

The enable signals indicate when the memory component needs to receive information on the associated subgroups. The enable signal might pass or block the timing signals entering the memory component, or the enable signal might cause the operation code subgroup to be interpreted as no-operation, or it might act in some other way to prevent information from being received.

The enable signals can be used to select a set of memory components and to deselect a second set, so that an operation will be performed by only the first set. This could be important for rank selection, for example. The enable signals can also be used to manage the power dissipation of a memory component by managing power state transitions. It is possible that the enable signals for the two groups could be shared. It is also possible that each enable signal shown could be two or more signals to facilitate the task of component selection and power management.

The de-multiplexed row operation code, row bank address, and row address are decoded and one of the $2^{Nb}$ independent banks is selected for a row operation such as activate or precharge. For an activate operation, one of the $2^{Nr}$ rows contained in the selected bank is placed into the column sense amplifier for the bank. For a precharge operation, the selected bank and its column sense amplifier are returned to a precharged state, ready for another activate operation.

The de-multiplexed column operation code, bank address, and column address are also decoded and one of the $2^{Nb}$ independent banks is selected for a column operation such as read or write. A column operation may only be performed upon a bank that has been activated (not precharged). For a read operation, one of the $2^{Nc}$ columns (Ndq bits) contained in the column sense amplifier of the selected bank is read and transmitted on the Q subgroup. For a write operation, Ndq bits received on the D subgroup is written into one of the $2^{Nc}$ columns contained in the column sense amplifier of the selected bank, using the Nm mask signals to control which bits are written and which are left unchanged.

The X bus is divided into two groups: the read signals and the write signals. Each group contains a timing signal ($Q_{CLK}$ and $D_{CLK}$), an enable signal ($Q_{EN}$ and $D_{EN}$), mark or mask subgroups ($Q_M$ and $D_M$), and data subgroups (Q and D). The number of signals in each subgroup are given as Ndq/N, Nm/N, Ndq/N, and Ndq/N, respectively. The factor "N" is a multiplexing factor, indicating how many bits are received or transmitted serially on each signal. The "mux" and "demux" blocks converts the bits from parallel-to-serial and serial-to-parallel form, respectively. The parameters Ndqr, Nm, and N may contain integer values greater than zero.

This baseline memory component assumes that the read and write data subgroups have the same number of signals and use the same multiplexing factors. This might not be true in other memory components. It is also possible that the read and write data subgroups could be multiplexed onto the same wires.

The mark subgroup provides a timing mark to indicate the presence of read data. The mask subgroup indicates whether a group of write data signals should be written or not written. This baseline memory component assumes that the mark and mask subgroups have the same number of signals and use the same multiplexing factors. This might not be true in other memory components. It is also possible that the mark and mask data subgroups could be multiplexed onto the same wires.

The subgroups are received by circuitry that uses the timing signals ($Q_{CLK}$ and $D_{CLK}$) as a timing reference for when a bit is present on a signal. These timing signals could be a periodic clock, or they could be a non-periodic strobe. There could be an event (rising or falling edge) corresponding to each bit, or each event could signify the presence of two or more sequential bits (with clock recovery circuitry creating two or more timing events from one). It is possible that the sub-buses could share a single timing signal. It is also possible that the X and Y signal groups could share a single timing signal.

The enable signals indicate when the memory component needs to receive information on the associated subgroups. The enable signal might pass or block the timing signals entering the memory component, or it might act in some other way to prevent information from being transmitted or received. This could be important for slice selection, or for managing power state transitions.

Splitting Elements

FIGS. 23A, 23B, 23C, and 23D show some conventional variations of splitting-elements for memory systems adapted in accordance with embodiments of the invention.

In FIG. 23A, element Sa is a unidirectional buffer consisting of either a restoring buffer 2300 or a clocked buffer 2305. In FIG. 23B, element Sb is a bi-directional buffer consisting of either a pass-through, non-restoring active switch 2310 with an enable control terminal EN, or a pair of restoring buffers 2315 with a pair of enable control terminals EN1 and EN2. (Element Sb can also be used for unidirectional interconnects.)

Element Sc of FIG. 23C is a unidirectional resistive device 2320, implemented from either active or passive components. Device 2320 permits an attenuated signal to be passed to one of the output legs, with the resistive value chosen to limit the impedance mismatching that occurs at the junction. An alternative method would allow the characteristic impedance of the interconnects to be varied so that (in combination with a series resistance on one output leg) there would be a smaller mismatch for unidirectional interconnects.

Element Sd of FIG. 23D is a bi-directional power-splitting device, which allows the impedance to be closely matched for an interconnect originating on any of the three legs. One embodiment 2325 includes three impedances $Z_0$, while a second embodiment 2330 includes three impedances $Z_0/3$. The impedances can be implemented using passive or active devices.

Termination Elements

Figure 24B:
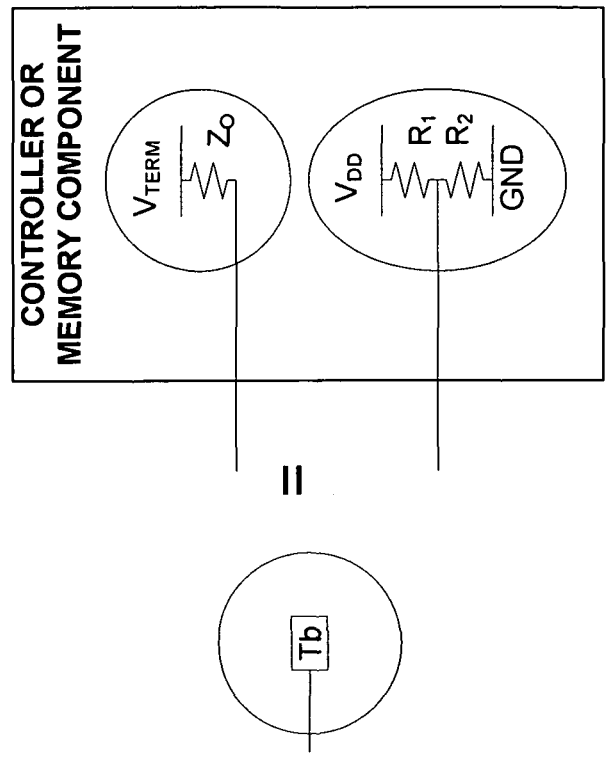
Figure 24A:
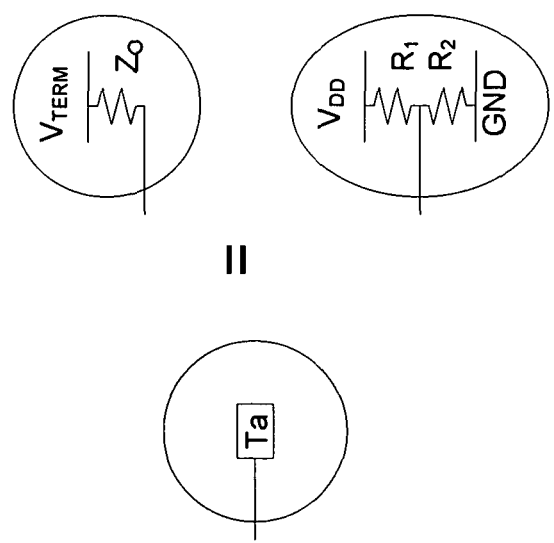

Referring first to FIG. 24A, termination element Ta is a passive, external termination element. Element Ta may be implemented as a single device $Z_0$ connected to a single termination voltage $V_{TERM}$, or as two (or more) devices (e.g., $R_1$ and $R_2$) connected to two (or more) termination voltages (e.g., $V_{DD}$ and GND). Termination element Ta resides on a memory module or on a main wiring board.

FIG. 24B depicts a passive, internal termination element Tb similar to element Ta of FIG. 24A, like-labeled elements being the same. Element Tb differs from element Ta, however, in the element Tb resides inside a memory component or inside a memory controller component.

FIG. 24C depicts an active, external termination element Tc. Element Tc resides on a memory module or on a main wiring board. In one embodiment 2400, a control voltage $V_{CONTROL}$ generated by an external circuit (not shown) establishes the voltage-current relationship for proper termination. Another embodiment 2405 employs a pair of control voltages $V_{CONTROL1}$ and $V_{CONTROL2}$. For either embodiment, the external circuit measures a value that indicates whether the voltage-current relationship is optimal. If it is not, the circuit makes an adjustment to so the voltage-current relationship becomes more optimal.

FIG. 24D depicts an active, internal termination element Td similar to element Tb of FIG. 24B, like-labeled elements being the same. Element Td differs from element Tb, however, in the element Td resides inside a memory component or inside a memory controller component.

CONCLUSION

While the present invention has been described in connection with specific embodiments, variations of these embodiments will be obvious to those of ordinary skill in the art. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A discrete integrated circuit memory device comprising:
   a plurality of banks, each bank of the plurality of banks including an array of memory cells;
   a command interface to receive commands from a controller device that is external to the discrete integrated circuit memory device at one or more pins of the discrete integrated circuit memory device, the commands including a first command that specifies a refresh operation, and a second command that specifies a data transfer operation, wherein in response to the first command a first row of memory cells in a first bank is refreshed, and while the first row of memory cells is being refreshed, the memory device accesses data from a second bank in response to the second command; and
   an interface to transfer the data, accessed from the second bank, to the controller device, wherein the command interface receives the first command that specifies the refresh operation and the second command that specifies the data transfer operation as a combined command.

2. A method of operating a discrete integrated circuit memory device, the memory device including a plurality of banks, each bank of the plurality of banks including an array of memory cells, the method comprising:
   receiving commands from a controller device that is external to the discrete integrated circuit memory device at one or more pins of the discrete integrated circuit memory device, the commands including a first command that specifies a refresh operation, and a second command that specifies a data transfer operation;
   response to the first command, refreshing a first row of memory cells in a first bank;
   while the first row of memory cells is being refreshed, accessing data from a second bank in response to the second command; and transferring the data, accessed from the second bank, the controller device, wherein the first command that specifies the refresh operation and the second command that specifies the data transfer operation are received as a combined command.

* * * * *